United States Patent
Funk et al.

(10) Patent No.: US 8,183,062 B2
(45) Date of Patent: May 22, 2012

(54) CREATING METAL GATE STRUCTURES USING LITHOGRAPHY-ETCH-LITHOGRAPHY-ETCH (LELE) PROCESSING SEQUENCES

(75) Inventors: Merritt Funk, Austin, TX (US); Radha Sundararajan, Dripping Springs, TX (US); Asao Yamashita, Fishkill, NY (US); Daniel Prager, Hopewell Junction, NY (US)

(73) Assignee: Tokyo Electron Limited (JP)

( * ) Notice: Subject to any disclaimer, the term of this patent is extended or adjusted under 35 U.S.C. 154(b) by 568 days.

(21) Appl. No.: 12/391,410

(22) Filed: Feb. 24, 2009

(65) Prior Publication Data

US 2010/0214545 A1 Aug. 26, 2010

(51) Int. Cl.
*H01L 21/66* (2006.01)
(52) U.S. Cl. ........ 438/16; 438/17; 438/18; 257/E21.525
(58) Field of Classification Search .............. 438/16, 438/17, 18; 257/E21.525
See application file for complete search history.

(56) References Cited

U.S. PATENT DOCUMENTS

| | | | |
|---|---|---|---|
| 6,785,638 B2 | 8/2004 | Niu et al. | |
| 6,891,626 B2 | 5/2005 | Niu et al. | |
| 6,943,900 B2 | 9/2005 | Niu et al. | |
| 7,005,330 B2 | 2/2006 | Yeo et al. | |
| 7,171,284 B2 | 1/2007 | Vuong et al. | |
| 7,330,279 B2 | 2/2008 | Vuong et al. | |
| 2004/0267397 A1 | 12/2004 | Doddi et al. | |
| 2005/0209816 A1 | 9/2005 | Vuong et al. | |
| 2006/0037701 A1 | 2/2006 | Koshiishi et al. | |

OTHER PUBLICATIONS

Hyung Lee et al., "Advanced Profile Control and the Impact of Sidewall Angle at Gate Etch for Critical Nodes", Metrology, Inspection, and Process Control for Microlithography XXII, edited by John A. Allgair, Christopher J. Raymond, Proc. of SPIE vol. 6922, pp. 69220T1-13, (2008), USA.

K. Bernstein, et al.;"High-Performance CMOS Variability in the 65-nm Regime and Beyond"; IBM Journal of R&D; Aug. 2006.

Jean-Pierre Corriou, "Process Control: Theory and Applications"; (2004) Springer-Verlag, New York, NY, 10013, USA; ISBN(1-85233-776-1).

Skogestad, S. & Postlethwaite I., "Multivariable Feedback Control: Analysis and Design"; (2nd edition), (2005) Wiley, Chichester, UK. (ISBN 0-470-01168-8).

*Primary Examiner* — Bradley K Smith
*Assistant Examiner* — Amar Movva

(57) ABSTRACT

The invention can provide apparatus and methods of creating metal gate structures on wafers in real-time using Lithography-Etch-Lithography-Etch (LELE) processing sequence. Real-time data and/or historical data associated with LELE processing sequences can be fed forward and/or fed back as fixed variables or constrained variables in internal-Integrated-Metrology modules (i-IMM) to improve the accuracy of the metal gate structures.

19 Claims, 15 Drawing Sheets

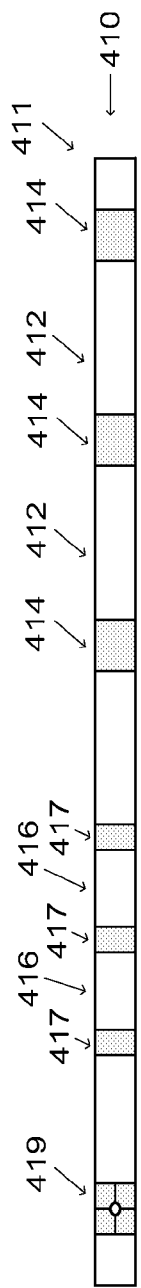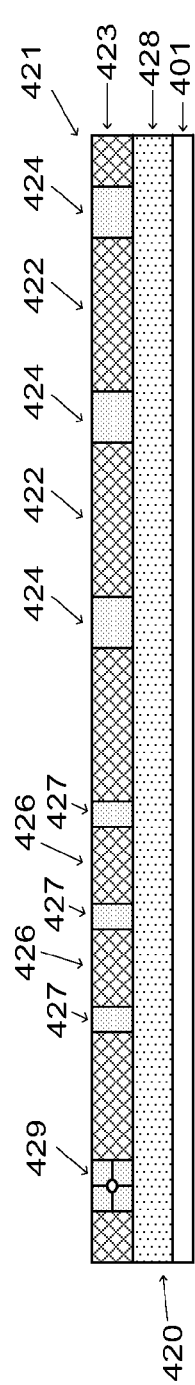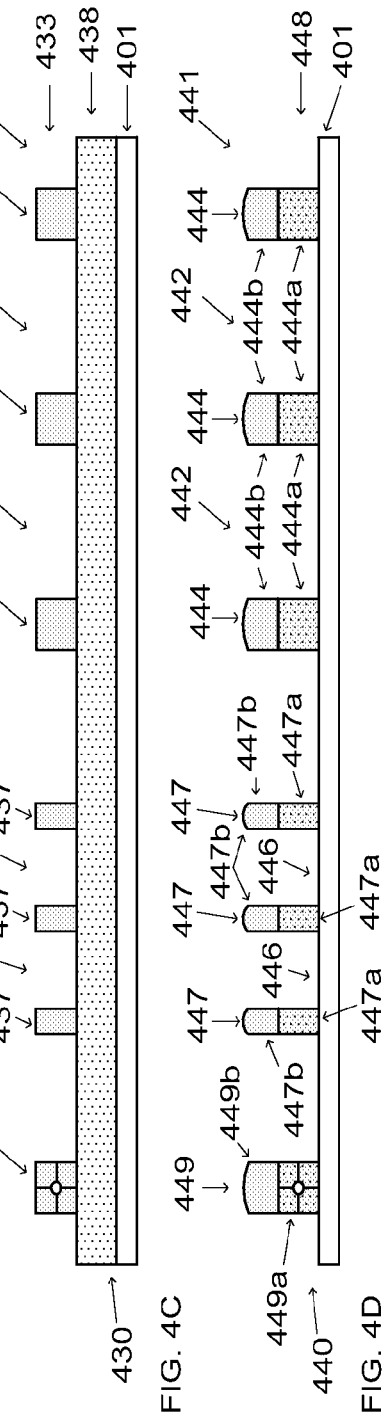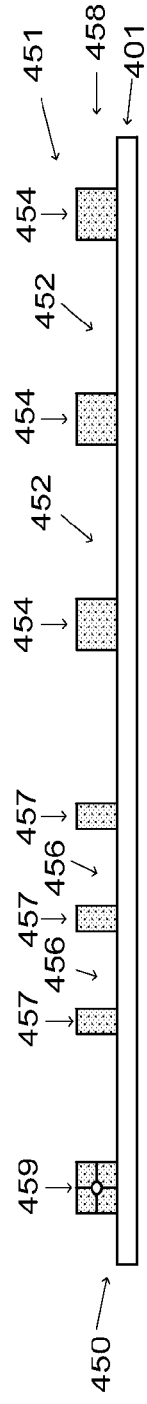

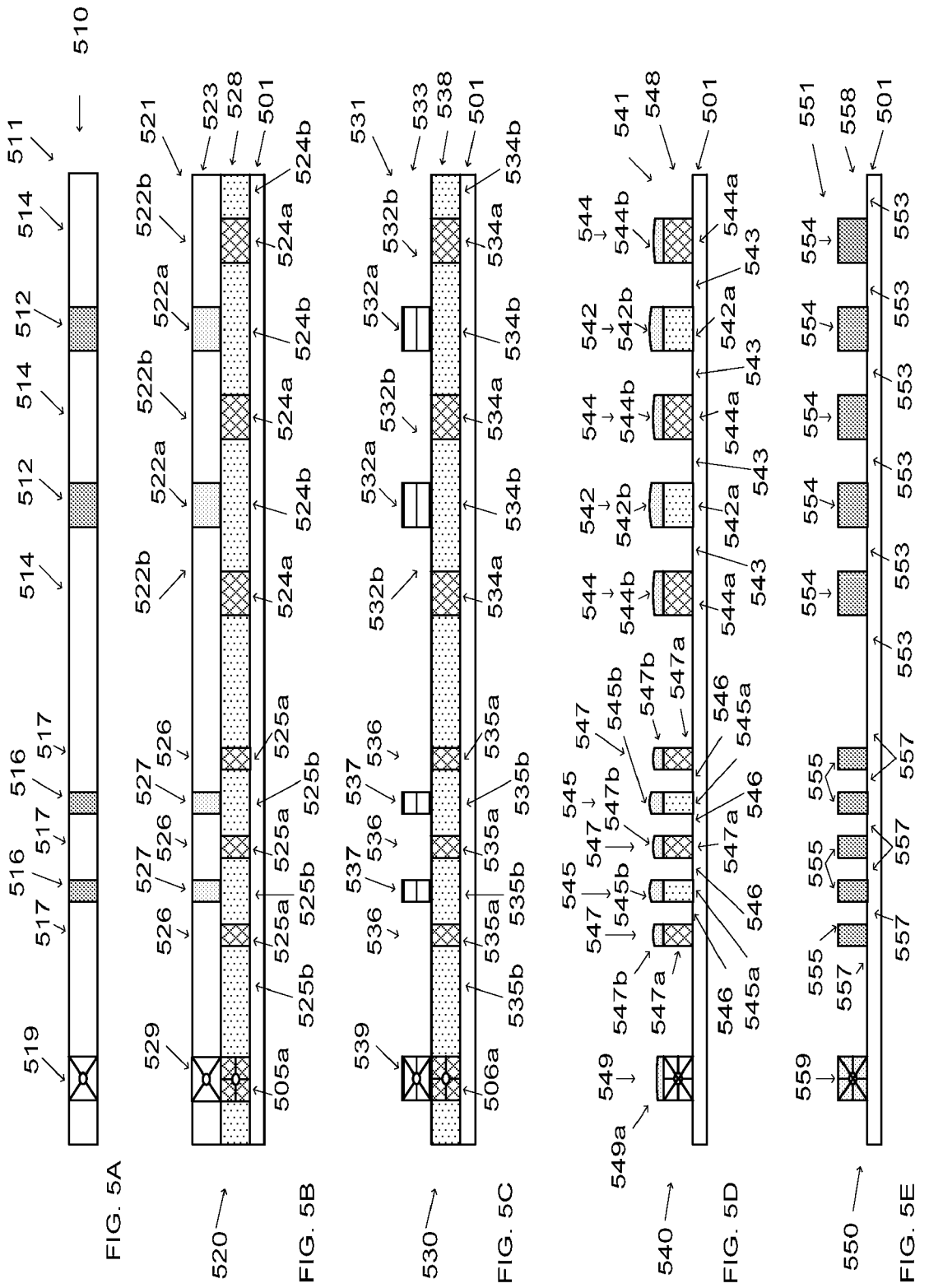

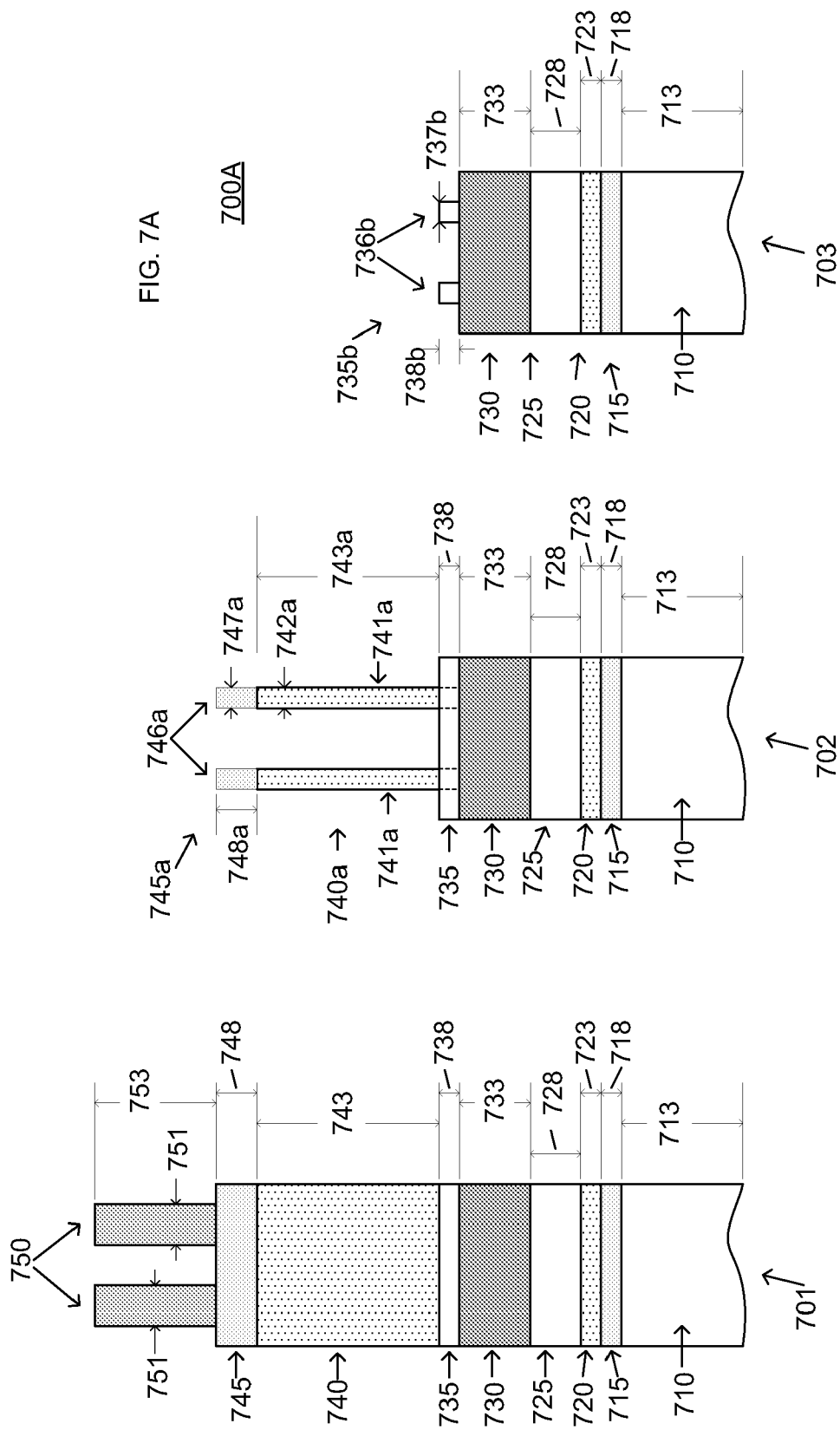

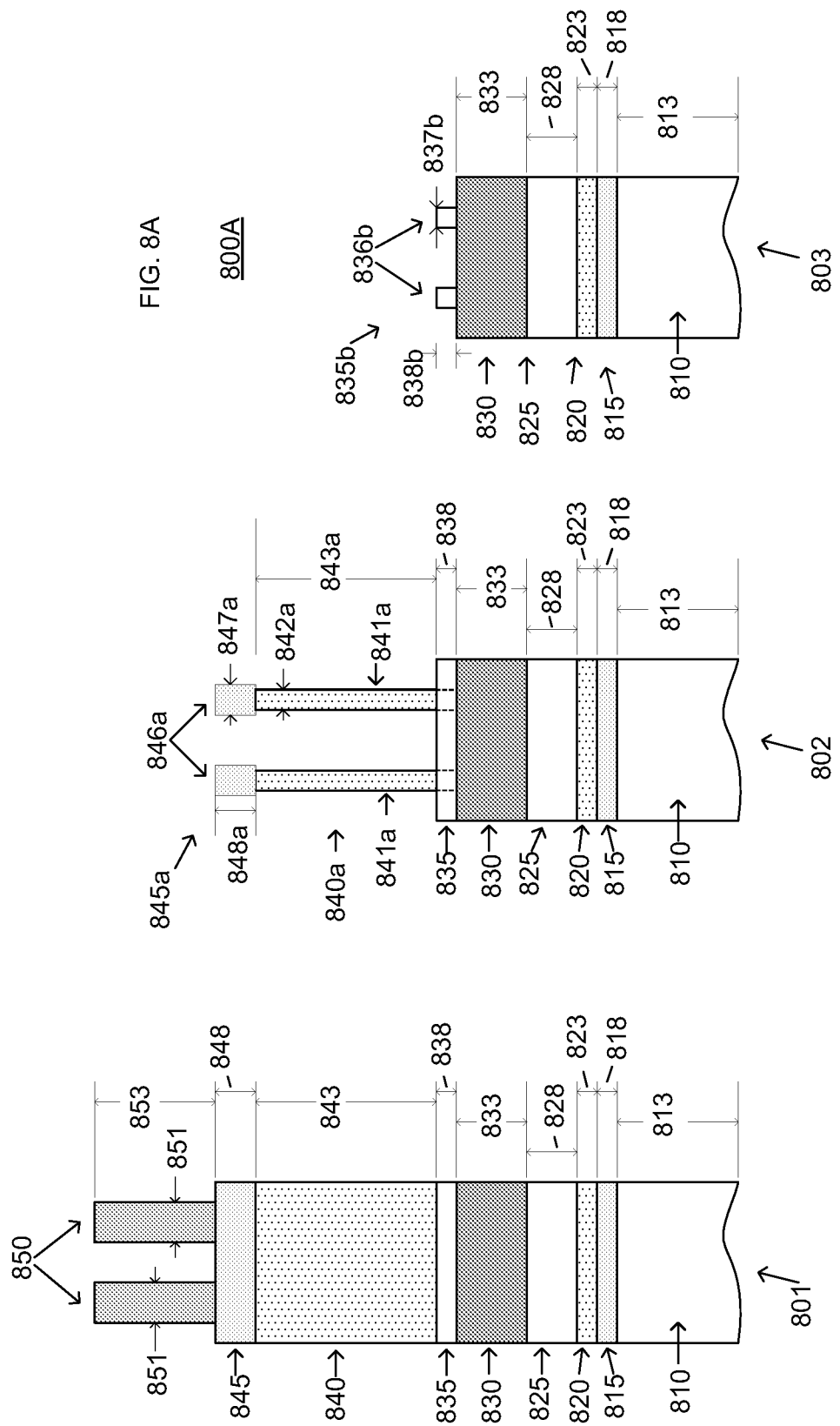

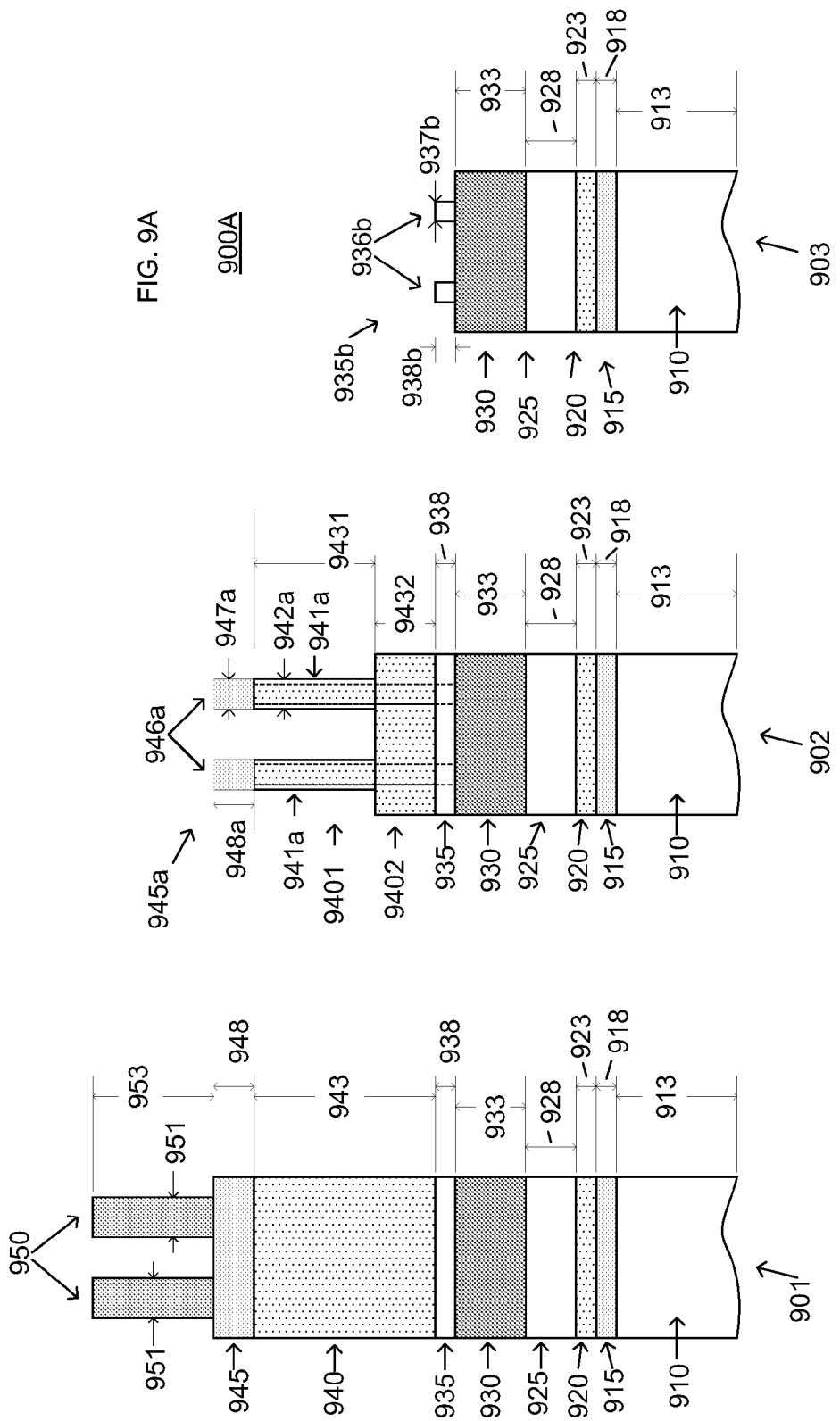

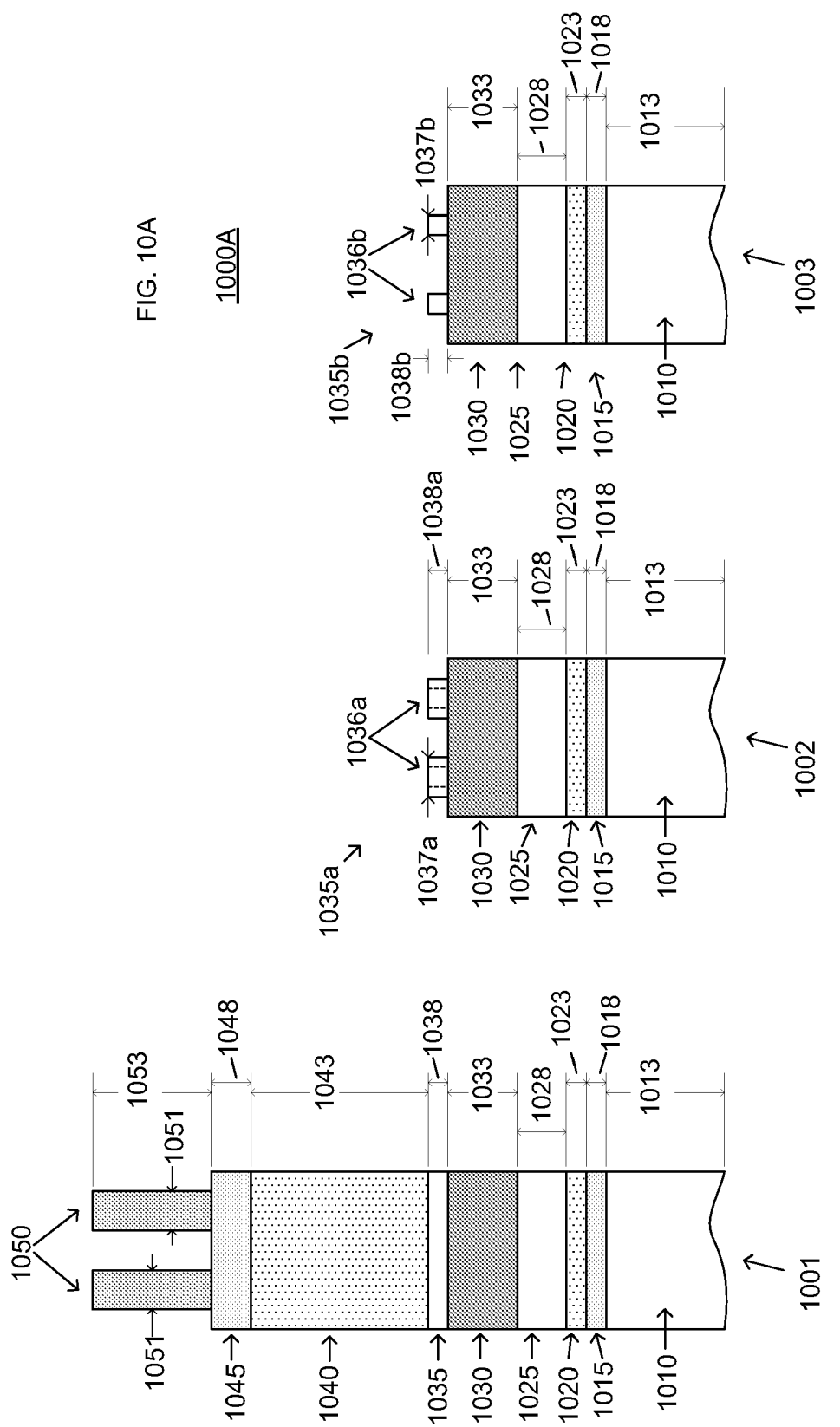

CREATING METAL GATE STRUCTURES USING LITHOGRAPHY-ETCH-LITHOGRAPHY-ETCH (LELE) PROCESSING SEQUENCES

BACKGROUND OF THE INVENTION

1. Field of the Invention

The present invention relates to creating metal gate structures, and more particularly to improving the metal gate structures using integrated metrology tools and procedures.

2. Description of the Related Art

With the exhaustion of other resolution-enhancement techniques (RETs) to further reduce the k1 factor and the unreadiness of Extreme Ultra-Violet (EUV) tools and hyper-NA (numerical aperture) fluid, double-patterning (D-P) techniques have gained momentum and looks to become the solution for next technology node. By splitting dense pitches into two separate loose pitches, DP can further extend the current toolset by up to two technology nodes. However, double patterning also brings with many difficult challenges. Overlay and critical dimension (CD) errors are closely coupled, and an overlay error can affect the CD measurement.

Scatterometry has been adopted to measure CD and profile. In D-P sequences, there are CDs and profiles for the first and second sets of procedures. For scatterometry modeling, this can increase the number of parameters in a model and the number of models used. In addition, there can be an overlay error between the two patterns, and the overlay error can create scatterometry errors. As the size of the structures decreases, the measurement problems increase. Many multiple patterning techniques are currently being use during semiconductor wafer processing to increase the number of features and/or structures within devices on a wafer. Multiple patterning techniques can include double exposure techniques, double patterning techniques, spacer techniques, mask techniques, and brute force techniques. In 2006, the International Technology Roadmap for Semiconductors roadmap was expanded to include double patterning a potential solution for 32 nm lithography. Multiple patterning techniques are viewed as some device manufacturers as bridge solutions that can be used until EUV techniques become more fully developed.

SUMMARY OF THE INVENTION

The invention can provide apparatus and methods of creating metal gate structures on wafers in real-time using Lithography-Etch-Lithography-Etch (LELE) processing sequence. Real-time data and/or historical data associated with LELE processing sequences can be fed forward and/or fed back as fixed variables or constrained variables in internal-Integrated-Metrology modules (i-IMM) to improve the accuracy of the metal gate structures.

Other aspects of the invention will be made apparent from the description that follows and from the drawings appended hereto.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIGS. 4A-4E illustrate simplified views of a first set of procedures in the Lithography-Etch-Lithography-Etch (LELE) processing sequence in accordance with embodiments of the invention;

FIGS. 5A-5E illustrate simplified views of a second set of procedures in the Lithography-Etch-Lithography-Etch (LELE) processing sequence in accordance with embodiments of the invention;

FIGS. 7A and 7B illustrate exemplary views of a second processing sequence for creating metal gate structures in accordance with embodiments of the invention;

FIGS. 8A and 8B illustrate exemplary views of a third processing sequence for creating metal gate structures in accordance with embodiments of the invention;

FIGS. 9A and 9B illustrate exemplary views of a fourth processing sequence for creating metal gate structures in accordance with embodiments of the invention; and FIGS. 10A and 10B illustrate exemplary views of a fifth processing sequence for creating metal gate structures in accordance with embodiments of the invention.

DETAILED DESCRIPTION

The present invention provides apparatus and methods for creating metal gate structures using Lithography-Etch-Lithography-Etch (LELE) processing sequences, and the LELE processing sequences can include one or more lithography-related procedures, one or more scanner-related procedures, one or more etch-related procedures, one or more deposition-related procedures, one or more measurement-related procedures, or one or more inspection-related procedures, or any combination thereof.

A plurality of multi-layer metal gate structures can be created at a plurality of locations on one or more wafers using one or more LELE processing sequences. Wafers can have wafer data associated with them, and the wafer data can include real-time and historical data. In addition, the wafer can have other data associated with them, and the other data can include pattern data, alignment data, overlay data, confidence data and/or risk data for one or more of the patterns and/or sites, site ranking data, transferring sequence data, or process-related data, or evaluation/verification-related data, or any combination thereof. The data associated with wafers can include data that can be used to establish how to align layers.

In some examples, the wafers can have other layers deposited on them by a previous process or an external system, and the LELE sequences can include one or more lithography-related procedures, one or more scanner-related procedures, one or more etch-related procedures, one or more evaluation procedures, and one or more transfer sequences. For example, transfer sequences can be established based on the number of wafers that require lithography-related processing, the number of wafers that require scanner-related processing, the number of wafers that require etch-related processing, the number of available processing elements, the number of wafers that require evaluation, the number of available evaluation elements, and the loading data for one or more of the subsystems.

As metal gate structure sizes decrease below the 65 nm node, accurate processing and/or measurement data becomes more important and more difficult to obtain. Lithography-Etch-Lithography-Etch (LELE) processing sequences can be used to more accurately process and/or measure these ultra-small devices and structures. The data from LELE processing sequences can be compared with the warning and/or control limits, when a run-rule is violated, an alarm can be generated indicating a processing problem, and real-time correction procedures can be performed.

Figure 1:
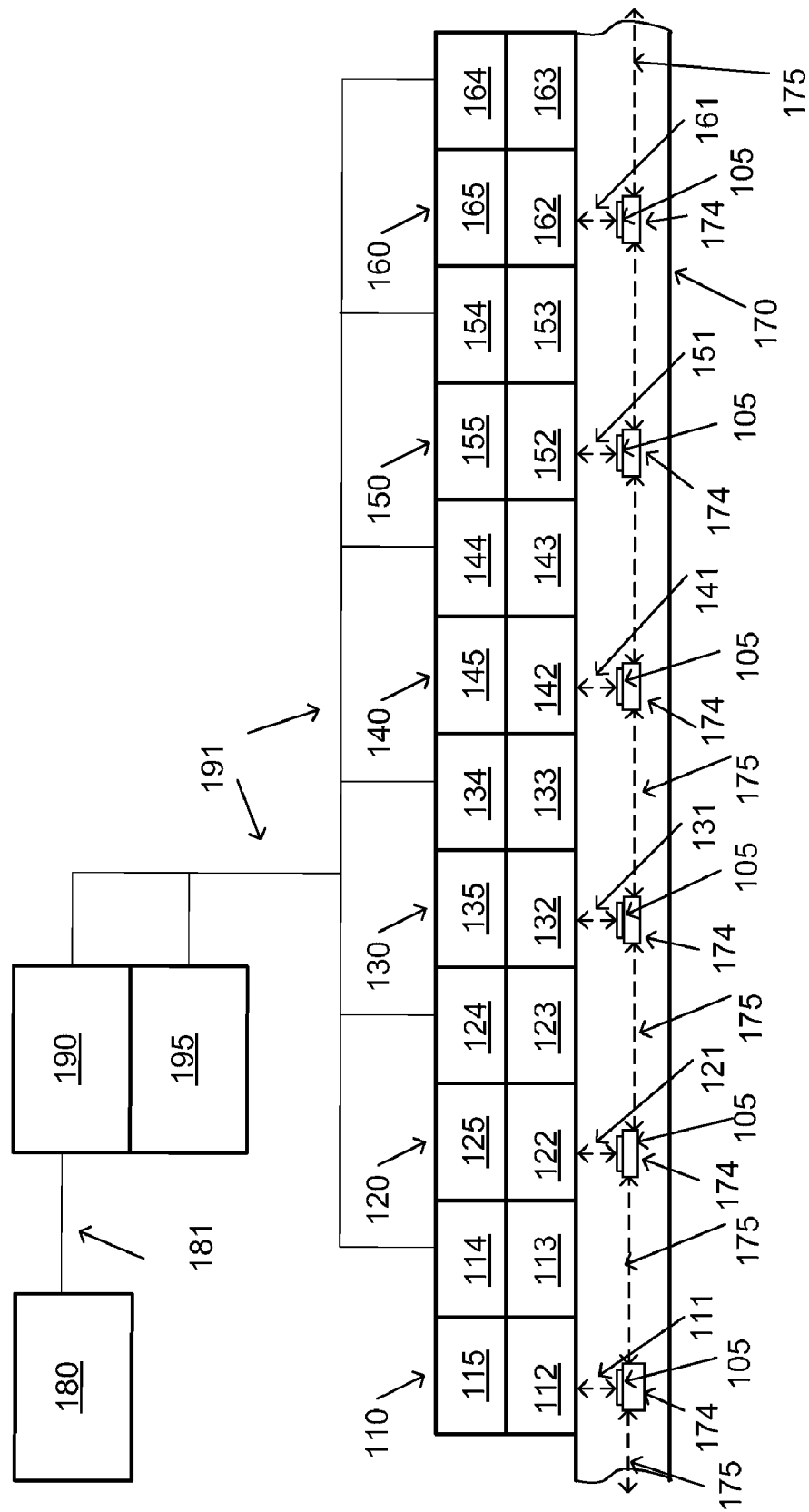
FIG. 1 shows an exemplary block diagram of a processing system in accordance with embodiments of the invention.

FIG. 1 shows an exemplary block diagram of a processing system in accordance with embodiments of the invention. In the illustrated embodiment, processing system 100 comprises an Integrated-Lithography Subsystem 110, a scanner subsystem 120, an Integrated-Etch Subsystem 130, a deposition subsystem 140, an evaluation subsystem 150, a cleaning subsystem 160, a transfer subsystem 170, a manufacturing execution system (MES) 180, a system controller 190, and a memory/database 195. Single subsystems (110, 120, 130, 140, 150, 160, and 170) are shown in the illustrated embodiment, but this is not required for the invention. In some embodiments, multiple subsystems (110, 120, 130, 140, 150, 160, and 170) can be used in a processing system 100. In addition, one or more of the subsystems (110, 120, 130, 140, 150, 160, and 170) can comprise one or more processing elements that can be used to perform one or more procedures in LELE processing sequences.

The system controller 190 can be coupled to the Integrated-Lithography Subsystem 110, the scanner subsystem 120, the Integrated-Etch Subsystem 130, the deposition subsystem 140, the evaluation subsystem 150, the cleaning subsystem 160, and the transfer subsystem 170 using a data transfer subsystem 191. The system controller 190 can be coupled to the MES 180 using the data transfer subsystem 181. Alternatively, other configurations may be used. In some examples, the Integrated-Etch Subsystem 130, and a portion of the transfer subsystem 170 can be part of a Tactras™ System available from Tokyo Electron Limited. In other examples, the Integrated-Lithography Subsystem 110, and a portion of the transfer subsystem 170 can be part of the i-LITHIUS™ System available from Tokyo Electron Limited.

The Integrated-Lithography Subsystem 110 can comprise one or more transfer/storage elements 112, one or more processing elements 113, one or more controllers 114, and one or more internal-Integrated-Metrology Modules (i-IMMs) 115. One or more of the transfer/storage elements 112 can be coupled to one or more of the processing elements 113 and/or to one or more of the i-IMMs 115 and can be coupled 111 to the transfer subsystem 170. The transfer subsystem 170 can be coupled 111 to the Integrated-Lithography Subsystem 110, and one or more wafers 105 can be transferred 111 between the transfer subsystem 170 and the Integrated-Lithography Subsystem 110 in real time. For example, the transfer subsystem 170 can be coupled to one or more of the transfer/storage elements 112, to one or more of the processing elements 113, and/or to one or more of the i-IMMs 115. One or more of the controllers 114 can be coupled to one or more of the transfer/storage elements 112, to the one or more of the processing elements 113, and/or to one or more of the i-IMMs 115.

In some embodiments, the Integrated-Lithography Subsystem 110 can perform coating procedures, thermal procedures, developing procedures, measurement procedures, inspection procedures, alignment procedures, and/or storage procedures on one or more wafers during LELE processing sequences. One or more of the processing elements 113 can be used to deposit one or more masking layers that can include masking material, and/or anti-reflective coating (ARC) material, and can be used to thermally process (bake) one or more of the masking layers. In addition, the Integrated-Lithography Subsystem 110 can be used to develop, measure, and/or inspect one or more of the masking layers and/or wafers. For example, one or more of the i-IMMs 115 can provide real-time metrology data for one or more of the metal gate structures immediately after a lithography-related procedure is performed.

The scanner subsystem 120 can comprise one or more transfer/storage elements 122, one or more processing elements 123, one or more controllers 124, and one or more evaluation elements 125. One or more of the transfer/storage elements 122 can be coupled to one or more of the processing elements 123 and/or to one or more of the evaluation elements 125 and can be coupled 121 to the transfer subsystem 170. The transfer subsystem 170 can be coupled 121 to the scanner subsystem 120, and one or more wafers 105 can be transferred 121 between the transfer subsystem 170 and the scanner subsystem 120 in real time. For example, the transfer subsystem 170 can be coupled to one or more of the transfer/storage elements 122, to one or more of the processing elements 123, and/or to one or more of the evaluation elements 125. One or more of the controllers 124 can be coupled to one or more of the transfer/storage elements 122, to the one or more of the processing elements 123, and/or to one or more of the evaluation elements 125.

During LELE processing sequences, the scanner subsystem 120 can be used to perform wet and/or dry exposure procedures, and in other cases, the scanner subsystem 120 can be used to perform extreme ultraviolet (EUV) exposure procedures.

The Integrated-Etch Subsystem 130 can comprise one or more transfer/storage elements 132, one or more processing elements 133, one or more controllers 134, and one or more internal-Integrated-Metrology Modules (i-IMMs) 135. One or more of the transfer/storage elements 132 can be coupled to one or more of the processing elements 133 and/or to one or more of the i-IMMs 135 and can be coupled 131 to the transfer subsystem 170. The transfer subsystem 170 can be coupled 131 to the Integrated-Etch Subsystem 130, and one or more wafers 105 can be transferred 131 between the transfer subsystem 170 and the Integrated-Etch Subsystem 130 in real time. For example, the transfer subsystem 170 can be coupled to one or more of the transfer/storage elements 132, to one or more of the processing elements 133, and/or to one or more of the i-IMMs 135. One or more of the controllers 134 can be coupled to one or more of the transfer/storage elements 132, to the one or more of the processing elements 133, and/or to one or more of the i-IMMs 135. For example, one or more of the i-IMMs 135 can provide real-time metrology data for one or more of the metal gate structures immediately after an etching procedure is performed. In addition, one or more of the processing elements 133 can be used to perform plasma or non-plasma etching, ashing, and cleaning procedures, or plasma or non-plasma trimming procedures. Evaluation procedures and/or inspection procedures can be used to measure and/or inspect one or more surfaces and/or layers of the wafers.

The deposition subsystem 140 can comprise one or more transfer/storage elements 142, one or more processing elements 143, one or more controllers 144, and one or more evaluation elements 145. One or more of the transfer/storage elements 142 can be coupled to one or more of the processing elements 143 and/or to one or more of the evaluation elements 145 and can be coupled 141 to the transfer subsystem 170. The transfer subsystem 170 can be coupled 141 to the deposition subsystem 140, and one or more wafers 105 can be transferred 141 between the transfer subsystem 170 and the deposition subsystem 140 in real time. For example, the transfer subsystem 170 can be coupled to one or more of the transfer/storage elements 142, to one or more of the processing elements 143, and/or to one or more of the evaluation elements 145. One or more of the controllers 144 can be coupled to one or more of the transfer/storage elements 142, to the one or more of the processing elements 143, and/or to one or more of the evaluation elements 145. For example, one or more of the processing elements 143 can be used to perform physical vapor deposition (PVD) procedures, chemical vapor deposition (CVD) procedures, ionized physical vapor deposition (iPVD) procedures, atomic layer deposition (ALD) procedures, plasma enhanced atomic layer deposition (PEALD) procedures, and/or plasma enhanced chemical vapor deposition (PECVD) procedures. Evaluation elements 143 can be used to measure and/or inspect one or more surfaces of the wafers. The transfer/storage elements 142 can transfer, measure, inspect, align, and/or store one or more wafers. In some embodiments, the deposition subsystem 140 can comprise one or more evaluation elements 145 that can perform inspection procedures, measurement procedures, alignment procedures, and/or storage procedures on one or more wafers.

The evaluation subsystem 150 can comprise one or more transfer/storage elements 152, one or more processing elements 153, one or more controllers 154, and one or more evaluation and/or inspection elements 155. One or more of the transfer/storage elements 152 can be coupled to one or more of the processing elements 153 and/or to one or more of the evaluation and/or inspection elements 155 and can be coupled 151 to the transfer subsystem 170. The transfer subsystem 170 can be coupled 151 to the evaluation subsystem 150, and one or more wafers 105 can be transferred 151 between the transfer subsystem 170 and the evaluation subsystem 150 in real time. For example, the transfer subsystem 170 can be coupled to one or more of the transfer/storage elements 152, to one or more of the processing elements 153, and/or to one or more of the evaluation and/or inspection elements 155. One or more of the controllers 154 can be coupled to one or more of the transfer/storage elements 152, to the one or more of the processing elements 153, and/or to one or more of the evaluation and/or inspection elements 155.

The evaluation subsystem 150 can comprise one or more evaluation and/or inspection elements 155 that can evaluate, measure, inspect, align, verify, and/or store one or more wafers. For example, one or more of the evaluation and/or inspection elements 155 can be used to perform real-time optical metrology procedures that can be used to measure metal-gate-related structures, profiles, patterns, and/or thicknesses on the wafer.

The cleaning subsystem 160 can comprise one or more transfer/storage elements 162, one or more processing elements 163, one or more controllers 164, and one or more evaluation elements 165. One or more of the transfer/storage elements 162 can be coupled to one or more of the processing elements 163 and/or to one or more of the evaluation elements 165 and can be coupled 161 to the transfer subsystem 170. The transfer subsystem 170 can be coupled 161 to the cleaning subsystem 160, and one or more wafers 105 can be transferred 161 between the transfer subsystem 170 and the cleaning subsystem 160 in real time. For example, the transfer subsystem 170 can be coupled to one or more of the transfer/ storage elements 162, to one or more of the processing elements 163, and/or to one or more of the evaluation elements 165. One or more of the controllers 164 can be coupled to one or more of the transfer/storage elements 162, to the one or more of the processing elements 163, and/or to one or more of the evaluation elements 165.

The transfer subsystem 170 can comprise transfer elements 174 and transfer means 175 that can be used to receive wafers, transfer wafers, align wafers, store wafers, and/or delay wafers. For example, the transfer elements 174 can support two or more wafers. The transfer means 175 can be coupled to the transfer elements 174, and can be used to move the transfer elements 174. Alternatively, other transferring means may be used. The transfer subsystem 170 can load, transfer, store, and/or unload wafers based on a LELE processing sequence, a transfer sequence, operational states, the wafer and/or processing states, the processing time, the current time, the wafer data, the number of sites on the wafer, the type of sites on the wafers, the number of required sites, the number of completed sites, the number of remaining sites, or confidence data, or any combination thereof. For example, the sites on wafer can include target sites, overlay sites, alignment sites, measurement sites, verification sites, inspection sites, or damage-assessment sites, or any combination thereof.

In some examples, transfer subsystem 170 can use loading data to determine where to transfer a wafer. In other examples, a transfer system can use LELE processing sequence data to determine where to transfer a wafer. In still other examples, a transfer system can use confidence data to determine where to transfer a wafer. Alternatively, other procedures may be used. For example, when the first number of wafers is less than or equal to the first number of available processing elements, the first number of wafers can be transferred to the first number of available processing elements in the one or more of the subsystems using the transfer subsystem 170. When the first number of wafers is greater than the first number of available processing elements, some of the wafers can be stored using one or more of the transfer/storage elements (112, 122, 132, 142, 152, and 162) and/or the transfer subsystem 170.

In some embodiments, one or more of the subsystems (110, 120, 130, 140, 150, 160, and 170) can perform cleaning procedures, etching procedures, layer removal procedures, ashing procedures, inspection procedures, residue removal procedures, measurement procedures, alignment procedures, and/or storage procedures on one or more wafers using reworking procedures. For example, material can be removed from one or more patterned wafers using one or more plasma etching procedures, and/or non-plasma etching procedures. In addition, one or more processing subsystems can be used to remove damaged material from one or more of the wafers. Each subsystem can process one or more wafers in parallel, and one or more procedures and/or procedures can be performed.

In addition, the one or more processing elements (113, 123, 133, 143, 153, and 163) can include one or more lithography-related components, one or more scanner-related components, one or more inspection-related components, one or more measurement-related components, one or more evaluation-related components, one or more etch-related components, one or more deposition-related components, one or more thermal processing components, one or more coating-related components, one or more alignment-related components, one or more polishing-related components, one or more storage-related components, one or more transfer components, one or more cleaning-related components, one or more rework-related components, one or more oxidation-related components, one or more nitridation-related components, or one or more external processing elements, or any combination thereof.

Operational state data can be established for the subsystems (110, 120, 130, 140, 150, 160, and 170) and can be used and/or updated during LELE processing sequences. In addition, operational state data can be established for the transfer/storage elements (112, 122, 132, 142, 152, and 162), processing elements (113, 123, 133, 143, 153, and 163), and Imms/evaluation elements (115, 125, 135, 145, 155, and 165), and can be updated during LELE processing sequences. For example, the operational state data for the processing elements can include availability data, matching data for the processing elements, expected processing times for some process steps and/or sites, confidence data and/or risk data for the processing elements, or confidence data and/or risk data for one or more procedures in the LELE processing sequence. Updated operational states can be obtained by querying in real-time one or more processing elements, and/or one or more subsystems. Updated loading data can be obtained by querying in real-time one or more transfer elements, and/or one or more transfer subsystems.

One or more of the controllers (114, 124, 134, 144, 154, and 164) can be coupled to the system controller 190 and/or to each other using a data transfer subsystem 191. Alternatively, other coupling configurations may be used. The controllers can be coupled in series and/or in parallel and can have one or more input ports and/or one or more output ports. For example, the controllers may include 8-bit, 16-bit, 32-bit, and/or 64-bit processors having one or more core processing elements.

In addition, subsystems (110, 120, 130, 140, 150, 160, and 170) can be coupled to each other and to other devices using intranet, internet, wired, and/or wireless connections. The controllers (114, 124, 134, 144, and 190) can be coupled to external devices as required.

One or more of the controllers (114, 124, 134, 144, 154, 164, and 190) can be used when performing real-time procedures during LELE processing sequences. A controller can receive real-time data to update subsystem, processing element, process, recipe, profile, image, pattern, and/or model data. One or more of the controllers (114, 124, 134, 144, 154, 164, and 190) can be used to exchange one or more Semiconductor Equipment Communications Standard (SECS) messages with the MES 180, read and/or remove information, feed forward, and/or feedback the information, and/or send information as a SECS message. In addition, controllers (114, 124, 134, 144, 154, 164, and 190) can include memory configured for storing information and instructions to be executed by the controllers, and may be used for storing temporary variables or other intermediate information during the execution of instructions by the various computers/processors in the processing system 100. One or more of the controllers (114, 124, 134, 144, 154, 164, and 190), or other system components can comprise the means for reading data and/or instructions from a computer readable medium and can comprise the means for writing data and/or instructions to a computer readable medium.

The processing system 100 can perform a portion of or all of the processing steps of the invention in response to the computers/processors in the processing system executing one or more sequences of one or more instructions contained in a memory and/or received in a message. Such instructions may be received from another computer, a computer readable medium, or a network connection.

In some embodiments, an integrated system can be configured using system components from Tokyo Electron Limited (TEL). In other embodiments, external subsystems and/or tools may be included. One or more of the subsystems (110, 120, 130, 140, 150, 160, and 170) may include one or more etch elements, deposition elements, integrated-metrology (IM) elements, Atomic Layer Deposition (ALD) elements, measurement elements, ionizations elements, polishing elements, coating elements, developing elements, cleaning elements, exposure elements, and thermal treatment elements. In addition, measurement elements can be provided that can include a CD-Scanning Electron Microscopy (CDSEM) system, a Transmission Electron Microscopy (TEM) system, a focused ion beam (FIB) system, an Optical Digital Profilometry (ODP) system, an Atomic Force Microscope (AFM) system, or another optical metrology system. The subsystems and/or processing elements can have different interface requirements, and the controllers can be configured to satisfy these different interface requirements.

One or more of the subsystems (110, 120, 130, 140, 150, 160, and 170) can comprise control applications, Graphical User Interface (GUI) components, and/or database components. In addition, one or more of the subsystems (110, 120, 130, 140, 150, 160, and 170) and/or controllers (114, 124, 134, 144, 154, 164, and 190) can include Advanced Process Control (APC) applications, Fault Detection and Classification (FDC), and/or Run-to-Run (R2R) applications. In some embodiments, APC applications, FDC applications, and/or R2R applications can be performed.

Output data and/or messages from previously performed procedures can be used in subsequent procedures to optimize the process accuracy and precision. Data can be passed to procedures in real-time as real-time variable parameters, overriding current model default values and decreasing the library search time and space. Real-time data can be used with a library-based system, or regression-based system, or any combination thereof to optimize procedures in LELE processing sequences.

In some embodiments, the evaluation subsystem 150 can include an integrated Optical Digital Profilometry (iODP) elements (not shown), and iODP elements/systems are available from Timbre Technologies Inc. (a TEL company). Alternatively, other metrology systems may be used. For example, iODP techniques can be used to obtain real-time data that can include critical dimension (CD) data, gate structure data, and thickness data, and the wavelength ranges for the iODP data can range from less than approximately 200 nm to greater than approximately 900 nm. Exemplary iODP elements can include ODP Profiler Library elements, Profiler Application Server (PAS) elements, and ODP Profiler Software elements. The ODP Profiler Library elements can comprise application specific database elements of optical spectra and its corresponding semiconductor profiles, CDs, and film thicknesses. The PAS elements can comprise at least one computer that connects with optical hardware and computer network. The PAS elements can be configured to provide the data communication, ODP library operation, measurement process, results generation, results analysis, and results output. The ODP Profiler Software elements can include the software installed on PAS elements to manage measurement recipe, ODP Profiler library elements, ODP Profiler data, ODP Profiler search/match results, ODP Profiler calculation/analysis results, data communication, and PAS interface to various metrology elements and computer network.

The evaluation subsystem 150 can use polarizing reflectometry, spectroscopic ellipsometry, reflectometry, or other optical measurement techniques to measure accurate device profiles, accurate CDs, and multiple layer film thickness of a wafer. The integrated metrology process (iODP) can be executed as an integrated process in an integrated group of subsystems. In addition, the integrated process eliminates the need to break the wafer for performing the analyses or waiting for long periods for data from external systems. iODP techniques can be used with the existing thin film metrology systems for inline profile and CD measurement, and can be integrated with TEL processing systems and/or lithography systems to provide real-time process monitoring and control. An exemplary optical metrology system is described in U.S. Pat. No. 6,943,900, entitled GENERATION OF A LIBRARY OF PERIODIC GRATING DIFFRACTION SIGNAL, by Niu, et al., issued on Sep. 13, 2005, and is incorporated in its entirety herein by reference.

Simulated diffraction signals can be generated by applying Maxwell's equations and using a numerical analysis technique to solve Maxwell's equations. For example, various numerical analysis techniques, including variations of rigorous coupled wave analysis (RCWA), can be used with multi-layer structures. For a more detail description of RCWA, see U.S. Pat. No. 6,891,626, titled CACHING OF INTRA-LAYER CALCULATIONS FOR RAPID RIGOROUS COUPLED-WAVE ANALYSES, issued on May 10, 2005, which is incorporated herein by reference in its entirety.

An alternative procedure for generating a library of simulated-diffraction signals can include using a machine learning system (MLS). Prior to generating the library of simulated-diffraction signals, the MLS is trained using known input and output data. For example, the MLS may be trained with a subset of the library data. In one exemplary embodiment, simulated diffraction signals can be generated using a MLS employing a machine learning algorithm, such as back-propagation, radial basis function, support vector, kernel regression, and the like. For a more detailed description of machine learning systems and algorithms, see "U.S. patent application Ser. No. 10/608,300, titled OPTICAL METROLOGY OF STRUCTURES FORMED ON SEMICONDUCTOR WAFERS USING MACHINE LEARNING SYSTEMS, by Doddi, et al., filed on Jun. 27, 2003, and published as US Patent Application No. 2004/0267397A1, which is incorporated herein by reference in its entirety.

For detailed description of metrology model optimization, refer to U.S. Pat. No. 7,330,279, titled "MODEL AND PARAMETER SELECTION FOR OPTICAL METROLOGY", by Vuong, et al., filed on Jun. 27, 2002 and issued on Feb. 12, 2008; U.S. Pat. No. 7,171,284, entitled "OPTICAL METROLOGY MODEL OPTIMIZATION BASED ON GOALS", by Vuong, et al., issued on Jan. 30, 2007; and U.S. patent application Ser. No. 11/061,303, titled "OPTICAL METROLOGY OPTIMIZATION FOR REPETITIVE STRUCTURES", by Vuong, et al., filed on Feb. 18, 2005, and published as US Patent Application No. 2005/0209816A1; all of which are incorporated herein by reference in their entireties.

When a regression-based process is used, a measured diffraction signal measured off the periodic structure associated with a metal gate structure can be compared to simulated diffraction signals. The simulated diffraction signals can be iteratively generated based on sets of profile parameters associated with metal gate structures, to get a convergence value for the set of profile parameters that generates the closest match simulated diffraction signal compared to the measured diffraction signal. For a more detailed description of a regression-based process, see U.S. Pat. No. 6,785,638, titled "METHOD AND SYSTEM OF DYNAMIC LEARNING THROUGH A REGRESSION-BASED LIBRARY GENERATION PROCESS", by Niu, et al., issued on Aug. 31, 2004, which is incorporated herein by reference in its entirety.

When a library-based process is used, an library data for metal gate structures can be generated and/or enhanced using procedures, recipes, profiles, and/or models during LELE processing sequences. For example, an evaluation library can comprise simulated and/or measured optical signals and corresponding set of profile parameters for metal gate structures. A detailed description of generating optical metrology data such as a library of simulated diffraction signals and corresponding set of profile parameters is described in U.S. Pat. No. 6,943,900, entitled "GENERATION OF A LIBRARY OF PERIODIC GRATING DIFFRACTION SIGNAL", by Niu, et al., issued on Sep. 13, 2005, and is incorporated in its entirety herein by reference. The regression-based and/or the library-based process can include metal gate procedures.

One or more of the controllers (114, 124, 134, 144, 154, 164, and 190) can perform procedures that can be context dependent and can operate as control strategies, control plans, control models, and/or recipe managers to provide real-time processing. The context/identification information can include site ID, wafer ID, slot ID, lot ID, recipe, state, and/or metal gate structure ID. Control and/or analysis strategies/plans can cover multiple process steps within a wafer processing sequence, and can be used to analyze the real-time and/or collected data, and establish error conditions. An analysis procedure can be executed when a context is matched. During the execution of an analysis procedure, one or more analysis plans can be executed. A plan can create an error when a data failure occurs, an execution problem occurs, or a control problem occurs. A data collection plan and/or analysis plan can reject the data at one or more of the sites for a wafer or reject the data because a procedure fails. For example, dynamic context matching allows for custom configuration at each device and/or product.

Intervention and/or judgment rules can be defined in a strategy, plan, model, subsystem, element, or procedure and can be assigned to execute whenever a matching context is encountered. The intervention and/or judgment rules can be established for various procedures and can be maintained in the database.

In one embodiment, a procedure failure may not terminate a procedure. For example, a procedure can indicate a failure when a limit is exceeded. Successful procedures can create warning messages when limits are being approached. Pre-specified failure actions for procedures errors can be stored in a database, and can be retrieved from the database when an error occurs.

One or more of the subsystems (110, 120, 130, 140, 150, 160, and 170) can be used to determine wafer temperature, wafer thickness, wafer curvature, layer thickness, wafer uniformity, pattern thickness, pattern errors, or overlay errors, any combination thereof. In addition, one or more of the subsystems (110, 120, 130, 140, 150, 160, and 170) can be used to determine wafer damage, to measure particles, and/or to determine if the wafer has been processed correctly or if a rework procedure is required. One or more of the subsystems (110, 120, 130, 140, 150, 160, and 170) can use the damage-assessment data to update, and/or optimize processing recipe data, process profile data, and/or modeling data. For example, the integrated-etch subsystem 130 can use wafer damage data, particle data, or wafer curvature data to update, and/or optimize an etching chemistry and/or etching time.

One or more of the formatted messages can be exchanged between subsystems using the data transfer subsystems (181, 191). The controllers can process messages and extract new data. When new data is available, a controller can either use the new data to update a procedure currently being used for the wafer and/or lot. When the controller uses the new data to update procedure data for the wafer lot currently being processed, the controller can determine if a procedure can be updated before the current wafer is processed. The current wafer can be processed using the updated procedure when the procedure can be updated before the current wafer is processed. The current wafer can be processed using a non-updated procedure when the data cannot be updated before the current wafer is processed.

Procedures can be used to create, modify, and/or evaluate isolated and/or dense (nested) metal-gate structures at different times and/or sites. For example, pattern layer and/or wafer thickness data can be different near isolated and/or dense (nested) metal-gate structures, and wafer thickness data can be different near open areas and/or trench array areas. A processing subsystem can use new data for isolated and/or dense (nested) metal-gate structures to update and/or optimize a process recipe and/or process time. Some procedures can use end-point detection (EPD) data and process time data to improve the accuracy. When EPD data is used to stop a procedure, the EPD time data and the process rate data can be used to predict metal gate structures and/or wafer thicknesses.

Data from the Integrated-Lithography Subsystem 110, the Integrated-Etch Subsystem 130, the evaluation subsystem 150 and/or the MES 180 can include measured and/or simulated signals associated with metal gate structures, and the signals can be stored using processing, wafer, lot, recipe, site, or wafer location data. Measurement data can include variables associated with patterned structure profile, metrology device type and associated variables, and ranges used for the variables floated in the modeling and values of variables that were fixed in the modeling. The library data may include fixed and/or variable profile parameters (such as CD, sidewall angle, refractive index (n) data and extinction coefficient (k) data), and/or metrology device parameters (such as wavelengths, angle of incidence, and/or azimuth angle).

In addition, data from the Integrated-Lithography Subsystem 110, the Integrated-Etch Subsystem 130, and/or the evaluation subsystem 150 can include measured, calculated, and/or simulated signals associated with aligned targets and/or layers, un-aligned targets and/or layers, periodic and/or non-periodic measurement structures, and the signals can be stored using processing, wafer, lot, recipe, site, or wafer location data. Inspection data can include variables associated with patterned structures, targets, inspection device type and associated variables, and ranges used for the variables floated in the modeling and values of variables that were fixed in the modeling. The library data may include fixed and/or variable profile parameters.

In some examples, the MES 180 may be configured to monitor some metal gate procedures, and factory level intervention and/or judgment rules can be used to determine which metal gate procedures are monitored and which data can be used. In addition, factory level intervention and/or judgment rules can be used to determine how to manage the data when a metal gate procedure is changed, paused, and/or stopped. In addition, the MES 180 can provide configuration information and update information. Data can be exchanged using SEMI Equipment Communications Standard/Generic Equipment Model (SECS/GEM) communications protocols.

The confidence data can include an assessment of each process that was performed on the wafer. When processing data from a procedure is close to expected values, the confidence value for that procedure can be high, and when processing data from a procedure is not close to the expected values, the confidence value for that procedure can be low. For example, confidence values can range from zero to nine, where zero indicates a failure condition and nine indicates a correct performance.

The processing system 100 can be used to perform and/or verify one or more metal gate procedures. In some embodiments, one or more wafers can be received by one or more transfer subsystems 170, and the transfer subsystems 170 can transfer one or more of the wafers to one or more of the subsystems (110, 120, 130, 140, and 150) in the processing system 100. One or more of the controllers (114, 124, 134, 144, 154, 164, and 190) can be configured for determining wafer data for each wafer, for determining one or more metal gate procedures using historical data and/or the real-time data, for establishing one or more metal gate procedures, for establishing a first number of wafers to be processed using the metal gate procedure, for determining operational state data for the one or more subsystems (110, 120, 130, 140, 150, 160, and 170), for determining loading data for the one or more transfer elements 174 in the one or more transfer subsystems 170.

In other embodiments, one or more chamber-matching procedures can be performed during a LELE processing sequence. When one or more first chamber-matching procedures are performed, chamber-matching data can be obtained from one or more of the processing elements (113, 123, 133, 143, 153, and 163) and/or from one or more of the Imms/evaluation elements (115, 125, 135, 145, 155, and 165). Chamber matching data can be used to determine metal gate structure errors, confidence values, and risk factors during the LELE processing sequence. For example, when a metal gate structure is created on a first wafer, real-time evaluation, measurement, and/or inspection data can be obtained for the first wafer and the associated chambers, and when the metal gate structure is created on a second wafer, real-time evaluation, measurement, and/or inspection data can be obtained for the second wafer and associated chambers, and one or more chamber-matching values can be determined using the obtained data. In addition, chamber-matching procedures can be performed using one or more "golden wafers" that can be stored and used periodically to verify the performance of one or more of the chambers. Furthermore, one or more reference chips associated with a measurement, evaluation, and/or inspection chamber may be used.

For example, real-time chamber-matching data can include pattern data, alignment data, overlay data, material data, critical dimension (CD) data, sidewall angle (SWA) data, structure data, or thickness data, or any combination thereof. In addition, data in an evaluation library can be updated using the first real-time chamber-matching data when library creation rules are not violated.

In various examples, verified data for a metal gate related procedure can be obtained by performing the metal gate procedure in a "golden" processing chamber, can be historical metal gate data that is stored in a library, can be obtained by performing a verified metal gate procedure, can be obtained from the MES 180, can be simulation data, and can be predicted data. Multi-layer-multi-input multi-output (MLMIMO) models can be established and/or used to predict data for one or more metal gate structures. Some MLMIMO models can be established and/or used to predict thickness and/or uniformity data for one or more etched layers using measurement data for one or more previously etched layers. For a more detailed description of MLMIMO modeling techniques, see "U.S. patent application Ser. No. 12/186,619, titled "Using Multi-Layer/Multi-Input/Multi-Output (MLMIMO) Models For Metal-Gate Structures", filed on Aug. 6, 2008, and U.S. patent application Ser. No. 12/186, 668, titled "Creating Multi-Layer/Multi-Input/Multi-Output (MLMIMO) Models for Metal-Gate Structures", filed on Aug. 6, 2008, both of which are incorporated herein by reference in their entirety.

During some LELE processing sequences, a first wafer can be transferred to a first processing chamber and can be processed using a first sequence, and a second wafer can be transferred to a second processing chamber and can be processed using the first sequence or a modified version of the first sequence. The modified version can include changes established using chamber matching data, recipe update data, feedback data, feed forward data, or any combination thereof. In some examples, a first set of etched layers can be created on first and second wafers, and measurement data can be obtained for the first and second wafers. In addition, first correction data can be determined using the difference between reference data and the measured data from the first and/or second wafers. The first correction data can be used to update the first LELE processing sequence when the correction data is less than or equal to a first correction limit. Next, the set of etched layers can be created on the first and second wafers using a second LELE processing sequence, or an updated/modified second LELE processing sequence, and measurement data can be obtained for the first and second wafers. Second correction data can be determined for the second LELE processing sequence using the difference between reference data and the second measured data from the first and/or second wafers, and the second correction data can be used to update the second LELE processing sequence when the second correction data is less than or equal to a second correction limit. In addition, the second correction data can be used to update the first LELE processing sequence when the second correction data is less than or equal to another correction limit.

When some library data is created for metal gate structures, one or more of the subsystems (110, 120, 130, 140, 150, 160, and 170) can be used to create one or more patterned layers on one or more wafers, and the one or more patterned layers can include one or more of metal gate structures and/or one or more evaluation structures. When one or more of the patterned layers are being evaluated, the evaluation data can include image data, signal data, profile shape data, or process data, or any combination thereof. One or more of the controllers (114, 124, 134, 144, 154, 164, and 190) can be used to compare the evaluation data to the data already in one or more libraries. When a matching condition is found, one or more of the metal gate structures can be identified using the library data associated with a matching condition. When a matching condition is not found, one or more of the metal gate structures can be identified as un-verified metal gate structures and the data associated with them can be stored as un-verified data.

Wafer 105 can be, for example, a semiconductor substrate, a work piece, or a liquid crystal display (LCD).

When a metal-gate procedure is performed, one or more of the controllers (114, 124, 134, 144, 154, 164, and 190) can be used to determine if the metal-gate procedure is a verified procedure. In some examples, verification decisions for a metal-gate procedure can be made using the data from a first site, and the first site can be selected from the number of evaluation and/or verification sites on the first wafer. The first site can have a first metal-gate structure associated therewith that was created using the metal-gate procedure, and evaluation data can be obtained from the first metal-gate structure. For example, the evaluation data can be obtained from one or more of the subsystems (110, 120, 130, 140, 150, 160, and 170). In addition, first verification data can be established for the metal gate structure at the first site on the first wafer, and the first verification data can include verified measurement data, verified inspection data, reference data, and/or library data. Confidence data and/or risk data can be established for the first metal-gate structure using a first difference between the first evaluation data and the first verification data. The metal-gate procedure can be identified as a verified procedure when a first verification limit is met, and the metal-gate procedure can be identified as an un-verified procedure when a first verification limit is not met.

In other examples, when a metal-gate procedure is being verified, additional sites can be used on the first wafer. For example, verification decisions can be made using the data from a first site and data from one or more additional sites on the first wafer. When a new site is required, a new site can be selected from the number of evaluation sites on the first wafer, and the new site can have a new metal gate structure associated therewith. New evaluation data can be obtained from the new evaluation site on the first wafer, and the new evaluation data can be obtained from one or more of the subsystems (110, 120, 130, 140, 150, 160, and 170). In addition, new verification data can be established for the new site on the first wafer. New confidence data and/or risk data can be established for the new site using a new difference between the new evaluation data and the new verification data. The metal-gate procedure can be identified as a verified procedure when a new verification limit is met, and the procedure can be identified as an un-verified procedure when the new verification limit is not met.

In still other examples, when a metal-gate procedure is being verified, evaluated, and/or performed, sites on additional wafers can be used. For example, verification decisions can be made using the data from sites on one or more wafers. One or more of the controllers (114, 124, 134, 144, 154, 164, and 190) can also be configured for establishing an additional evaluation procedure for an additional wafer.

In addition, the LELE processing sequence can be performed in real-time and can include one or more lithography-related procedures, one or more scanner-related procedures, one or more inspection-related procedures, one or more measurement-related procedures, one or more evaluation-related procedures, one or more etch-related procedures, one or more COR procedures, one or more deposition-related procedures, one or more thermal processing procedures, one or more coating-related procedures, one or more alignment-related procedures, one or more polishing-related procedures, one or more storage-related procedures, one or more transfer procedures, one or more cleaning-related procedures, one or more rework-related procedures, one or more oxidation-related procedures, one or more nitridation-related procedures, or one or more external procedures, or any combination thereof.

In some embodiments, the data used during evaluation and/or verification procedures can include intensity data, transmission data, absorption data, reflectance data, diffraction data, goodness of fit (GOF) data, CD data, accuracy data, wavelength data, sidewall data, particle data, process data, optical properties data, or image data, or any combination thereof. The data can also include historical data, real-time data, optical metrology data, imaging data, particle data, CD-scanning electron microscope (CD-SEM) data, transmission electron microscope (TEM) data, and/or focused ion beam (FIB) data.

The wafers 105 can include one or more layers that can include semiconductor material, carbon material, dielectric material, glass material, ceramic material, metallic material, oxidized material, mask material, or planarization material, or a combination thereof.

When metal-gate devices are being developed, one or more metal-gate libraries can be created, refined, updated, and/or used, and the metal-gate libraries can include patterns, features, properties, structures, procedures, images, signal, and/or optical data. The processing system 100 can be used to perform LELE processing sequences and can generate metal-gate library data when the LELE processing sequences are performed.

When metal gate structures are created and/or evaluated, accuracy and/or tolerance limits can be used. When these limits are not correct, refinement procedures can be performed. Alternatively, other procedures can be performed, other sites can be used, or other wafers can be used. When a refinement procedure is used, the refinement procedure can utilize bilinear refinement, Lagrange refinement, Cubic Spline refinement, Aitken refinement, weighted average refinement, multi-quadratic refinement, bi-cubic refinement, Turran refinement, wavelet refinement, Bessel's refinement, Everett refinement, finite-difference refinement, Gauss refinement, Hermite refinement, Newton's divided difference refinement, osculating refinement, or Thiele's refinement algorithm, or a combination thereof.

In addition, the evaluation and or verification data can include gate data, drain data, source data, capacitor data, via data, trench date, two-dimensional memory structure data, three-dimensional memory structure data, SWA data, bottom CD data, top CD data, middle CD data, polygon data, array data, periodic structure data, alignment feature data, doping data, strain data, damaged-structure data, or reference structure data, or any combination thereof.

When a first (most accurate) accuracy limit is met, the metal gate structures being produced can be identified as having the highest level of confidence and/or the lowest risk factor associated therewith. When another (less accurate) accuracy limit is met, the metal gate structures being produced can be identified as having a lower level of confidence and/or a higher risk factor associated therewith. When one or more accuracy limits are not met, the metal gate structures being produced can be identified as unverified structures having a low level of confidence and/or a high risk factor associated therewith.

In some cases, the sites used and the types of periodic measurement targets in the LELE processing sequences can be specified by a semiconductor manufacturer based on data stored in a historical database. For example, a semiconductor manufacturer may have historically chosen a number of sites on the wafer when making SEM measurements and would like to correlate the measurement data, inspection data, and/or evaluation data from one system to the data measured using a SEM system, a TEM system, and/or a FIB system. In addition, the number of measurement or verification sites can be reduced as the manufacturer becomes more confident that the process is and will continue to produce high quality spacers and/or devices.

The measurement, inspection, and/or evaluation procedures in a LELE processing sequence can be time consuming and can affect the throughput of a processing system. During process runs, a manufacturer may wish to minimize the amount of time used to measure, inspect, verify, and/or evaluate a wafer. The procedures can be time-dependent, and different procedures may be selected based on their execution time. A smaller number of sites may be used when execution times are too long.

In addition, process result, measurement, inspection, verification, evaluation, and/or prediction maps associated with one or more processes may be used to calculate a confidence map for a wafer. For example, values from another map may be used as weighting factors.

The evaluation sites can include pattern-dependent sites, target-dependent sites, alignment-dependent sites, overlay-dependent sites, process-dependent sites, measurement-dependent sites, inspection-dependent sites, gate-dependent sites, wafer-dependent sites, or product-dependent sites, or any combination thereof. The limit data can include confidence limits, risk limits, pattern-dependent limits, target-dependent limits, alignment-dependent limits, overlay-dependent limits, gate structure limits, accuracy limits, time limits, product requirement limits, measurement limits, inspection limits, simulation limits, prediction limits, or historical limits, or any combination thereof.

In some examples, first confidence and/or risk data can be established for a wafer before, during, and/or after one or more of the first layer creation procedures are performed by the processing system 100, second confidence and/or risk data can be established for the wafer before, during, and/or after one or more evaluation procedures are performed for the first layer by the processing system 100, third confidence and/or risk data can be established for the wafer before, during, and/or after one or more of the second layer creation procedures are performed by the processing system 100, and fourth confidence and/or risk data can be established for the wafer before, during, and/or after evaluation procedures are performed for the second layer by the processing system 100.

Figure 2:
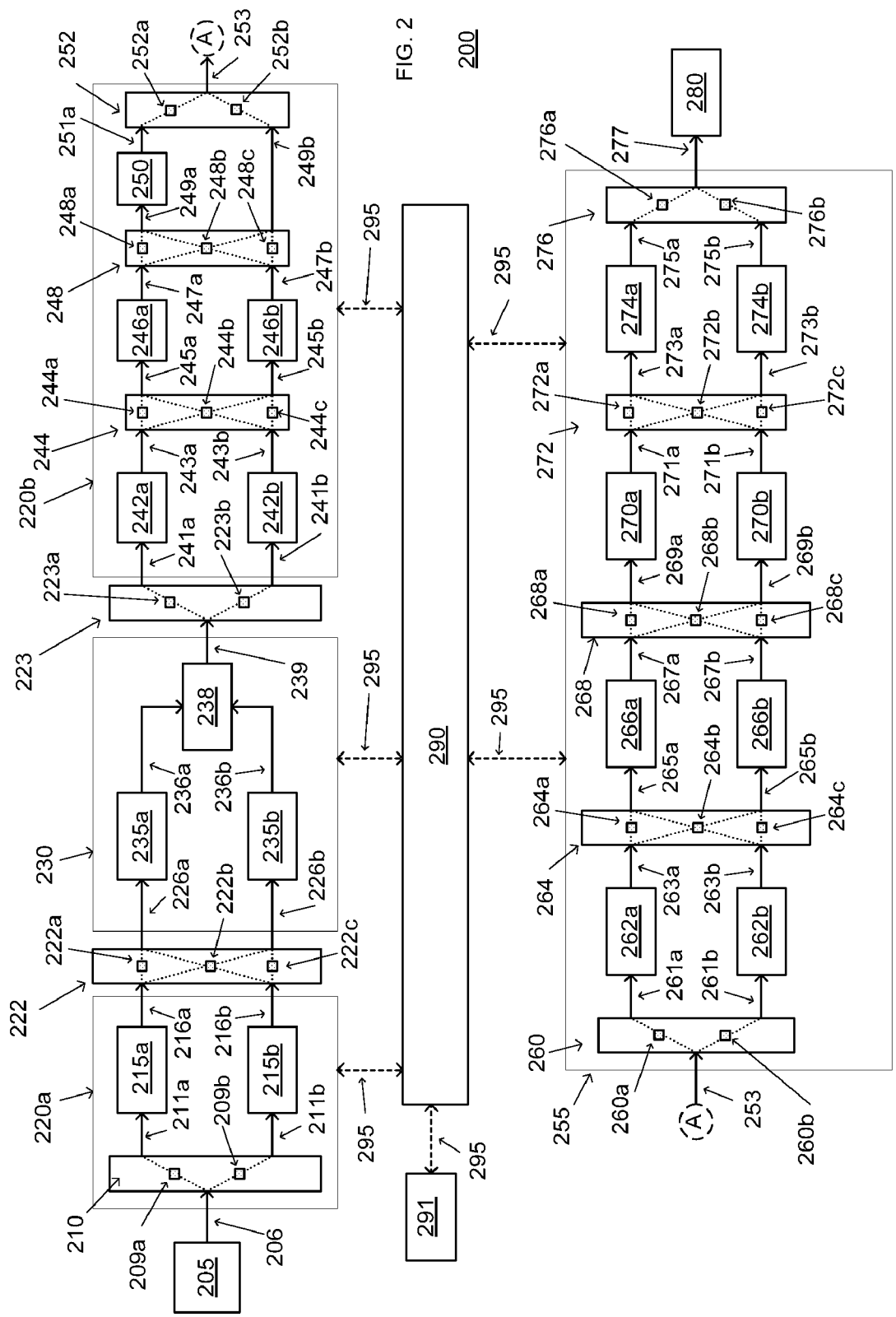
FIG. 2 illustrates an exemplary block diagram of a group of subsystems in accordance with embodiments of the invention.

FIG. 2 illustrates an exemplary block diagram of a group of subsystems in accordance with embodiments of the invention. In the illustrated embodiment, a first group of subsystems 200 is shown, but this group of subsystems in not required for the invention. Alternatively, a different group of subsystems may be used and the groups may be configured differently.

The processing group 200 can include one or more FOUPs 205, and each FOUP 205 can have a plurality of incoming wafers configured therein. The FOUPs 205 can have a output 206 that can be coupled to one or more integrated (internal) transfer subsystem (i-TS) 210, and each i-TS 210 can include a plurality of transfer elements (209a and 209b). In some embodiments, each i-TS 210 can be located within a first part of an Integrated-Metrology-Lithography subsystem 220a, and each i-TS 210 can be used to receive, transfer, and/or store one or more wafers during a LELE processing sequence. Alternatively, external transfer subsystems may be used.

The processing group 200 can include a first part of the Integrated-Metrology-Lithography subsystem 220a, at least one i-TSs 210 can be configured within the first part of the Integrated-Metrology-Lithography subsystem 220a, and two or more output paths (211a and 211b) can be provided for the wafers. Two paths are shown to simplify the illustrated embodiment, but additional paths (not shown) can be provided by the invention.

The processing group 200 can include two or more deposition elements (215a and 215b), and the two or more output paths (211a and 211b) can be coupled to the two or more deposition elements (215a and 215b). The deposition element 215a can have at least one output path 216a, and the deposition element 215b can have at least one output path 216b. The output paths (216a and 216b) can be coupled to a first transfer subsystem 222, and the transfer subsystem 222 can have two or more output paths (226a and 226b). In addition, the transfer subsystem 222 can include a plurality of transfer elements (222a, 222b, and 222c) that can be used to transfer wafers.

The processing group 200 can include a scanner subsystem 230 that can include two or more alignment elements (235a and 235b) and at least on exposure element 238. Wafers can be provided to the alignment elements (235a and 235b) via the output paths (226a and 226b) from the transfer subsystem 222. Wafers can be provided to the exposure element 238 via the output paths (236a and 236b) from the alignment elements (235a and 235b).

The processing group 200 can include a second portion of a transfer subsystem 223 that can include two or more transfer elements (223a and 223b). Wafers can be provided to the second portion of a transfer subsystem 223 via the output path 239 from the scanner subsystem 230.

Still referring to FIG. 2, a second part of an Integrated-Metrology-Lithography subsystem 220b is shown, and the second part of an Integrated-Metrology-Lithography subsystem 220b can include two or more temperature control elements (242a and 242b), one or more first integrated (internal) transfer subsystem (i-TS) 244, two or more developing elements (246a and 246b), one or more second integrated (internal) transfer subsystem (i-TS) 248, one or more internal-Integrated-Metrology-Module (i-IMM) 250, and one or more third integrated (internal) transfer subsystem (i-TS) 252.

First sets of exposed wafers can be provided to one or more first temperature control elements 242a via the first input path 241a from the second portion of a transfer subsystem 223 using the internal transfer elements 223a, and second sets of exposed wafers can be provided to one or more second temperature control elements 242b via the input path 241b from the second portion of a transfer subsystem 223 using the internal transfer elements 223b. First sets of thermally processed wafers can be provided from the first temperature control elements 242a via a first path 243a to the first integrated (internal) transfer subsystem (i-TS) 244, and other sets of thermally processed wafers can be provided from the second temperature control elements 242b via a second path 243b to the first integrated (internal) transfer subsystem (i-TS) 244.

Some of the thermally processed wafers can be provided to one or more first developing elements 246a via the first input path 245a from the first integrated (internal) transfer subsystem (i-TS) 244, and other wafers can be provided to one or more second developing elements 246b via the second input path 245b from the first integrated (internal) transfer subsystem (i-TS) 244. The first integrated (internal) transfer subsystem (i-TS) 244 can include the internal transfer elements (244a, 244b, and 244c) that can configured to transfer the thermally processed wafers to their proper destination. In addition, some developed wafers can be provided from the first developing elements 246a via a first path 247a to the second integrated (internal) transfer subsystem (i-TS) 248, and other developed wafers can be provided from the second developing elements 246b via a second path 247b to the second integrated (internal) transfer subsystem (i-TS) 248.

Some of the developed wafers can be provided to one or more internal-Integrated-Metrology-Module (i-IMM) 250 via the first input path 249a from the second integrated (internal) transfer subsystem (i-TS) 248, and other developed wafers can be provided to one or more third integrated (internal) transfer subsystem (i-TS) 252 via the second input path 249b from the second integrated (internal) transfer subsystem (i-TS) 248. The second integrated (internal) transfer subsystem (i-TS) 248 can include the internal transfer elements (248a, 248b, and 248c) that can configured to transfer the developed wafers to their proper destination. In addition, measured wafers can be provided from the internal-Integrated-Metrology-Module (i-IMM) 250 via an output path 251a to the third integrated (internal) transfer subsystem (i-TS) 252. The third integrated (internal) transfer subsystem (i-TS) 252 can include the internal transfer elements (252a, and 252b) that can configured to transfer the developed wafers and/or the measured wafers to the Integrated-Metrology-Etching system 255 via output path 253.

In some embodiments, the Integrated-Metrology-Etching system 255 can include one or more first integrated (internal) transfer subsystem (i-TS) 260, two or more internal-Integrated-Metrology-Module (i-IMM) (262a and 262b) coupled to the first integrated (internal) transfer subsystem (i-TS) 260. In addition, each first integrated (internal) transfer subsystem (i-TS) 260 can include a plurality of transfer elements (260a and 260b), and two or more output paths (261a and 261b) can be provided for the wafers. Two paths are shown to simplify the illustrated embodiment, but additional paths (not shown) can be provided by the invention. The iIMM 262a can have at least one input path 261a and at least one output path 263a. The iIMM 262b can have at least one input path 261b and at least one output path 263b. The output paths (263a and 263b) can be coupled to second integrated (internal) transfer subsystem (i-TS) 264, and the second integrated (internal) transfer subsystem (i-TS) 264 can have two or more output paths (265a and 265b).

In other embodiments, one or more of the i-IMMs (262a and 262b) can include alignment elements, inspection elements, and/or storage elements. In addition, the Integrated-Metrology-Etching system 255 can include one or more second integrated (internal) transfer subsystem (i-TS) 264 coupled to the i-IMMs (262a and 262b).

In some embodiments, the Integrated-Metrology-Etching system 255 can include two or more integrated (internal) etching subsystems (266a and 266b) coupled to the second integrated (internal) transfer subsystem (i-TS) 264, and one or more third integrated (internal) transfer subsystem (i-TS) 268 that can be coupled to one or more of the integrated (internal) etching subsystems (266a and 266b). In addition, each second integrated (internal) transfer subsystem (i-TS) 264 can include a plurality of transfer elements (264a, 264b, and 264c), and each third integrated (internal) transfer subsystem (i-TS) 268 can include a plurality of transfer elements (268a, 268b, and 268c). The integrated (internal) etching subsystems 266a can have at least one input path 265a and at least one output path 267a. The integrated (internal) etching subsystems 266b can have at least one input path 265b and at least one output path 267b. The output paths (267a and 267b) can be coupled to third integrated (internal) transfer subsystem (i-TS) 268, and the third integrated (internal) transfer subsystem (i-TS) 268 can have two or more output paths (269a and 269b).

In some embodiments, the Integrated-Metrology-Etching system 255 can include two or more other integrated (internal) subsystems (270a and 270b) coupled to the third integrated (internal) transfer subsystem (i-TS) 264, and one or more fourth integrated (internal) transfer subsystems (i-TS) 272 that can be coupled to one or more of the integrated (internal) subsystems (270a and 270b). In addition, each fourth integrated (internal) transfer subsystem (i-TS) 272 can include a plurality of transfer elements (272a, 272b, and 272c). The integrated (internal) subsystems 270a can have at least one input path 269a and at least one output path 271a. The integrated (internal) subsystems 270b can have at least one input path 269b and at least one output path 271b. The output paths (271a and 271b) can be coupled to fourth integrated (internal) transfer subsystem (i-TS) 272, and the fourth integrated (internal) transfer subsystem (i-TS) 272 can have two or more output paths (273a and 273b).

In some examples, the other integrated (internal) subsystems (270a and 270b) can include single wafer and/or multi-wafer Chemical Oxide Removal (COR) subsystems. In other examples, the other integrated (internal) subsystems (270a and 270b) can include single wafer and/or multi-wafer cleaning elements and/or ashing elements. In still other examples, the other integrated (internal) subsystems (270a and 270b) can include alignment elements, inspection elements, evaluation elements, polishing elements, Gas Cluster Ion Beam (GCIB) subsystems, deposition elements, and/or storage elements.

In some embodiments, the Integrated-Metrology-Etching system 255 can include one or more additional Internal-Integrated-Metrology Modules (I-IMM) (274a and 274b) coupled to the fourth integrated (internal) transfer subsystem (i-TS) 272, and one or more fifth integrated (internal) transfer subsystems (i-TS) 276 that can be coupled to one or more of the additional integrated (internal) subsystems (274a and 274b). In addition, each fifth integrated (internal) transfer subsystem (i-TS) 276 can include a plurality of transfer elements (276a and 276b).

The additional I-IMM 274a can have at least one input path 273a and at least one output path 275a. The additional I-IMM 274b can have at least one input path 273b and at least one output path 275b. The output paths (275a and 275b) can be coupled to fifth integrated (internal) transfer subsystem (i-TS) 276, and the fifth integrated (internal) transfer subsystem (i-TS) 276 can have one or more output paths 277.

In some examples, the additional integrated (internal) subsystems (274a and 274b) can include single beam and/or multi-beam integrated metrology (IM) subsystems. In other examples, the additional integrated (internal) subsystems (274a and 274b) can include alignment elements, inspection elements, evaluation elements, cleaning elements, polishing elements, Gas Cluster Ion Beam (GCIB) subsystems, deposition elements, and/or storage elements.

In some embodiments, the Integrated-Metrology-Etching system 255 can provide etched wafers to other processing systems 280 via one or more paths 277.

Furthermore, the processing group 200 can include one or more controllers 290 that can be coupled to the first part of an Integrated-Metrology-Lithography subsystem 220a, the scanner subsystem 230, second part of an Integrated-Metrology-Lithography subsystem 220b, and the Integrated-Metrology-Etching system 255 using the data transfer subsystem 295. In addition, the controller 290 can receive and/or transmit data items 291 using the data transfer subsystem 295.

Figure 3:
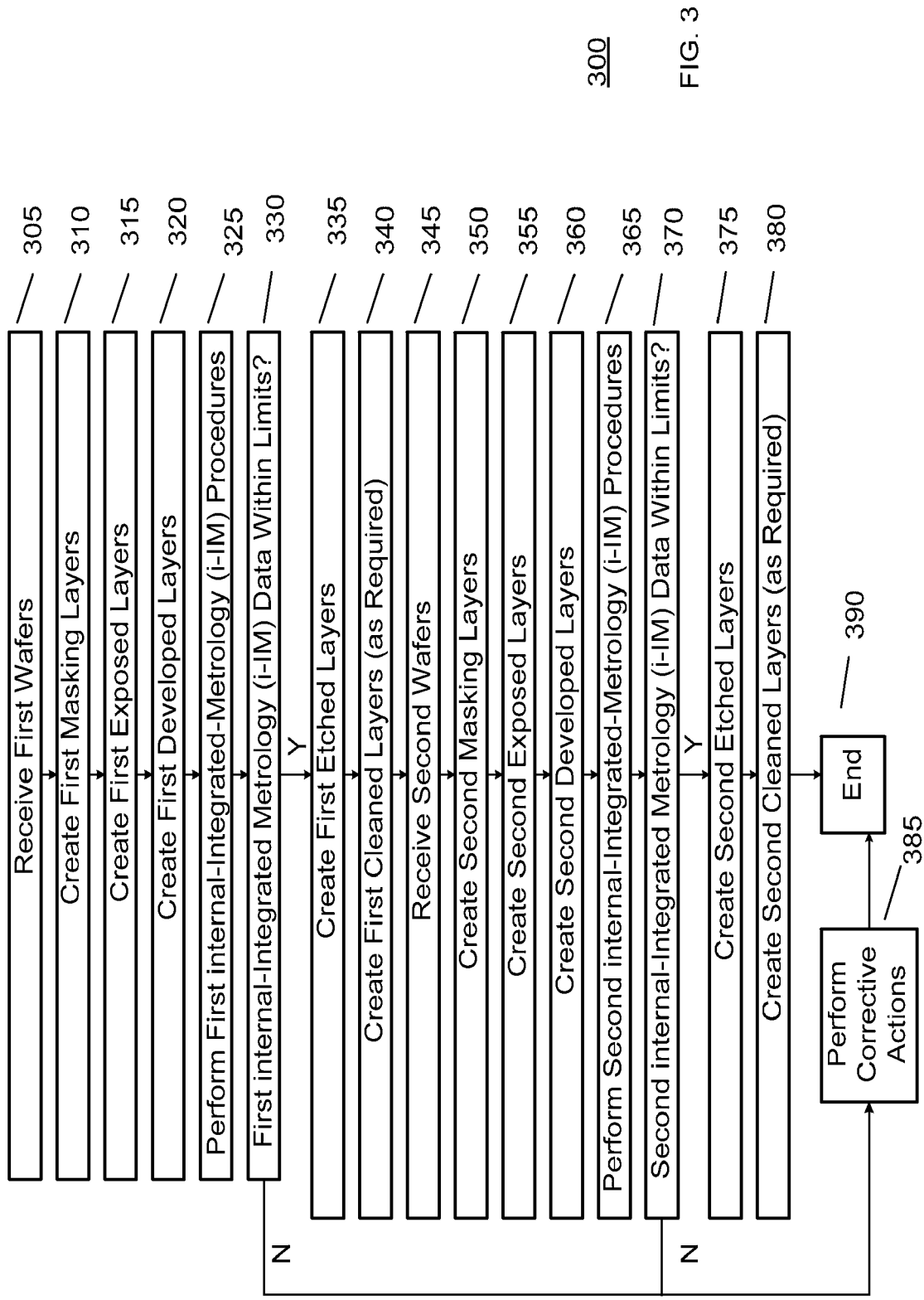
FIG. 3 illustrates a simplified flow diagram of a Lithography-Etch-Lithography-Etch (LELE) processing sequence in accordance with embodiments of the invention.

FIG. 3 illustrates a simplified flow diagram of a Lithography-Etch-Lithography-Etch (LELE) processing sequence in accordance with embodiments of the invention. FIGS. 4A-4E illustrate simplified views of a first set of procedures in the Lithography-Etch-Lithography-Etch (LELE) processing sequence in accordance with embodiments of the invention. FIGS. 5A-5E illustrate simplified views of a second set of procedures in the Lithography-Etch-Lithography-Etch (LELE) processing sequence in accordance with embodiments of the invention.

In 305, a plurality of wafers can be received by a processing group (200 FIG. 2), and one or more of the wafers can be provided to one or more of the integrated (internal) transfer subsystems (i-TS) (210 FIG. 2).

In 310, a first masking layer can be created on the wafers, and the first masking layer can include photoresist material, anti-reflective coating (ARC) material, and/or bottom anti-reflective coating (BARC) material. One or more of the wafers can be provided to one or more of the deposition elements (215a and 215b, FIG. 2) from one or more of the integrated (internal) transfer subsystems (i-TS) (210 FIG. 2), and one or more masking layers can be created. Processing data can be obtained when the masking layers are created.

In 315, one or more of the wafers can be provided from one or more of the deposition elements (215a and 215b, FIG. 2) in the Integrated-Metrology-Etching system 255 to one or more of the scanner subsystems (120 FIG. 1), and one or more exposed layers can be created. In some examples, one or more alignment procedures can be performed before the first exposure procedures is performed using the wafers, and first exposure data can be obtained that can include intensity data, focus data, and/or dose data. Alternatively, other procedures may be used, and other data may be obtained.

In immersion lithography tools, exposure steps can be performed at a number of locations on the wafer during the first exposure procedures. For example, a first mask (410, FIG. 4A) can be stepped and/or scanned across the wafer and multiple exposures can be performed during the first exposure procedures. In addition, a notch or flat surface can be used to align the mask used for the first layer, and alignment targets in subsequently used masks can be used to align the following layers to the first layer and/or other layers.

During the first exposure procedure in a LELE processing sequence, a first mask (410, FIG. 4A) can be used, and the first mask pattern (411, FIG. 4A) can include a plurality of first isolated transparent regions (412, FIG. 4A), a plurality of first isolated opaque regions (414, FIG. 4A), a plurality of first dense transparent regions (416, FIG. 4A), a plurality of first dense opaque regions (417, FIG. 4A), and a plurality of first alignment targets and/or measurement structures (419, FIG. 4A). For example, during the first exposure procedure, a first exposed pattern (421, FIG. 4B) can be created in the first exposed masking layer (423, FIG. 4B) on the exposed wafers (420, FIG. 4B) using the first mask pattern (411, FIG. 4A) in the first mask (410, FIG. 4A). In addition, the first alignment targets and/or measurement structures (419, FIG. 4A) in the first mask (410, FIG. 4A) can include one or more first multi-dimensional patterns.

The exposed wafers (420, FIG. 4B) can include a one or more previously created layers (401, FIG. 4B), one or more target layers (428, FIG. 4B), and one or more exposed masking layers (423, FIG. 4B). The previously created layers (401, FIG. 4B) and/or the target layers (428, FIG. 4B) can include semiconductor material, low-k dielectric material, ultra-low-k dielectric material, ceramic material, glass material, metallic material, resist material, filler material, doped material, un-doped material, stressed material, oxygen-containing material, nitrogen-containing material, anti-reflective coating (ARC) material, or bottom anti-reflective coating (BARC) material, or any combination thereof. The exposed masking layer (423, FIG. 4B) can include photoresist material, anti-reflective coating (ARC) material, or bottom anti-reflective coating (BARC) material, or any combination thereof. Historical and/or real-time data can be obtained when the previously created layers (401, FIG. 4B), the target layers (428, FIG. 4B), and/or the exposed masking layer (423, FIG. 4B) are created.

During the first exposure procedure, the first isolated transparent regions (412, FIG. 4A) in the first mask (410, FIG. 4A) can be used to create one or more exposed first isolated regions (422, FIG. 4B), and the first isolated opaque regions (414, FIG. 4A) in the first mask (410, FIG. 4A) can be used to create one or more first unexposed isolated regions (424, FIG. 4B) in the first exposed masking layer (423, FIG. 4B). The first dense transparent regions (416, FIG. 4A) in the first mask (410, FIG. 4A) can be used to create one or more first exposed dense regions (426, FIG. 4B), and the first dense opaque regions (417, FIG. 4A) in the first mask (410, FIG. 4A) can be used to create one or more first unexposed dense regions (427, FIG. 4B) in the first exposed masking layer (423, FIG. 4B). In addition, the first alignment targets and/or measurement structures (419, FIG. 4A) can be used to create one or more exposed first alignment targets and/or measurement structures (429, FIG. 4B) in the first exposed masking layer (423, FIG. 4). The first exposure data can include mask data, scanner data, focus data, dose data, exposure data, wavelength data, scan pattern data, scan spot size data, and other processing data. During the first exposure procedures, confidence data and/or risk data for the LELE sequence can be established using the first exposure data.

In 320, one or more of the wafers can be provided from the scanner subsystem (230, FIG. 2) to the second part of an Integrated-Metrology-Lithography subsystem (220b, FIG. 2) using one or more of the transfer subsystems (223 FIG. 2), and one or more developed layers can be created. For example, one or more first developing procedures can be performed using the wafers, and first development data can be obtained. Alternatively, other procedures may be used. In some examples, one or more of the wafers can be measured using the Integrated-Metrology-Lithography subsystem (220b, FIG. 2) using, and real-time internal-integrated-metrology (i-IM) data can be obtained. For example, the first exposure data, the first development data, the real-time IM date, the confidence data, and/or risk data from one or more wafers can be examined to determine if one or more corrective actions are required before the LELE processing sequence can continue. Alternatively, other procedures may be used.

The first developed wafers (430, FIG. 4C) can include a one or more previously created layers (401, FIG. 4C), one or more target layers (438, FIG. 4C), and one or more developed masking layers (433, FIG. 4C). The previously created layers (401, FIG. 4C) and/or the target layers (438, FIG. 4C) can include semiconductor material, low-k dielectric material, ultra-low-k dielectric material, ceramic material, glass material, metallic material, resist material, filler material, doped material, un-doped material, stressed material, oxygen-containing material, nitrogen-containing material, anti-reflective coating (ARC) material, or bottom anti-reflective coating (BARC) material, or any combination thereof. The developed masking layer (433, FIG. 4C) can include developed photoresist material, developed anti-reflective coating (ARC) material, or developed bottom anti-reflective coating (BARC) material, or any combination thereof. Historical and/or real-time data can be obtained when the previously created layers (401, FIG. 4C), the target layers (438, FIG. 4C), and/or the developed masking layer (433, FIG. 4C) are created.

During the first development procedure, a first development pattern (431, FIG. 4C) can be created in the first developed masking layer (433, FIG. 4C) on the first developed wafers (430, FIG. 4C). The first development pattern (431, FIG. 4C) is shown having a plurality of first developed (removed) isolated regions (432, FIG. 4C), a plurality of first undeveloped isolated features (434, FIG. 4C), a plurality of first developed (removed) dense regions (436, FIG. 4C), a plurality of first undeveloped dense features (437, FIG. 4C), a plurality of first developed alignment target structures and/or measurement structures (439, FIG. 4C).

The first unexposed isolated opaque regions (424, FIG. 4B) can be used to create the first undeveloped isolated features (434, FIG. 4C) in the first developed masking layer (433, FIG. 4C), the exposed first isolated transparent regions (422, FIG. 4B) can be used to create the first developed (removed) isolated regions (432, FIG. 4C), in the first developed masking layer (433, FIG. 4C). The first unexposed dense opaque regions (427, FIG. 4B) can be used to create the first undeveloped dense features (437, FIG. 4C) in the first developed masking layer (433, FIG. 4C), the first exposed dense transparent regions (426, FIG. 4B) can be used to create the first developed (removed) dense regions (436, FIG. 4C) in the first developed masking layer (433, FIG. 4C). In addition, the exposed first alignment targets and/or measurement structures (429, FIG. 4B) be used to create the developed first alignment targets and/or measurement structures (439, FIG. 4C) in the first developed masking layer (433, FIG. 4C).

The first developing procedures can be performed using the first developer chemistry. The first development data can include chemistry data, spinner data, dispense data, thermal data, and other processing data. In some embodiments, the first development data can be used to update the confidence data and/or risk data for the LELE sequence, and the first development data can be fed forward or fed back to one or more metal gate models.

In 325, one or more first internal-Integrated-Metrology (i-IM) procedures can be performed using the internal-Integrated-Metrology-Module (i-IMM) (250, FIG. 2), and first internal-Integrated-Metrology (i-IM) data can be obtained for one or more of the first developed wafers (430, FIG. 4C). For example, the real-time and/or historical data can be examined to determine the number of first evaluation sites and the number of first wafers to use during the first i-IM procedures. In addition, first confidence data and/or first risk data can be determined during the first i-IM procedures. Alternatively, other subsystems or procedures may be used.

During the first real-time i-IM procedures, first real-time i-IM data can be obtained using one or more of the first undeveloped isolated features (434, FIG. 4C), one or more of the first undeveloped dense features (437, FIG. 4C), and one or more metal gate metrology models. Diffraction signal data can be obtained from the first development pattern (431, FIG. 4C) and can be used in one or more metal gate metrology models to obtain CD data, SWA data, profile data, and/or thickness data for the wafers. When the first development pattern (431, FIG. 4C) includes first periodic elements, diffraction signal data can be obtained from the first periodic elements. In addition, measurement data can be obtained from the developed alignment targets and/or measurement structures (439, FIG. 4C).

In 330, a query can be performed to determine if the first internal-Integrated-Metrology (i-IM) data for the first developed wafers (430, FIG. 4C) is within the first i-IM limits established for the first developed wafers (430, FIG. 4C). When the first i-IM limits are met, procedure 300 can proceed to step 335, and when one or more of the first i-IM limits are not met, procedure 300 can branch to step 385. Alternatively, other procedures may be used.

In some examples, individual and/or total confidence values for the first developed wafers (430, FIG. 4C) can be compared to individual and/or total confidence limits. When one or more of the confidence limits are met, the wafer processing can continue, or corrective actions can be applied if one or more of the confidence limits are not met. Corrective actions can include establishing confidence values for one or more additional first developed wafers (430, FIG. 4C), comparing the confidence values for one or more of the additional wafers to additional confidence limits; and either continuing to process the first developed wafers (430, FIG. 4C), if one or more of the additional confidence limits are met, or stopping the processing, if one or more of the additional confidence limits are not met.

In other examples, individual and/or total risk values for the first developed wafers (430, FIG. 4C) can be compared to individual and/or total risk limits. When one or more of the risk limits are met, the wafer processing can continue, or corrective actions can be applied if one or more of the risk limits are not met. Corrective actions can include establishing risk values for one or more additional first developed wafers (430, FIG. 4C), comparing the additional risk values to additional risk limits; and either continuing to process the first developed wafers (430, FIG. 4C), if one or more of the additional risk limits are met, or stopping the processing, if one or more of the additional risk limits are not met.

In 335, one or more of the first developed wafers (430, FIG. 4C) can be transferred to the Integrated-Metrology-Etching system (255, FIG. 2) where one or more first etch-related processing sequences can be performed, and first etch-related data can be obtained. Alternatively, other processing sequences and/or transfer procedures may be used. In various embodiments, the first etch-related processing sequence can include procedures as shown in FIGS. 6A-10A. Alternatively, other procedures may be used. For example, one or more hard mask etching recipes, one or more hard mask trimming procedures, and/or one or more COR-etch procedures can be performed. The first etch-related data can include chemistry data, plasma data, end-point data EPD), chamber data, thermal data, and other processing data.

The etched wafers (440, FIG. 4D) can include a one or more previously created layers (401, FIG. 4D), and one or more partially-etched target layers (448, FIG. 4D). The previously created layers (401, FIG. 4D) and/or the partially-etched target layers (448, FIG. 4D) can include semiconductor material, low-k dielectric material, ultra-low-k dielectric material, ceramic material, glass material, metallic material, resist material, filler material, doped material, un-doped material, stressed material, oxygen-containing material, nitrogen-containing material, anti-reflective coating (ARC) material, or bottom anti-reflective coating (BARC) material, or any combination thereof. In addition, the partially-etched target layers (448, FIG. 4D) can include partially-etched photoresist material, partially-etched anti-reflective coating (ARC) material, or partially-etched bottom anti-reflective coating (BARC) material, or any combination thereof. Historical and/or real-time data can be obtained when the previously created layers (401, FIG. 4D) and the partially-etched target layers (448, FIG. 4) are created.

During the first etching procedure, a first etched pattern (441, FIG. 4D) can be established on the etched wafers (440, FIG. 4D), and the first etched pattern (441, FIG. 4D) can include a plurality of first isolated metal gate stacks (444, FIG. 4D), a plurality of first dense metal gate stacks (447, FIG. 4D), and one or more alignment target and/or measurement stacks (449, FIG. 4D). One or more first etched (removed) isolated regions (442, FIG. 4D) and one or more first etched (removed) dense regions (446, FIG. 4D) can be created in one or more first etched target layers (448, FIG. 4D) on the etched wafers (440, FIG. 4D) using one or more etching recipes and/or one or more COR-etch procedures. Alternatively, one or more of the first partially-etched gate stacks shown in FIG. 4D may have different shapes that may be associated with a "complete etch" or an "over-etch" condition, During the first etch-related processing sequence, a first etched pattern (441, FIG. 4D) can be established one or more first etched target layers (448, FIG. 4D) on the first etched wafers (440, FIG. 4D), and the first etched pattern (441, FIG. 4D) can include a plurality of first partially-etched isolated metal gate stacks (444, FIG. 4D), a plurality of first dense metal gate stacks (447, FIG. 4D), and one or more alignment target and/or measurement stacks (449, FIG. 4D). In addition, a plurality of first etched (removed) isolated regions (442, FIG. 4D) and a plurality of first etched (removed) dense features (446, FIG. 4D) can be created in one or more first etched target layers (448, FIG. 4D) on the first etched wafers (440, FIG. 4D) using one or more etching recipes and/or one or more COR-etch procedures. Alternatively, one or more of the partially-etched gate stacks shown in FIG. 4D may have different shapes that may be associated with a "complete etch" or an "over-etch" condition, In some embodiments, one or more of the first partially-etched isolated metal gate stacks (444, FIG. 4D) can include a metal gate stack portion (444*a*, FIG. 4D) and a residue portion (444*b*, FIG. 4D), and one or more of the first partially-etched dense metal gate stacks (447, FIG. 4D) can include a metal gate stack portion (447*a*, FIG. 4D) and a residue portion (447*b*, FIG. 4D. In addition, one or more of the alignment target and/or measurement stacks (449, FIG. 4D) can include a desired portion (449*a*, FIG. 4D) and a residue portion (449*b*, FIG. 4D.

In other embodiments, one or more of the first partially-etched isolated metal gate stacks (444, FIG. 4D) can include a metal gate stack portion (444*a*, FIG. 4D) and a residue portion (444*b*, FIG. 4D) that is larger than the metal gate stack portion (544*a*, FIG. 5D), and one or more of the first partially-etched dense metal gate stacks (447, FIG. 4D) can include a metal gate stack portion (447*a*, FIG. 4D) and a residue portion (447*b*, FIG. 4D) that is larger than the metal gate stack portion (447*a*, FIG. 4D).

In still other embodiments, one or more of the first partially-etched isolated metal gate stacks (444, FIG. 4D) can include a metal gate stack portion (444*a*, FIG. 4D) and a residue portion (444*b*, FIG. 4D) that is smaller than the metal gate stack portion (444*a*, FIG. 5D), and one or more of the first partially-etched dense metal gate stacks (447, FIG. 4D) can include a metal gate stack portion (447*a*, FIG. 4D) and a residue portion (447*b*, FIG. 4D) that is smaller than the metal gate stack portion (447*a*, FIG. 4D).

In some embodiments, one or more first post-etch measurement procedures can be performed in real-time using one or more of the internal-Integrated-Metrology Modules (i-IMMs) (274*a* and 274*b*, FIG. 2) in the Integrated-Metrology-Etching system 255, and first post-etch measurement data can be obtained in real-time for one or more of the first etched wafers. For example, the first post-etch measurement data can be examined to determine if additional real-time measurements should be performed, and the number of wafers that require real-time measurements. Alternatively, other subsystems or procedures may be used.

One or more of the I-IMMs (274*a* and 274*b*, FIG. 2) in the Integrated-Metrology-Etching system 255 can obtain diffraction signal data in real-time using the first etched pattern (441, FIG. 4D) In some examples, diffraction signal data can be obtained from the first etched pattern (441, FIG. 4D), and the diffraction signal data can be used in one or more real-time metal gate metrology models to obtain CD data, SWA data, profile data, and/or thickness data for one or more of the first isolated metal gate stacks (444, FIG. 4D), or one or more of the first dense metal gate stacks (447, FIG. 4D), or for one or more of the alignment target and/or measurement stacks (449, FIG. 4D), or any combination thereof. For example, when the first etched pattern (441, FIG. 4D) includes first periodic elements, diffraction signal data can be obtained from the first periodic elements. Alternatively, reflected signal data, transmitted signal data, or absorbed signal data may be used. In addition, measurement data can be obtained for one or more of the first etched (removed) isolated regions (442, FIG. 4D) and/or for one or more first etched (removed) dense regions (446, FIG. 4D).

In 340, one or more first cleaning procedures can be used to remove the first isolated residue portion (444b, FIG. 4) and the first dense residue portion when one or more of these residue portions are present. In some examples, the other integrated (internal) subsystems (270a and 270b) in the Integrated-Metrology-Etching system 255 can include single wafer and/or multi-wafer cleaning elements and/or ashing elements that can be used during the first cleaning procedures. In addition, the first cleaning procedures can include other etch-related procedures and/or other lithography-related procedures.

The cleaned wafers (450, FIG. 4E) can include a one or more previously created layers (401, FIG. 4E), and one or more cleaned target layers (458, FIG. 4E). The previously created layers (401, FIG. 4D) and/or the cleaned target layers (458, FIG. 4E) can include semiconductor material, low-k dielectric material, ultra-low-k dielectric material, ceramic material, glass material, metallic material, resist material, filler material, doped material, un-doped material, stressed material, oxygen-containing material, nitrogen-containing material, anti-reflective coating (ARC) material, or bottom anti-reflective coating (BARC) material, or any combination thereof. Historical and/or real-time data can be obtained when the previously created layers (401, FIG. 4E), and/or the cleaned target layers (458, FIG. 4E) are created.

In some embodiments, one or more first post-clean measurement procedures can be performed in real-time using one or more of the internal-Integrated-Metrology Modules (i-IMMs) (274a and 274b, FIG. 2) in the Integrated-Metrology-Etching system 255, and first post-clean measurement data can be obtained in real-time for one or more of the first cleaned wafers. For example, the first post-clean measurement data can be examined to determine if additional real-time measurements should be performed, and the number of wafers that require real-time measurements. Alternatively, other subsystems or procedures may be used.

One or more of the I-IMMs (274a and 274b, FIG. 2) in the Integrated-Metrology-Etching system 255 can obtain diffraction signal data in real-time using the first cleaned pattern (451, FIG. 4E) In some examples, diffraction signal data can be obtained from the first cleaned pattern (451, FIG. 4E), and the diffraction signal data can be used in one or more real-time metal gate metrology models to obtain CD data, SWA data, profile data, and/or thickness data for one or more of the first cleaned isolated metal gate stacks (454, FIG. 4E), or one or more of the first cleaned dense metal gate stacks (457, FIG. 4E), or for one or more of the cleaned alignment target and/or measurement stacks (459, FIG. 4E), or any combination thereof. For example, when the first cleaned pattern (451, FIG. 4E) includes first cleaned periodic elements, diffraction signal data can be obtained from the first cleaned periodic elements. Alternatively, reflected signal data, transmitted signal data, or absorbed signal data may be used. In addition, measurement data can be obtained for one or more of the first cleaned (removed) isolated regions (452, FIG. 4E) and/or for one or more first cleaned (removed) dense regions (456, FIG. 4E).

In some embodiments, a first set of first metal gate structures can be created in one or more first patterned layers on a plurality of first patterned wafers using a first set of procedures in the LELE processing sequence. The first set of procedures can be performed using a first Integrated-Metrology-Lithography subsystem, a first immersion scanner subsystem coupled to the first Integrated-Metrology-Lithography subsystem, and a first Integrated-Metrology-Etching subsystem coupled to the first Integrated-Metrology-Lithography subsystem. First real-time evaluation data can be obtained for the first set of first metal gate structures using the first Integrated-Metrology-Lithography subsystem and/or the first Integrated-Metrology-Etching subsystem, and a first set of low risk wafers can be established using the first real-time evaluation data for the first set of first metal gate structures.

In 345, a second set of wafers can be received by a processing group (200 FIG. 2), and one or more of the second set of wafers can be provided to one or more of the integrated (internal) transfer subsystems (i-TS) (210 FIG. 2). For example, the second set of wafers can include one or more of the first set of low risk wafers.

In 350, a second masking layer can be created on the second set of wafers, and the second masking layer can include photoresist material, anti-reflective coating (ARC) material, and/or bottom anti-reflective coating (BARC) material. One or more of the second wafers can be provided to one or more of the deposition elements (215a and 215b, FIG. 2) in the first Integrated-Metrology-Lithography subsystem from one or more of the integrated (internal) transfer subsystems (i-TS) (210 FIG. 2) in the first Integrated-Metrology-Lithography subsystem, and one or more second masking layers can be created. Processing data can be obtained when the second masking layers are created.

In 355, one or more of the second wafers can be provided from one or more of the deposition elements (215a and 215b, FIG. 2) to one or more of the scanner subsystems (120, FIG. 1), and one or more second exposed layers can be created. In some examples, one or more alignment procedures can be performed before the second exposure procedures is performed using the second wafers, and second exposure data can be obtained that can include intensity data, focus data, and/or dose data. Alternatively, other procedures may be used, and other data may be obtained.

In immersion lithography tools, exposure steps can be performed at a number of locations on the wafer during the first exposure procedures. For example, a second mask (510, FIG. 5A) can be stepped and/or scanned across the wafer and multiple exposures can be performed during the first exposure procedures. In addition, a notch or flat surface can be used to align the mask used for the first layer, and alignment targets in subsequently used masks can be used to align the following layers to the first layer and/or other layers.

During the second exposure procedure in a LELE processing sequence, a second mask (510, FIG. 5A) can be used, and the second mask pattern (511, FIG. 5A) can include a plurality of second isolated opaque regions (512, FIG. 5A), a plurality of second isolated transparent regions (514, FIG. 5A), a plurality of second dense opaque regions (516, FIG. 5A), a plurality of second dense transparent regions (517, FIG. 5A), and a plurality of second alignment targets and/or measurement structures (519, FIG. 5A). For example, during the second exposure procedure, a second exposed pattern (521, FIG. 5B) can be created in the second masking layer (523, FIG. 5B) on the exposed wafers (520, FIG. 5B) using the second mask pattern (511, FIG. 5A) in the second mask (510, FIG. 5A). In addition, the second alignment targets and/or measurement structures (519, FIG. 5A) in the second mask (510, FIG. 5A) can include one or more second multi-dimensional patterns.

The exposed wafers (520, FIG. 5B) can include a one or more previously created layers (501, FIG. 5B), one or more previously-etched target layers (528, FIG. 5B), and one or more exposed masking layers (523, FIG. 5B). The previously created layers (501, FIG. 5B) and/or the previously etched target layers (528, FIG. 5B) can include semiconductor material, low-k dielectric material, ultra-low-k dielectric material, ceramic material, glass material, metallic material, resist material, filler material, doped material, un-doped material, stressed material, oxygen-containing material, nitrogen-containing material, anti-reflective coating (ARC) material, or bottom anti-reflective coating (BARC) material, or any combination thereof. The second exposed masking layer (523, FIG. 5B) can include photoresist material, anti-reflective coating (ARC) material, or bottom anti-reflective coating (BARC) material, or any combination thereof. Historical and/or real-time data can be obtained when the previously created layers (501, FIG. 5B), the previously-etched target layers (528, FIG. 5B), and/or the second exposed masking layer (523, FIG. 5B) are created.

The previously-etched target layers (528, FIG. 5B) can include a plurality of previously-etched isolated regions (524*a*, FIG. 5B), a plurality of non-etched isolated regions (524*b*, FIG. 5B), a plurality of previously-etched dense regions (525*a*, FIG. 5B), a plurality of non-etched dense regions (525*b*, FIG. 5B), and a plurality of previously-etched alignment targets and/or measurement structures (505*a*, FIG. 5B).

In 360, one or more of the wafers can be provided from the scanner subsystem (230, FIG. 2) to the second part of an Integrated-Metrology-Lithography subsystem (220*b*, FIG. 2) using one or more of the transfer subsystems (223 FIG. 2), and one or more developed layers can be created. For example, one or more second developing procedures can be performed using the wafers, and second development data can be obtained. Alternatively, other procedures may be used. In addition, one or more of the wafers can be measured using the internal-Integrated Metrology Module (i-IMM) (250, FIG. 2), and real-time internal-Integrated-Metrology (i-IM) data can be obtained. For example, the second exposure data, the second development data, the real-time IM date, the confidence data, and/or risk data from one or more wafers can be examined to determine if one or more corrective actions are required before the LELE processing sequence can continue. Alternatively, other procedures may be used.

The second developed wafers (530, FIG. 5C) can include a one or more previously created layers (501, FIG. 5C), one or more previously-etched target layers (538, FIG. 5C), and one or more developed masking layers (533, FIG. 5C). The previously created layers (501, FIG. 5C) and/or the previously-etched target layers (538, FIG. 5C) can include semiconductor material, low-k dielectric material, ultra-low-k dielectric material, ceramic material, glass material, metallic material, resist material, filler material, doped material, un-doped material, stressed material, oxygen-containing material, nitrogen-containing material, anti-reflective coating (ARC) material, or bottom anti-reflective coating (BARC) material, or any combination thereof. The developed masking layer (533, FIG. 5C) can include developed photoresist material, developed anti-reflective coating (ARC) material, or developed bottom anti-reflective coating (BARC) material, or any combination thereof. Historical and/or real-time data can be obtained when the previously created layers (501, FIG. 5C), the previously-etched target layers (538, FIG. 5C), and/or the developed masking layer (533, FIG. 5C) are created.

During the second development procedure, a second development pattern (531, FIG. 5C) can be created in the second developed masking layer (533, FIG. 5C) on the second developed wafers (530, FIG. 5C). The second development pattern (531, FIG. 5C) is shown having a plurality of second developed (removed) isolated regions (532*b*, FIG. 5C), a plurality of second undeveloped isolated features (532*a*, FIG. 5C), a plurality of second developed (removed) dense regions (536, FIG. 5C), a plurality of second undeveloped dense features (537, FIG. 5C), and a plurality of second alignment target structures and/or measurement structures (539, FIG. 5C).

The second unexposed isolated opaque regions (522*a*, FIG. 5B) can be used to create the second undeveloped isolated features (532*a*, FIG. 5C) in the second developed masking layer (533, FIG. 5C), and the exposed second isolated transparent regions (522*b*, FIG. 5B) can be used to create the second developed (removed) isolated regions (532*b*, FIG. 5C) in the second developed masking layer (533, FIG. 5C). The second unexposed dense opaque regions (527, FIG. 5B) can be used to create the second undeveloped dense features (537, FIG. 5C) in the second developed masking layer (533, FIG. 5C), and the exposed second dense transparent regions (526, FIG. 5B) can be used to create the second developed (removed) dense regions (536, FIG. 5C) in the second developed masking layer (533, FIG. 5C). In addition, the exposed second alignment targets and/or measurement structures (529, FIG. 5B) be used to create the undeveloped second alignment targets and/or measurement structures (539, FIG. 5C) in the second developed masking layer (533, FIG. 5C).

The second developing procedures can be performed using the second developer chemistry. The second development data can include chemistry data, spinner data, dispense data, thermal data, and other processing data. In some embodiments, the second development data can be used to update the confidence data and/or risk data for the LELE sequence, and the second development data can be fed forward or fed back to one or more metal gate models.

The previously-etched target layers (538, FIG. 5C) can include a plurality of previously-etched isolated regions (534*a*, FIG. 5C), a plurality of non-etched isolated regions (534*b*, FIG. 5C), a plurality of previously-etched dense regions (535*a*, FIG. 5C), a plurality of non-etched dense regions (535*b*, FIG. 5C), and a plurality of previously-etched alignment targets and/or measurement structures (506*a*, FIG. 5C).

In 365, one or more second internal-Integrated-Metrology (i-IM) procedures can be performed using one or more of the internal-Integrated-Metrology-Module (i-IMM) (250, FIG. 2), and second internal-Integrated-Metrology (i-IM) data can be obtained for one or more of the second developed wafers (530, FIG. 5C). For example, the real-time and/or historical data can be examined to determine the number of second evaluation sites and the number of second developed wafers to use during the second i-IM procedures. In addition, second confidence data and/or second risk data can be determined during the second i-IM procedures. Alternatively, other subsystems or procedures may be used.

During the second real-time i-IM procedures, second real-time i-IM data can be obtained using one or more of the second undeveloped isolated features (534, FIG. 5C), one or more of the second undeveloped dense features (537, FIG. 5C), and one or more metal gate metrology models. Diffraction signal data can be obtained from the second development pattern (531, FIG. 5C) and can be used in one or more metal gate metrology models to obtain CD data, SWA data, profile data, and/or thickness data for the wafers. When the second development pattern (531, FIG. 5C) includes second periodic elements, diffraction signal data can be obtained from the second periodic elements. In addition, measurement data can be obtained from the undeveloped alignment targets and/or measurement structures (539, FIG. 5C).

In 370, a query can be performed to determine if the second internal-Integrated-Metrology (i-IM) data for the second developed wafers (530, FIG. 5C) is within the second i-IM limits established for the second developed wafers (530, FIG. 5C). When the second i-IM limits are met, procedure 300 can proceed to step 375, and when one or more of the second i-IM limits are not met, procedure 300 can branch to step 385. Alternatively, other procedures and/or limits may be used.

In some examples, individual and/or total confidence values for the second developed wafers (530, FIG. 5C) can be compared to individual and/or total confidence limits. When one or more of the confidence limits are met, the wafer processing can continue, or corrective actions can be applied if one or more of the confidence limits are not met. Corrective actions can include establishing confidence values for one or more additional second developed wafers (530, FIG. 5C), comparing the confidence values for one or more of the additional wafers to additional confidence limits; and either continuing to process the second developed wafers (530, FIG. 5C), if one or more of the additional confidence limits are met, or stopping the processing, if one or more of the additional confidence limits are not met.

In other examples, individual and/or total risk values for the second developed wafers (530, FIG. 5C) can be compared to individual and/or total risk limits. When one or more of the risk limits are met, the wafer processing can continue, or corrective actions can be applied if one or more of the risk limits are not met. Corrective actions can include establishing risk values for one or more additional second developed wafers (530, FIG. 5C), comparing the additional risk values to additional risk limits; and either continuing to process the second developed wafers (530, FIG. 5C), if one or more of the additional risk limits are met, or stopping the processing, if one or more of the additional risk limits are not met.

In 375, one or more of the second developed wafers (530, FIG. 5C) can be transferred to the Integrated-Metrology-Etching system (255, FIG. 2) where one or more second etch-related processing sequences can be performed, and second etch-related data can be obtained. Alternatively, other processing sequences and/or transfer procedures may be used. In various embodiments, the second etch-related processing sequence can include procedures as shown in FIGS. 6A-10A. Alternatively, other procedures may be used. For example, one or more hard mask etching recipes, one or more hard mask trimming procedures, and/or one or more COR-etch procedures can be performed. The second etch-related data can include chemistry data, plasma data, end-point data EPD), chamber data, thermal data, and other processing data.

The second etched wafers (540, FIG. 5D) can include a one or more previously created layers (501, FIG. 5D) and one or more partially-etched target layers (548, FIG. 5D). The previously created layers (501, FIG. 5D) and/or the partially-etched target layers (548, FIG. 5D) can include semiconductor material, low-k dielectric material, ultra-low-k dielectric material, ceramic material, glass material, metallic material, resist material, filler material, doped material, un-doped material, stressed material, oxygen-containing material, nitrogen-containing material, anti-reflective coating (ARC) material, or bottom anti-reflective coating (BARC) material, or any combination thereof. The residue portions can include partially-etched photoresist material, partially-etched anti-reflective coating (ARC) material, or partially-etched bottom anti-reflective coating (BARC) material, or any combination thereof. Historical and/or real-time data can be obtained when the previously created layers (501, FIG. 5D) and/or the partially-etched target layer (548, FIG. 5D) are created.

During the second etch-related processing sequence, a second etched pattern (541, FIG. 5D) can be established one or more second partially-etched target layers (548, FIG. 5D) on the second etched wafers (540, FIG. 5D), and the second etched pattern (541, FIG. 5D) can include a plurality of first partially-etched isolated metal gate stacks (544, FIG. 5D), a plurality of second partially-etched isolated metal gate stacks (542, FIG. 5D), a plurality of first dense metal gate stacks (547, FIG. 5D), a plurality of second partially-etched dense metal gate stacks (545, FIG. 5D), and one or more alignment target and/or measurement stacks (549, FIG. 5D). In addition, a plurality of second etched (removed) isolated regions (543, FIG. 5D) and a plurality of second etched (removed) dense regions (546, FIG. 5D) can be created in one or more second partially-etched target layers (548, FIG. 5D) on the second etched wafers (540, FIG. 5D) using one or more etching recipes and/or one or more COR-etch procedures. Alternatively, one or more of the partially-etched gate stacks shown in FIG. 5D may have different shapes that may be associated with a "complete etch" or an "over-etch" condition, In some embodiments, one or more of the first partially-etched isolated metal gate stacks (544, FIG. 5D) can include a metal gate stack portion (544*a*, FIG. 5D) and a residue portion (544*b*, FIG. 5D), and one or more of the second partially-etched isolated metal gate stacks (542, FIG. 5D) can include a metal gate stack portion (542*a*, FIG. 5D) and a residue portion (542*b*, FIG. 5D). In addition, one or more of the first partially-etched dense metal gate stacks (547, FIG. 5D) can include a metal gate stack portion (547*a*, FIG. 5D) and a residue portion (547*b*, FIG. 5D), and one or more of the second partially-etched dense metal gate stacks (545, FIG. 5D) can include a metal gate stack portion (545*a*, FIG. 5D) and a residue portion (545*b*, FIG. 5D).

In other embodiments, one or more of the first partially-etched isolated metal gate stacks (544, FIG. 5D) can include a metal gate stack portion (544*a*, FIG. 5D) and a residue portion (544*b*, FIG. 5D) that is larger than the metal gate stack portion (544*a*, FIG. 5D), and one or more of the second partially-etched isolated metal gate stacks (542, FIG. 5D) can include a metal gate stack portion (542*a*, FIG. 5D) and a residue portion (542*b*, FIG. 5D) that is larger than the metal gate stack portion (542*a*, FIG. 5D). In addition, one or more of the first partially-etched dense metal gate stacks (547, FIG. 5D) can include a metal gate stack portion (547*a*, FIG. 5D) and a residue portion (547*b*, FIG. 5D) that is larger than the metal gate stack portion (547*a*, FIG. 5D), and one or more of the second partially-etched dense metal gate stacks (545, FIG. 5D) can include a metal gate stack portion (545*a*, FIG. 5D) and a residue portion (545*b*, FIG. 5D) that is larger than the metal gate stack portion (545*a*, FIG. 5D).

In still other embodiments, one or more of the first partially-etched isolated metal gate stacks (544, FIG. 5D) can include a metal gate stack portion (544*a*, FIG. 5D) and a residue portion (544*b*, FIG. 5D) that is smaller than the metal gate stack portion (544*a*, FIG. 5D), and one or more of the second partially-etched isolated metal gate stacks (542, FIG. 5D) can include a metal gate stack portion (542*a*, FIG. 5D) and a residue portion (542*b*, FIG. 5D) that is smaller than the metal gate stack portion (542*a*, FIG. 5D). In addition, one or more of the first partially-etched dense metal gate stacks (547, FIG. 5D) can include a metal gate stack portion (547*a*, FIG. 5D) and a residue portion (547*b*, FIG. 5D) that is smaller than the metal gate stack portion (547*a*, FIG. 5D), and one or more of the second partially-etched dense metal gate stacks (545, FIG. 5D) can include a metal gate stack portion (545*a*, FIG. 5D) and a residue portion (545*b*, FIG. 5D) that is smaller than the metal gate stack portion (545*a*, FIG. 5D).

During some processing sequences, one or more second post-etch measurement procedures can be performed in real-time using one or more of the internal-Integrated-Metrology Modules (i-IMMs) (274*a* and 274*b*, FIG. 2) in the Integrated- Metrology-Etching system 255, and second post-etch measurement data can be obtained in real-time for one or more of the second etched wafers. For example, the second post-etch measurement data can be examined to determine if additional real-time measurements should be performed, and the number of wafers that require real-time measurements. Alternatively, other subsystems or procedures may be used.

One or more of the i-IMMs (274a and 274b, FIG. 2) in the Integrated-Metrology-Etching system 255 can obtain diffraction signal data in real-time using the second etched pattern (541, FIG. 5D) In some examples, diffraction signal data can be obtained from the second etched pattern (541, FIG. 5D), and the diffraction signal data can be used in one or more real-time metal gate metrology models to obtain CD data, SWA data, profile data, and/or thickness data for one or more of the second isolated metal gate stacks (544, FIG. 5D), or one or more of the second dense metal gate stacks (547, FIG. 5D), or for one or more of the alignment target and/or measurement stacks (549, FIG. 5D), or any combination thereof. For example, when the second etched pattern (541, FIG. 5D) includes second periodic elements, diffraction signal data can be obtained from the second periodic elements. Alternatively, reflected signal data, transmitted signal data, or absorbed signal data may be used. In addition, measurement data can be obtained for one or more of the second etched (removed) isolated regions (543, FIG. 5D) and/or for one or more second etched (removed) dense regions (546, FIG. 5D).

In 380, one or more second cleaning procedures can be used to remove the first isolated residue portion (544b, FIG. 5D), the second isolated residue portion (542b, FIG. 5D), the first dense residue portion (547b, FIG. 5D), the second dense residue portion (545b, FIG. 5D), the second partially-etched dense masking features (547b, FIG. 5D), and the second target feature residues (549a, FIG. 5). In some examples, the other integrated (internal) subsystems (270a and 270b) in the Integrated-Metrology-Etching system 255 can include single wafer and/or multi-wafer cleaning elements and/or ashing elements that can be used during the second cleaning procedures. In addition, the second cleaning procedures can include other etch-related procedures and/or other lithography-related procedures.

The second cleaned wafers (550, FIG. 5E) can include a one or more previously created layers (501, FIG. 5E), and one or more cleaned target layers (558, FIG. 5E). The previously created layers (501, FIG. 5D) and/or the cleaned target layers (558, FIG. 5E) can include semiconductor material, low-k dielectric material, ultra-low-k dielectric material, ceramic material, glass material, metallic material, resist material, filler material, doped material, un-doped material, stressed material, oxygen-containing material, nitrogen-containing material, anti-reflective coating (ARC) material, or bottom anti-reflective coating (BARC) material, or any combination thereof. Historical and/or real-time data can be obtained when the previously created layers (501, FIG. 5E), and/or the cleaned target layers (558, FIG. 5E) are created.

In some embodiments, one or more second post-clean measurement procedures can be performed in real-time using one or more of the internal-Integrated-Metrology Modules (i-IMMs) (274a and 274b, FIG. 2) in the Integrated-Metrology-Etching system 255, and second post-clean measurement data can be obtained in real-time for one or more of the second cleaned wafers. For example, the second post-clean measurement data can be examined to determine if additional real-time measurements should be performed, and the number of wafers that require real-time measurements. Alternatively, other subsystems or procedures may be used.

One or more of the i-IMMs (274a and 274b, FIG. 2) in the Integrated-Metrology-Etching system 255 can obtain diffraction signal data in real-time using the second cleaned pattern (551, FIG. 5E). The second cleaned pattern (551, FIG. 5E) can include one or more of the second cleaned isolated metal gate stacks (554, FIG. 5E), one or more of the second cleaned isolated spaces (553, FIG. 5E), one or more of the second cleaned dense metal gate stacks (555, FIG. 5E), one or more of the second cleaned dense spaces (557, FIG. 5E), In some examples, diffraction signal data can be obtained from the second cleaned pattern (551, FIG. 5E), and the diffraction signal data can be used in one or more real-time metal gate metrology models to obtain CD data, SWA data, profile data, and/or thickness data for one or more of the second cleaned isolated metal gate stacks (554, FIG. 5E), or one or more of the second cleaned dense metal gate stacks (557, FIG. 5E), or for one or more of the cleaned alignment target and/or measurement stacks (559, FIG. 5E), or any combination thereof. For example, when the second cleaned pattern (551, FIG. 5E) includes second cleaned periodic elements, diffraction signal data can be obtained from the second cleaned periodic elements. Alternatively, reflected signal data, transmitted signal data, or absorbed signal data may be used. In addition, measurement data can be obtained for one or more of the second cleaned (removed) isolated regions (553, FIG. 5E) and/or for one or more second cleaned (removed) dense regions (556, FIG. 5E).

In some embodiments, a second set of second metal gate structures can be created in one or more second patterned layers on a plurality of second patterned wafers using a second set of procedures in the LELE processing sequence. The second set of procedures can be performed using a second Integrated-Metrology-Lithography subsystem, a second immersion scanner subsystem coupled to the second Integrated-Metrology-Lithography subsystem, and a second Integrated-Metrology-Etching subsystem coupled to the second Integrated-Metrology-Lithography subsystem. Second real-time evaluation data can be obtained for the second set of second metal gate structures using the second Integrated-Metrology-Lithography subsystem and/or the second Integrated-Metrology-Etching subsystem, and a second set of low risk wafers can be established using the second real-time evaluation data for the second set of second metal gate structures.

In 385, one or more corrective actions can be performed. In the various examples discussed herein, applying a corrective action can include selecting a new metal gate model, selecting a new metal gate material, selecting a new metal gate fabricating process, selecting a new wafer, determining a new diffraction signal, creating a new metal gate profile signal, determining a new metal gate profile shape, creating an enhanced metal gate profile shape, selecting a different library, using different limits, using different wavelengths, performing a refinement procedure, performing an enhancement procedure, performing an accuracy improvement procedure, performing a sensitivity analysis, performing a clustering procedure, performing a regression procedure, performing an optimization procedure, performing a simulation procedure, or using different metrology data, or a combination thereof.

In addition, corrective actions can include stopping the processing, pausing the processing, re-evaluating one or more of the metal gate structures, re-measuring one or more of the metal gate structures, re-inspecting one or more of the wafers, re-working one or more of the wafers, storing one or more of the wafers, cleaning one or more of the wafers, delaying one or more of the wafers, or stripping one or more of the wafers, or any combination thereof.

Furthermore, corrective actions can include calculating new and/or updated maps for the wafers. For example, corrective actions can include increasing the number of required evaluation sites by one or more when one or more values in the metal-gate-related map are not within a limit and decreasing the number of required evaluation sites by one or more when one or more values in the metal-gate-related map are within the limit.

Procedure 300 can end in 390.

Throughput goals are typically expressed as number of wafers per hour. CD uniformity is typically expressed as a range of variation of a CD measurement across a wafer or across several wafers. For example, a range of 10 nm may be set as a goal for the bottom CD of a structure across several selected sites in a wafer or across several wafers selected from a batch of wafers processed over a period of time. Goodness of fit and cost function are described in U.S. Pat. No. 7,330,279, titled "MODEL AND PARAMETER SELECTION FOR OPTICAL METROLOGY", by Vuong, et al., issued on Feb. 12, 2008, which is incorporated herein by reference in its entirety.

Goals may also involve aggregation of data, such as cost of ownership or return on investment. Cost of ownership related to metrology device may be expressed in term of cost per wafer, cost per die, cost per product, and the like. Return on investment may be expressed as number of months or years needed to recoup the investment cost of a metrology device or pure percent return measured utilizing a discounted cash flow financial model.

In general, optimization of an optical metrology model is performed to minimize or maximize an objective function that depends on the set of optical metrology variables while satisfying selected constraints. If the objective function is goodness of fit, the objective function is maximized. If the objective function is an error metric, such as sum-squared error (SSE) between the simulated diffraction signal and the measured diffraction signal, then the objective function is minimized. Other error metrics may be used, such as sum-squared-difference-log error and other least square errors. The selected constraints of the metrology model optimization are the selected termination criteria.

Optimization may be performed using local or global optimization or a combination of global and local optimization. Examples of global optimization techniques include simulated annealing, genetic algorithms, tabu search, neural networks, branch-and-bound technique, and the like. Examples of local optimization include steepest descent, least squares, hill climber, and the like. Examples of combination global and local optimization are simulated annealing combined with steepest descent and genetic algorithm combined with a steepest descent or hill climber and the like.

Figure 6A:
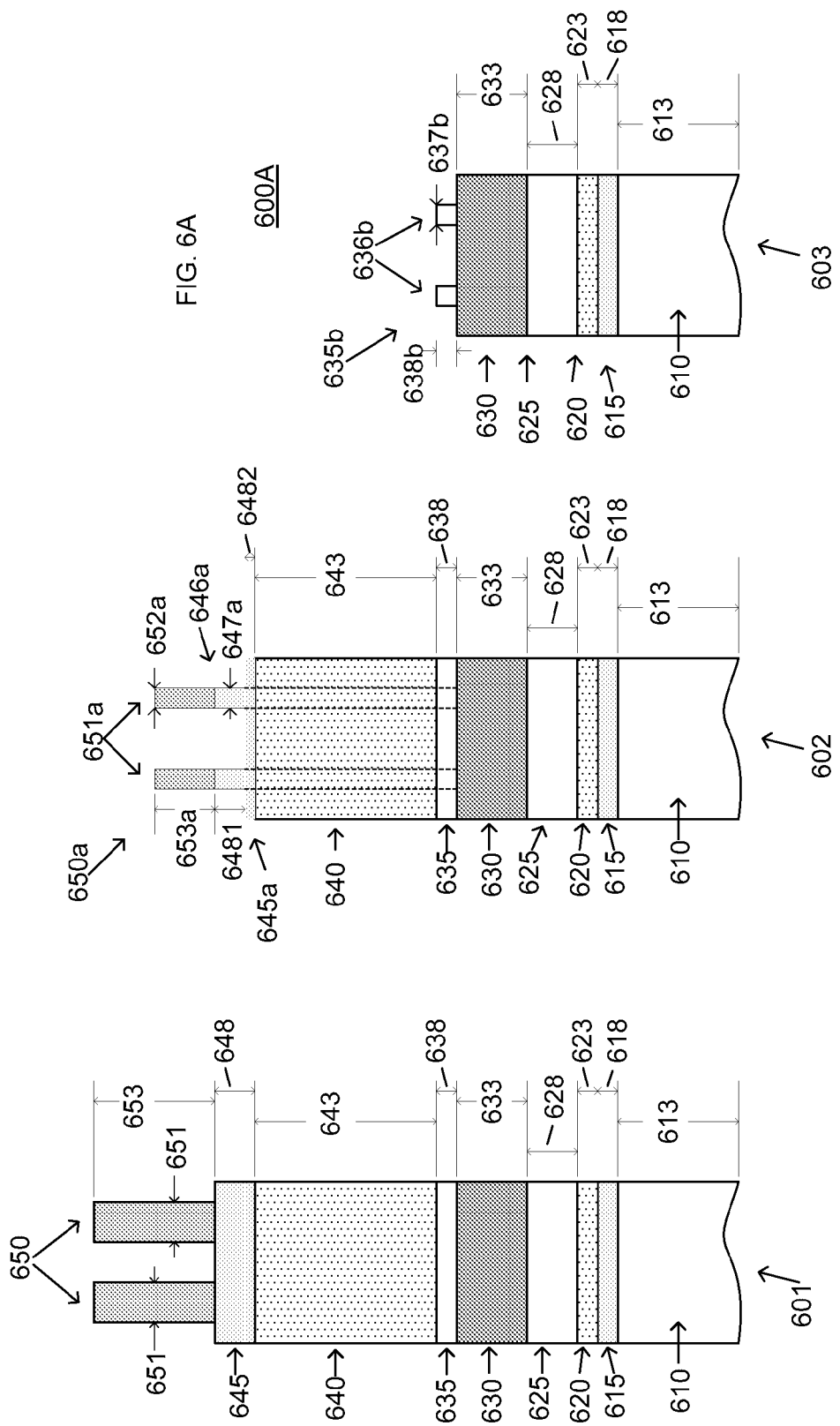
FIGS. 6A and 6B illustrate exemplary views of a first processing sequence for creating metal gate structures in accordance with embodiments of the invention.
Figure 6B:
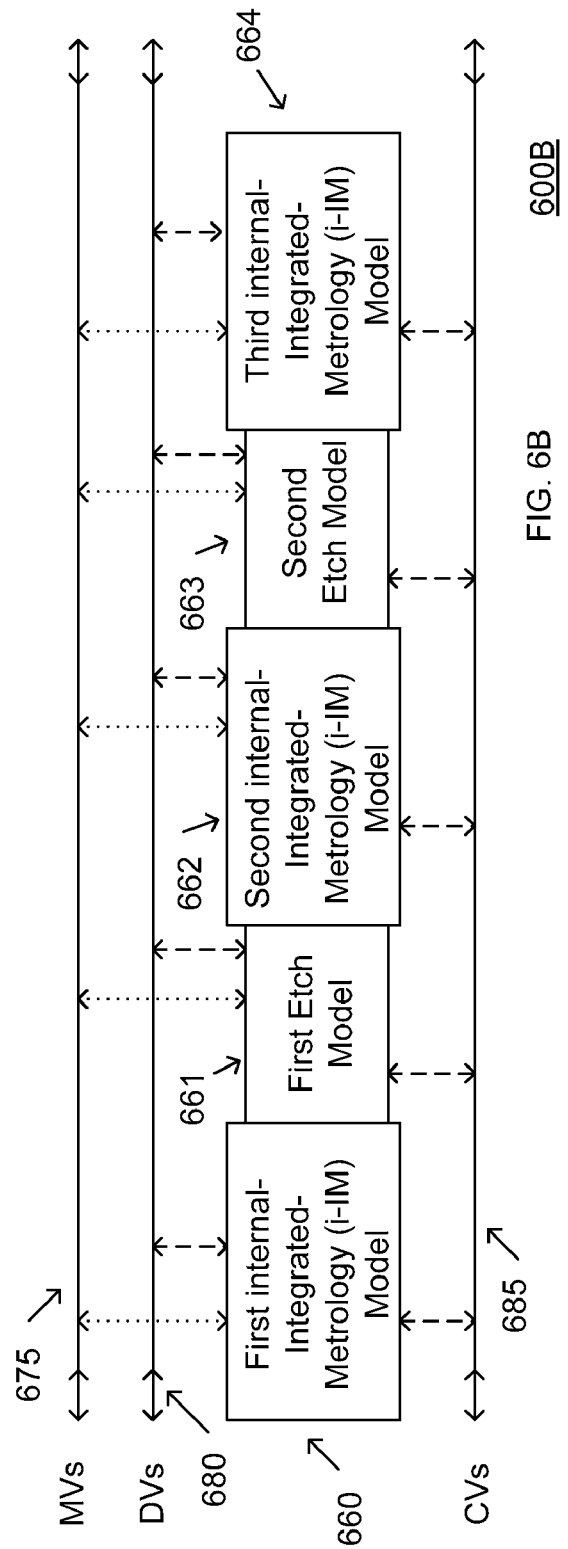

FIGS. 6A and 6B illustrate exemplary views of a first processing sequence for creating metal gate structures in accordance with embodiments of the invention. In FIG. 6A, three exemplary gate stacks (601, 602, and 603) are shown that can be used to illustrate the first processing sequence 600A. In FIG. 6B, six exemplary metal gate stack models (660-664) are shown that can be used to illustrate a different view for the first processing sequence 600B. Alternatively, a different number of gates stacks, a different number of models, and different configurations may be used.

In some embodiments, the first gate stack 601 can be an exemplary view of the first developed wafers (430, FIG. 4C) or the second developed wafers (530, FIG. 5C); the third gate stack 603 can be an exemplary view of the first etched wafers (440, FIG. 4D) or the second etched wafers (540, FIG. 5D); and the second gate stack 602 can be an exemplary view of an intermediate etching step where the CDs 647a are established. Alternatively the third gate stack 603 can be an exemplary view of the first cleaned wafers (450, FIG. 4E) or the second cleaned wafers (550, FIG. 5E)

The first gate stack 601 can include a substrate layer 610, an interface layer 615, a metal gate layer 620, a first hard mask layer 625, a silicon-containing layer 630, a second hard mask layer 635, an gate-control layer 640, a third hard mask layer 645, and a plurality of masking features 650. For example, the substrate layer 610 can include a semiconductor material; the interface layer 615 can include controlled-etch-rate material; the metal gate layer 620 can include $HfO_2$; the first hard mask layer 625 can include TiN; the silicon-containing layer 630 can include amorphous silicon (a-Si); the second hard mask layer 635 can include Tetraethyl Orthosilicate, (TEOS) [Si$(OC_2H_5)_4$]; the gate-control layer 640 can include an gate-control material; the third hard mask layer 645 can include silicon-containing anti-reflective coating (SiARC) material; and the masking features 650 can include ArF photoresist material.

The substrate layer 610 can have a thickness 613 that can vary from approximately 25 nm and to approximately 200 nm; the interface layer 615 can have a thickness 618 that can vary from approximately 2 nm and to approximately 10 nm; the metal gate layer 620 can have a thickness 623 that can vary from approximately 5 nm and to approximately 20 nm; the first hard mask layer 625 can have a thickness 628 that can vary from approximately 15 nm and to approximately 40 nm; the silicon-containing layer 630 can have a thickness 633 that can vary from approximately 25 nm and to approximately 60 nm; the second hard mask layer 635 can have a thickness 638 that can vary from approximately 5 nm and to approximately 20 nm; the gate-control layer 640 can have a thickness 633 that can vary from approximately 50 nm and to approximately 300 nm; the third hard mask layer 645 can have a thickness 648 that can vary from approximately 15 nm and to approximately 60 nm; and the masking features 650 can have a thickness 653 that can vary from approximately 50 nm and to approximately 400 nm. In addition, the masking features 650 can have a CD (width) 651 that can vary from approximately 50 nm and to approximately 100 nm.

During the first processing sequence 600(A,B), a first trimming procedure can be performed, and the pattern of masking features 650 can be used to create a plurality of third hard mask features 646a in the trimmed third hard mask layer 645a. For example, the trim time, the trim endpoint time, and the photoresist profile parameters can be used as control variables during the first trimming procedure. In addition, the CDs 647a for the third hard mask features 646a can be established during the first trimming procedure. The CDs 647a for the third hard mask features 646a can range from approximately 20 nm to approximately 50 nm. The first etch model 661 can be a Multi-Layer-Multi-Input-Multi-Output (MLMIMO) model for predicting the process results from the trimming procedure.

During the first trimming procedure, the chamber pressure can range from approximately 50 mT to approximately 100 mT; the top power can vary from approximately 150 watts to approximately 550 watts; the lower power can vary from approximately 0 watts (e.g., a complete chemical trim procedure) to approximately 110 watts; the ESC voltage can be set at approximately 2500 V; the Tetrafluoromethane ($CF_4$) flow rate can vary between approximately 60 sccm and approximately 100 sccm; the Carbon Hydro-Trifluoride ($CHF_3$) flow rate can vary between approximately 40 sccm and approximately 60 sccm; the top chamber temperature can vary from approximately 70 degrees Celsius to approximately 90 degrees Celsius; the chamber wall temperature can vary from approximately 50 degrees Celsius to approximately 70 degrees Celsius; the bottom chamber temperature can vary from approximately 10 degrees Celsius to approximately 30 degrees Celsius; the temperature at the center of the substrate holder can vary from approximately 12 degrees Celsius to approximately 20 degrees Celsius; the temperature at the edge of the substrate holder can vary from approximately 8 degrees Celsius to approximately 12 degrees Celsius; the center backside pressure for the substrate holder can vary from approximately 5 Torr to approximately 15 Torr; the edge backside pressure for the substrate holder can vary from approximately 27 Torr to approximately 33 Torr; and the processing time can vary from approximately 20 seconds to approximately 150 seconds. Alternatively, the $CF_4$ gas may be required.

The second gate stack 602 can include a substrate layer 610, an interface layer 615, a metal gate layer 620, a first hard mask layer 625, a silicon-containing layer 630, a second hard mask layer 635, a gate-control layer 640, a partially-etched third hard mask layer 645a, a plurality of partially-etched third hard mask features 646a and a plurality of partially-etched masking features 650a. For example, the partially-etched third hard mask layer 645a can have a thickness 6482 that can vary from approximately 5 nm and to approximately 15 nm; the partially-etched third hard mask features 646a can have a thickness 6481 that can vary from approximately 25 nm and to approximately 60 nm; and the partially-etched masking feature 650a can have a thickness 653a that can vary from approximately 5 nm and to approximately 20 nm. In addition, the partially-etched third hard mask features 646a can have a CD (width) 647a that can vary from approximately 15 nm and to approximately 60 nm; and the partially-etched masking feature 651a can have a CD (width) 652a that can vary from approximately 15 nm and to approximately 60 nm. Alternatively, the second gate stacks 602 may be configured differently, and the dimensions may be different.

The third gate stack 603 can include a substrate layer 610, an interface layer 615, a metal gate layer 620, a first hard mask layer 625, a silicon-containing layer 630, and a plurality of etched or cleaned second hard mask features 635b. For example, the substrate layer 610 can include a semiconductor material; the interface layer 615 can include controlled-etch-rate material; the metal gate layer 620 can include $HfO_2$; the first hard mask layer 625 can include TiN; the silicon-containing layer 630 include amorphous silicon (a-Si); and the second hard mask features 635a can include TEOS.

During the first processing sequence 600(A, B), a first etching sequence can be performed after the first trimming procedure is performed. In some embodiments, the first etching sequence can include a first SiARC Etch procedure, a first gate-control layer etching procedure, a first SiN (TEOS) etching procedure, and a first SiN Over-Etch (OE) procedure. For example, the SiARC etching time, the SiARC endpoint time, the gate-control layer etching time, the gate-control layer endpoint time, the first SiN (TEOS) etching time, the first SiN (TEOS) endpoint time, and the trimmed photoresist profile parameters can be used as control variables during the first etching sequence. The third hard mask features 646a can be used to create a plurality of etched or cleaned second hard mask features 636b, and the CDs 637b and the thicknesses 638b for the second hard mask features 636b can be established during the first processing sequence 600. The CDs 637b for the second hard mask features 636b can range from approximately 20 nm to approximately 50 nm, and the thicknesses 638b for the second hard mask features 636b can range from approximately 2 nm to approximately 20 nm. For example, the SiARC etch procedure can be used to etch the trimmed SiARC layer 645a, the first gate-control layer etching procedure can be used to etch the gate-control layer 640, and first SiN (TEOS) etching procedure can be used to etch the second hard mask (TEOS) layer 635.

During the first Si-ARC layer etching procedure, the chamber pressure can range from approximately 12 mT to approximately 18 mT; the top power can vary from approximately 450 watts to approximately 550 watts; the lower power can vary from approximately 90 watts to approximately 110 watts; the ESC voltage can be set at approximately 2500 V; the Tetrafluoromethane ($CF_4$) flow rate can vary between approximately 60 sccm and approximately 100 sccm; the Carbon Hydro-Trifluoride ($CHF_3$) flow rate can vary between approximately 40 sccm and approximately 60 sccm; the top chamber temperature can vary from approximately 70 degrees Celsius to approximately 90 degrees Celsius; the chamber wall temperature can vary from approximately 50 degrees Celsius to approximately 70 degrees Celsius; the bottom chamber temperature can vary from approximately 10 degrees Celsius to approximately 30 degrees Celsius; the temperature at the center of the substrate holder can vary from approximately 12 degrees Celsius to approximately 20 degrees Celsius; the temperature at the edge of the substrate holder can vary from approximately 8 degrees Celsius to approximately 12 degrees Celsius; the center backside pressure for the substrate holder can vary from approximately 15 Torr to approximately 25 Torr; the edge backside pressure for the substrate holder can vary from approximately 27 Torr to approximately 33 Torr; and the processing time can vary from approximately 60 seconds to approximately 90 seconds.

During the first gate-control layer etching procedure, the chamber pressure can range from approximately 15 mT to approximately 25 mT; the top power can vary from approximately 150 watts to approximately 250 watts; the lower power can vary from approximately 90 watts to approximately 110 watts; the ESC voltage can be set at approximately 2500 V; the He flow rate can vary between approximately 150 sccm and approximately 250 sccm; the HBr flow rate can vary between approximately 25 sccm and approximately 35 sccm; the $O_2$ flow rate can vary between approximately 30 sccm and approximately 50 sccm; the $CO_2$ flow rate can vary between approximately 260 sccm and approximately 320 sccm; the top chamber temperature can vary from approximately 70 degrees Celsius to approximately 90 degrees Celsius; the chamber wall temperature can vary from approximately 50 degrees Celsius to approximately 70 degrees Celsius; the bottom chamber temperature can vary from approximately 10 degrees Celsius to approximately 30 degrees Celsius; the temperature at the center of the wafer holder can vary from approximately 12 degrees Celsius to approximately 20 degrees Celsius; the temperature at the edge of the wafer holder can vary from approximately 8 degrees Celsius to approximately 12 degrees Celsius; the center backside pressure for the wafer holder can vary from approximately 15 Torr to approximately 25 Torr; the edge backside pressure for the wafer holder can vary from approximately 27 Torr to approximately 33 Torr; and the processing time can vary from approximately 90 seconds to approximately 130 seconds.

During the first SiN (TEOS) layer etching procedure, the chamber pressure can range from approximately 35 mT to approximately 45 mT; the top power can vary from approximately 550 watts to approximately 650 watts; the lower power can vary from approximately 90 watts to approximately 110 watts; the ESC voltage can be set at approximately 2500 V; the $O_2$ flow rate can vary between approximately 3 sccm and approximately 7 sccm; the $CF_4$ flow rate can vary between approximately 40 sccm and approximately 60 sccm; the $CHF_3$ flow rate can vary between approximately 40 sccm and approximately 60 sccm; the top chamber temperature can vary from approximately 30 degrees Celsius to approximately 90 degrees Celsius; the chamber wall temperature can vary from approximately 50 degrees Celsius to approximately 70 degrees Celsius; the bottom chamber temperature can vary from approximately 30 degrees Celsius to approximately 50 degrees Celsius; the temperature at the center of the wafer holder can vary from approximately 25 degrees Celsius to approximately 35 degrees Celsius; the temperature at the edge of the wafer holder can vary from approximately 8 degrees Celsius to approximately 12 degrees Celsius; the center backside pressure for the wafer holder can vary from approximately 15 Torr to approximately 25 Torr; the edge backside pressure for the wafer holder can vary from approximately 27 Torr to approximately 33 Torr; and the processing time can vary from approximately 50 seconds to approximately 90 seconds.

During the first SiN Over-Etch (OE) procedure, the chamber pressure can range from approximately 35 mT to approximately 45 mT; the top power can vary from approximately 550 watts to approximately 650 watts; the lower power can vary from approximately 125 watts to approximately 175 watts; the ESC voltage can be set at approximately 2500 V; the $O_2$ flow rate can vary between approximately 3 sccm and approximately 7 sccm; the $CF_4$ flow rate can vary between approximately 40 sccm and approximately 60 sccm; the $CHF_3$ flow rate can vary between approximately 40 sccm and approximately 60 sccm; the top chamber temperature can vary from approximately 70 degrees Celsius to approximately 90 degrees Celsius; the chamber wall temperature can vary from approximately 50 degrees Celsius to approximately 70 degrees Celsius; the bottom chamber temperature can vary from approximately 10 degrees Celsius to approximately 30 degrees Celsius; the temperature at the center of the substrate holder can vary from approximately 12 degrees Celsius to approximately 20 degrees Celsius; the temperature at the edge of the substrate holder can vary from approximately 8 degrees Celsius to approximately 12 degrees Celsius; the center backside pressure for the substrate holder can vary from approximately 15 Torr to approximately 25 Torr; the edge backside pressure for the substrate holder can vary from approximately 27 Torr to approximately 33 Torr; and the processing time can vary from approximately 60 seconds to approximately 90 seconds.

The first processing sequence 600B, as illustrated in FIG. 6B, can be modeled using models (660-664), and the models (660-664) can exchange Measured Variable (MV) data using transfer means 675, can exchange Disturbance Variable (DV) data using transfer means 680, and can exchange Controlled Variable (CV) data using transfer means 685. The models (660-664) can receive, process, and/or send MV data, DV data, and CV associated with the procedures performed during the first processing sequence 600(A, B).

The first model 660 can be a first internal-Integrated-Metrology (i-IM) model that can be used in real time by one or more of the internal-Integrated-Metrology-Modules (i-IMMs) 250 to obtain internal-Integrated-Metrology (i-IM) data for the first gate stack 601, and can include one or more real-time iODP models. The internal-Integrated-Metrology-Modules (i-IMMs) 250 can use the first i-IM model 660 to determine real-time profile data, including the CDs 651 and thicknesses 653 for the first masking features 650.

The second internal-Integrated-Metrology (i-IM) model 662 can be used in real time by one or more of the internal-Integrated-Metrology-Modules (i-IMMs) (250, 262a, 262b, 274a and 274b) to obtain internal-Integrated-Metrology (i-IM) data for the second gate stack 602, and can include one or more real-time iODP models. One or more of the i-IMMs (250, 262a, 262b, 274a and 274b) can use one or more of the second i-IM models 662 to determine profile data, including the CDs (widths) 652a and the thicknesses 653a for the partially-etched masking feature 651a and CDs (widths) 647a and thicknesses 6481 for the partially-etched third hard mask features 646a. In addition, the thickness 6482 for the non-etched portion of the third hard mask layer 645a can be determined.

The third internal-Integrated-Metrology (i-IM) model 664 can be used in real time by one or more of the internal-Integrated-Metrology-Modules (i-IMMs) (250, 262a, 262b, 274a and 274b) to obtain internal-Integrated-Metrology (i-IM) data for the third gate stack 603, and can include one or more real-time iODP models. One or more of the i-IMMs (250, 262a, 262b, 274a and 274b) can use one or more or the third i-IM models 664 to determine profile data, including the CDs (widths) 637b and the thicknesses 638b for the second hard mask (TEOS) features 636b in the etched TEOS layer 635b.

Figure 7B:
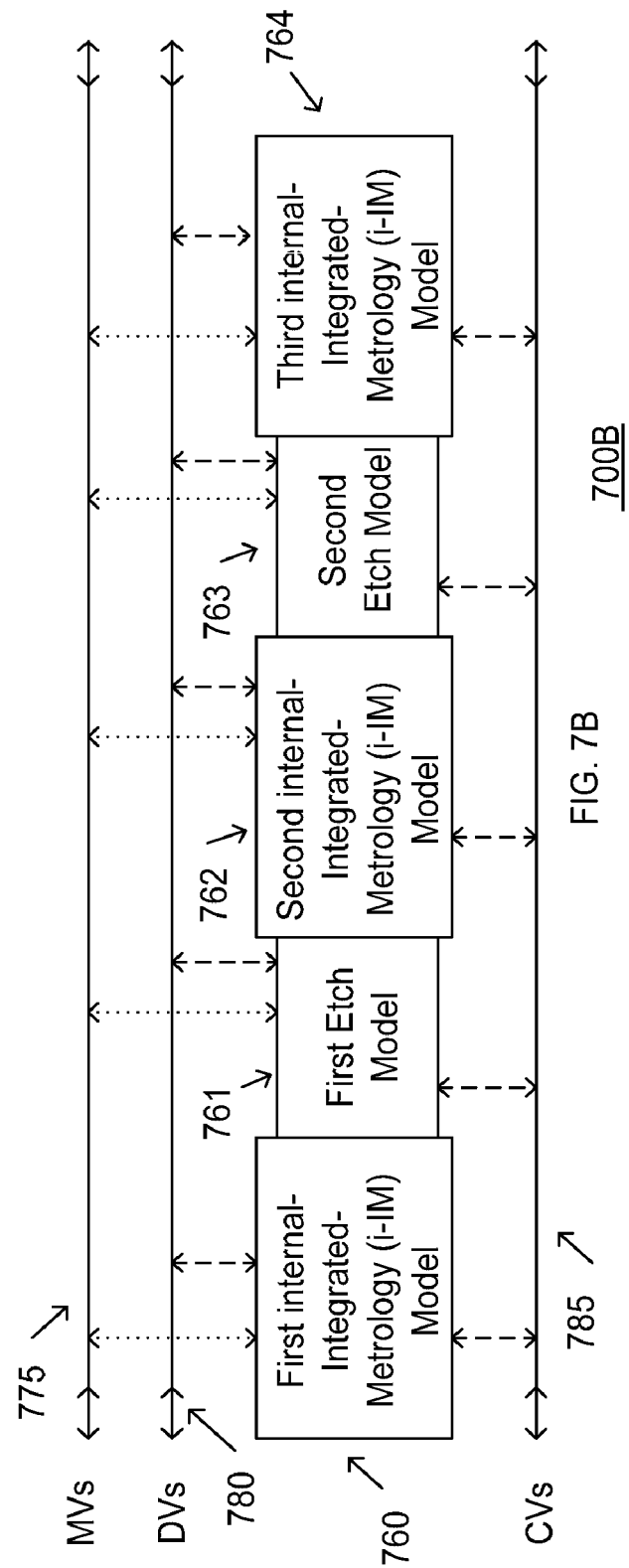

FIGS. 7A and 7B illustrate exemplary views of a second processing sequence for creating metal gate structures in accordance with embodiments of the invention. In the illustrated embodiment, three exemplary gate stacks (701, 702, and 703) and six metal gate stack models (760-764) are shown that can be used to illustrate the second processing sequence 700(A, B). Alternatively, a different number of gates stacks, a different number of models, and different configurations may be used.

In some embodiments, the first gate stack 701 can be an exemplary view of the first developed wafers (430, FIG. 4C) or the second developed wafers (530, FIG. 5C); the third gate stack 703 can be an exemplary view of the first etched wafers (440, FIG. 4D) or the second etched wafers (540, FIG. 5D), and the second gate stack 702 can be an exemplary view of an intermediate etching step where the CDs 747a are established. Alternatively the third gate stack 703 can be an exemplary view of the first cleaned wafers (450, FIG. 4E) or the second cleaned wafers (550, FIG. 5E).

The first gate stack 701 can include a substrate layer 710, an interface layer 715, a metal gate layer 720, a first hard mask layer 725, a silicon-containing layer 730, a second hard mask layer 735, a gate-control layer 740, a third hard mask layer 745, and a plurality of masking features 750. For example, the substrate layer 710 can include a semiconductor material; the interface layer 715 can include controlled-etch-rate material; the metal gate layer 720 can include $HfO_2$; the first hard mask layer 725 can include TiN; the silicon-containing layer 730 can include amorphous silicon (a-Si); the second hard mask layer 735 can include Tetraethyl Orthosilicate, (TEOS) [Si$(OC_2H_5)_4$]; the gate-control layer 740 can include a gate-control material; the third hard mask layer 745 can include silicon-containing anti-reflective coating (SiARC) material; and the masking features 750 can include ArF photoresist material.

The substrate layer 710 can have a thickness 713 that can vary from approximately 25 nm and to approximately 60 nm; the interface layer 715 can have a thickness 718 that can vary from approximately 2 nm and to approximately 10 nm; the metal gate layer 720 can have a thickness 723 that can vary from approximately 5 nm and to approximately 20 nm; the first hard mask layer 725 can have a thickness 728 that can vary from approximately 15 nm and to approximately 40 nm; the silicon-containing layer 730 can have a thickness 733 that can vary from approximately 25 nm and to approximately 60 nm; the second hard mask layer 735 can have a thickness 738 that can vary from approximately 5 nm and to approximately 20 nm; the gate-control layer 740 can have a thickness 733 that can vary from approximately 50 nm and to approximately 300 nm; the third hard mask layer 745 can have a thickness 748 that can vary from approximately 15 nm and to approximately 60 nm; and the masking features 750 can have a thickness 753 that can vary from approximately 50 nm and to approximately 400 nm. In addition, the masking features 750 can have a CD (width) 751 that can vary from approximately 50 nm and to approximately 100 nm.

During the second processing sequence 700(A, B), a SiARC etch procedure and a gate-control layer trim/etch procedure can be performed to establish a plurality of trim/etch features 741a in the trim/etch gate-control layer 740a, and a plurality of partially-removed hard mask features 746a in the etched third hard mask layer 745. For example, the SiARC etch time, the SiARC etch endpoint time, the gate-control layer trim/etch time, the gate-control layer trim/etch endpoint time, the process gas flow rates, and the gate-control layer profile parameters can be used as control variables during the SiARC etch procedure and/or the gate-control layer trim/etch procedure. The pattern of masking features 750 can be used to create the plurality of trim/etch features 741a in the trim/etch gate-control layer 740a. In addition, the CDs (widths) 742a and thicknesses 743a for the plurality of trim/etch features 741a in the trim/etch gate-control layer 740a can be established during the gate-control layer trim/etch procedure. The CDs (widths) 742a for the trim/etch features 741a can range from approximately 20 nm to approximately 50 nm. The first etch model 761 can be a Multi-Layer-Multi-Input-Multi-Output (MLMIMO) model for predicting the process results from the first gate-control layer trim/etch procedure.

During the first Si-ARC layer etching procedure, the chamber pressure can range from approximately 12 mT to approximately 18 mT; the top power can vary from approximately 450 watts to approximately 550 watts; the lower power can vary from approximately 90 watts to approximately 110 watts; the ESC voltage can be set at approximately 2500 V; the Tetrafluoromethane ($CF_4$) flow rate can vary between approximately 60 sccm and approximately 100 sccm; the Carbon Hydro-Trifluoride ($CHF_3$) flow rate can vary between approximately 40 sccm and approximately 60 sccm; the top chamber temperature can vary from approximately 70 degrees Celsius to approximately 90 degrees Celsius; the chamber wall temperature can vary from approximately 50 degrees Celsius to approximately 70 degrees Celsius; the bottom chamber temperature can vary from approximately 10 degrees Celsius to approximately 30 degrees Celsius; the temperature at the center of the substrate holder can vary from approximately 12 degrees Celsius to approximately 20 degrees Celsius; the temperature at the edge of the substrate holder can vary from approximately 8 degrees Celsius to approximately 12 degrees Celsius; the center backside pressure for the substrate holder can vary from approximately 15 Torr to approximately 25 Torr; the edge backside pressure for the substrate holder can vary from approximately 27 Torr to approximately 33 Torr; and the processing time can vary from approximately 60 seconds to approximately 90 seconds.

During the first gate-control layer trim/etch procedure, the chamber pressure can range from approximately 15 mT to approximately 25 mT; the top power can vary from approximately 150 watts to approximately 250 watts; the lower power can vary from approximately 90 watts to approximately 110 watts; the ESC voltage can be set at approximately 2500 V; the He flow rate can vary between approximately 150 sccm and approximately 250 sccm; the HBr flow rate can vary between approximately 25 sccm and approximately 35 sccm; the $O_2$ flow rate can vary between approximately 30 sccm and approximately 50 sccm; the $CO_2$ flow rate can vary between approximately 260 sccm and approximately 320 sccm; the top chamber temperature can vary from approximately 70 degrees Celsius to approximately 90 degrees Celsius; the chamber wall temperature can vary from approximately 50 degrees Celsius to approximately 70 degrees Celsius; the bottom chamber temperature can vary from approximately 10 degrees Celsius to approximately 30 degrees Celsius; the temperature at the center of the wafer holder can vary from approximately 12 degrees Celsius to approximately 20 degrees Celsius; the temperature at the edge of the wafer holder can vary from approximately 8 degrees Celsius to approximately 12 degrees Celsius; the center backside pressure for the wafer holder can vary from approximately 15 Torr to approximately 25 Torr; the edge backside pressure for the wafer holder can vary from approximately 27 Torr to approximately 33 Torr; and the processing time can vary from approximately 90 seconds to approximately 130 seconds.

The second gate stack 702 can include a substrate layer 710, an interface layer 715, a metal gate layer 720, a first hard mask layer 725, a silicon-containing layer 730, a second hard mask layer 735, one or more trim/etch features 741a in a trim/etch gate-control layer 740a, and one or more partially-removed third hard mask features 746a. For example, the partially-etched third hard mask features 746a can have a thickness (748a) that can vary from approximately 5 nm and to approximately 15 nm and the trim/etch features 741a can have a thickness (743a) that can vary from approximately 50 nm and to approximately 300 nm. In addition, the partially-removed third hard mask features 746a can have a CD (width) 747a that can vary from approximately 15 nm and to approximately 60 nm; and the trim/etch features 741a can have a CD (width) 742a that can vary from approximately 15 nm and to approximately 60 nm. Alternatively, the second gate stacks 702 may be configured differently and the dimensions may be different.

The third gate stack 703 can include a substrate layer 710, an interface layer 715, a metal gate layer 720, a first hard mask layer 725, a silicon-containing layer 730, and a plurality of etched or cleaned second hard mask features 735b. For example, the substrate layer 710 can include a semiconductor material; the interface layer 715 can include controlled-etch-rate material; the metal gate layer 720 can include $HfO_2$; the first hard mask layer 725 can include TiN; the silicon-containing layer 730 include amorphous silicon (a-Si); and the second hard mask features 735a can include TEOS.

During the second processing sequence 700(A, B), a second etching sequence can be performed after the first trim/etch procedure is performed. In some embodiments, the second etching sequence can include a SiN (TEOS) etch procedure and a SiN (TEOS) Over-Etch procedure. For example, the SiN (TEOS) etch time, the SiN (TEOS) etch endpoint time, the SiN (TEOS) Over-Etch time, the SiN (TEOS) Over-Etch endpoint time, the process gas flow rates, and the trimmed gate-control layer profile parameters can be used as control variables during the SiN (TEOS) etch procedure and/or the SiN (TEOS) Over-Etch procedure. The trim/etch features 741a can be used to create a plurality of etched or cleaned second hard mask features 736b in the etched second hard mask layer 735b. In addition, the CDs 737b and the thicknesses 738b for the second hard mask features 736b can be established during the second etching sequence. The CDs 737b for the second hard mask features 736b can range from approximately 20 nm to approximately 50 nm, and the thicknesses 738b for the second hard mask features 736b can range from approximately 2 nm to approximately 20 nm. For example, the SiARC etch procedure can be used to etch the trim/etch SiARC layer 745a, the second trim/etch procedure can be used to etch the trim/etch gate-control layer 740a, and the TEOS etching procedure can be used to etch the second hard mask (TEOS) layer 735.

When the SiN (TEOS) etch procedure is performed during the second processing sequence 700(A, B), the chamber pressure can range from approximately 30 mT to approximately 50 mT; the top power can vary from approximately 550 watts to approximately 650 watts; the lower power can vary from approximately 90 watts to approximately 110 watts; the ESC voltage can be set at approximately 2500 V; the $O_2$ flow rate can vary between approximately 3 sccm and approximately 9 sccm; the Tetrafluoromethane ($CF_4$) flow rate can vary between approximately 40 sccm and approximately 60 sccm; the Carbon Hydro-Trifluoride ($CHF_3$) flow rate can vary between approximately 40 sccm and approximately 60 sccm; the top chamber temperature can vary from approximately 70 degrees Celsius to approximately 90 degrees Celsius; the chamber wall temperature can vary from approximately 50 degrees Celsius to approximately 70 degrees Celsius; the bottom chamber temperature can vary from approximately 10 degrees Celsius to approximately 30 degrees Celsius; the temperature at the center of the substrate holder can vary from approximately 12 degrees Celsius to approximately 20 degrees Celsius; the temperature at the edge of the substrate holder can vary from approximately 8 degrees Celsius to approximately 12 degrees Celsius; the center backside pressure for the substrate holder can vary from approximately 15 Torr to approximately 25 Torr; the edge backside pressure for the substrate holder can vary from approximately 27 Torr to approximately 33 Torr; and the processing time can vary from approximately 60 seconds to approximately 90 seconds.

When the SiN (TEOS) Over-Etching procedure is performed during the second processing sequence 700(A, B), the chamber pressure can range from approximately 35 mT to approximately 45 mT; the top power can vary from approximately 550 watts to approximately 650 watts; the lower power can vary from approximately 125 watts to approximately 175 watts; the ESC voltage can be set at approximately 2500 V; the $O_2$ flow rate can vary between approximately 3 sccm and approximately 9 sccm; the $CF_4$ flow rate can vary between approximately 40 sccm and approximately 60 sccm; the $CHF_3$ flow rate can vary between approximately 40 sccm and approximately 60 sccm; the top chamber temperature can vary from approximately 30 degrees Celsius to approximately 90 degrees Celsius; the chamber wall temperature can vary from approximately 50 degrees Celsius to approximately 70 degrees Celsius; the bottom chamber temperature can vary from approximately 30 degrees Celsius to approximately 50 degrees Celsius; the temperature at the center of the wafer holder can vary from approximately 25 degrees Celsius to approximately 35 degrees Celsius; the temperature at the edge of the wafer holder can vary from approximately 8 degrees Celsius to approximately 12 degrees Celsius; the center backside pressure for the wafer holder can vary from approximately 15 Torr to approximately 25 Torr; the edge backside pressure for the wafer holder can vary from approximately 27 Torr to approximately 33 Torr; and the processing time can vary from approximately 50 seconds to approximately 90 seconds.

The second processing sequence 700(A, B), illustrated in FIGS. 7A and 7B, can be modeled using models (760-764), and the models (760-764) can exchange Measured Variable (MV) data using transfer means 775, can exchange Disturbance Variable (DV) data using transfer means 780, and can exchange Controlled Variable (CV) data using transfer means 785. The models (760-764) can receive, process, and/or send MV data, DV data, and CV associated with the procedures performed during the second processing sequence 700(A, B).

The first model 760 can be a first internal-Integrated-Metrology (i-IM) model that can be used in real time by one or more of the internal-Integrated-Metrology-Modules (i-IMMs) 250 to obtain internal-Integrated-Metrology (i-IM) data for the first gate stack 701, and can include one or more real-time iODP models. The internal-Integrated-Metrology-Modules (i-IMMs) 250 can use the first i-IM model 760 to determine real-time profile data, including the CDs 751 and thicknesses 753 for the first masking features 750.

The second internal-Integrated-Metrology (i-IM) model 762 can be used in real time by one or more of the internal-Integrated-Metrology-Modules (i-IMMs) (250, 262a, 262b, 274a and 274b) to obtain internal-Integrated-Metrology (i-IM) data for the second gate stack 702, and can include one or more real-time iODP models. One or more of the i-IMMs (250, 262a, 262b, 274a and 274b) can use one or more of the second i-IM models 762 to determine profile data, including the CDs (widths) 747a and the thicknesses 748a for the partially-removed third hard mask features 746a and CDs (widths) 742a and thicknesses 743a for the trim/etch features 741a. In addition, the thickness 738 for the second hard mask layer 735 can be determined.

The third internal-Integrated-Metrology (i-IM) model 764 can be used in real time by one or more of the internal-Integrated-Metrology-Modules (i-IMMs) (250, 262a, 262b, 274a and 274b) to obtain internal-Integrated-Metrology (i-IM) data for the third gate stack 703, and can include one or more real-time iODP models. One or more of the i-IMMs (250, 262a, 262b, 274a and 274b) can use one or more or the third i-IM models 764 to determine profile data, including the CDs (widths) 737b and the thicknesses 738b for the second hard mask (TEOS) features 736b in the etched TEOS layer 735b.

Figure 8B:
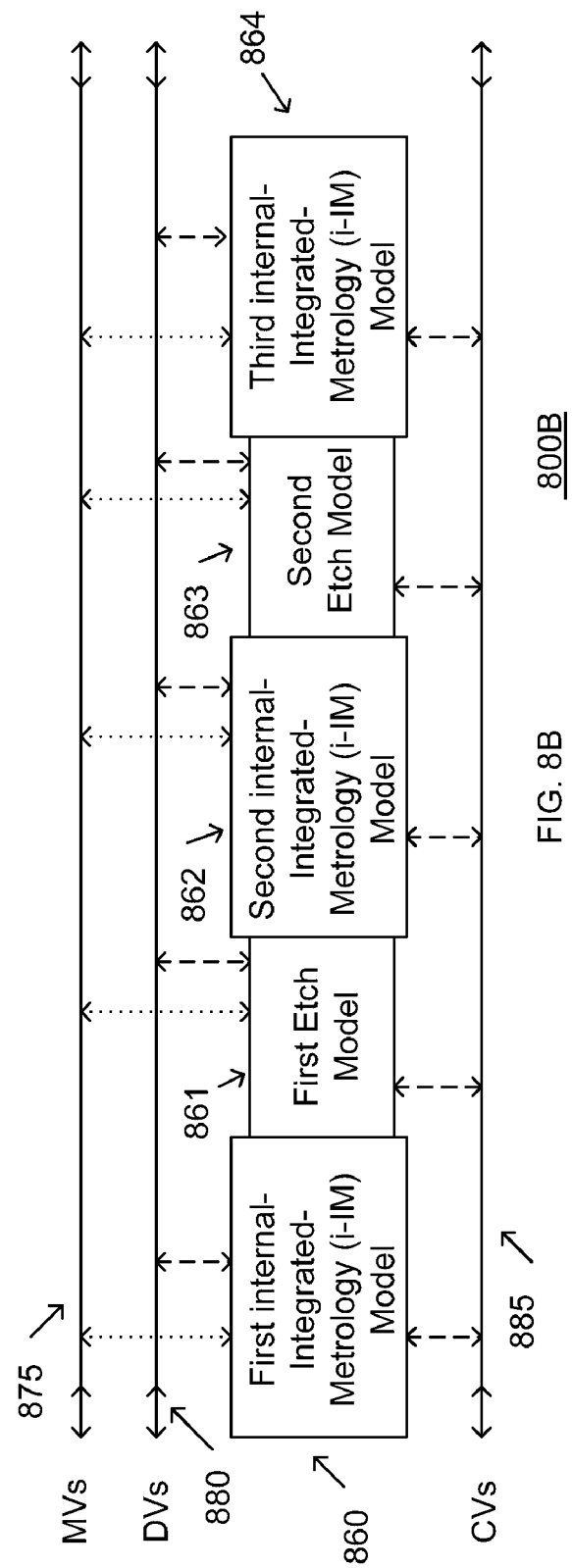

FIGS. 8A and 8B illustrate exemplary views of a third processing sequence for creating metal gate structures in accordance with embodiments of the invention. In the illustrated embodiment, three exemplary gate stacks (801, 802, and 803) and six metal gate stack models (860-864) are shown that can be used to illustrate the third processing sequence 800(A, B). Alternatively, a different number of gates stacks, a different number of models, and different configurations may be used.

In some embodiments, the first gate stack 801 can be an exemplary view of the first developed wafers (430, FIG. 4C) or the second developed wafers (530, FIG. 5C); the third gate stack 803 can be an exemplary view of the first etched wafers (440, FIG. 4D) or the second etched wafers (540, FIG. 5D), and the second gate stack 802 can be an exemplary view of an intermediate etching step where the CDs 847a are established. Alternatively the third gate stack 803 can be an exemplary view of the first cleaned wafers (450, FIG. 4E) or the second cleaned wafers (550, FIG. 5E).

The first gate stack 801 can include a substrate layer 810, an interface layer 815, a metal gate layer 820, a first hard mask layer 825, a silicon-containing layer 830, a second hard mask layer 835, a gate-control layer 840, a third hard mask layer 845, and a plurality of masking features 850. For example, the substrate layer 810 can include a semiconductor material; the interface layer 815 can include controlled-etch-rate material; the metal gate layer 820 can include $HfO_2$; the first hard mask layer 825 can include TiN; the silicon-containing layer 830 can include amorphous silicon (a-Si); the second hard mask layer 835 can include Tetraethyl Orthosilicate, (TEOS) [Si$(OC_2H_5)_4$]; the gate-control layer 840 can include a gate-control material; the third hard mask layer 845 can include silicon-containing anti-reflective coating (SiARC) material; and the masking features 850 can include ArF photoresist material.

The substrate layer 810 can have a thickness 813 that can vary from approximately 25 nm and to approximately 60 nm; the interface layer 815 can have a thickness 818 that can vary from approximately 2 nm and to approximately 10 nm; the metal gate layer 820 can have a thickness 823 that can vary from approximately 5 nm and to approximately 20 nm; the first hard mask layer 825 can have a thickness 828 that can vary from approximately 15 nm and to approximately 40 nm; the silicon-containing layer 830 can have a thickness 833 that can vary from approximately 25 nm and to approximately 60 nm; the second hard mask layer 835 can have a thickness 838 that can vary from approximately 5 nm and to approximately 20 nm; the gate-control layer 840 can have a thickness 833 that can vary from approximately 50 nm and to approximately 300 nm; the third hard mask layer 845 can have a thickness 848 that can vary from approximately 15 nm and to approximately 60 nm; and the masking features 850 can have a thickness 853 that can vary from approximately 50 nm and to approximately 400 nm. In addition, the masking features 850 can have a CD (width) 851 that can vary from approximately 50 nm and to approximately 100 nm.

During the third processing sequence 800(A, B), a SiARC etching procedure, a gate-control layer etching procedure, and a gate-control layer trimming procedure can be performed to establish a plurality of trimmed gate-control features 841a in the trimmed gate-control layer 840a, and a plurality of partially-removed features 846a in the etched third hard mask layer 845a. For example, the SiARC etch time, the SiARC etch endpoint time, the gate-control layer etch time, the gate-control layer etch endpoint time, the gate-control layer trim time, the gate-control layer trim endpoint time, the process gas flow rates, and the trimmed gate-control layer profile parameters can be used as control variables during the SiARC etch procedure, the gate-control layer etch procedure, and/or the gate-control layer trim procedure. The pattern of masking features 850 can be used to create the plurality of trimmed gate-control features 841a in the trimmed gate-control layer 840a. In addition, the CDs (widths) 842a for the plurality of trimmed gate-control features 841a in the trimmed gate-control layer 840a can be established during the gate-control layer trimming procedure. The CDs (widths) 842a for trimmed gate-control features 841a can range from approximately 20 nm to approximately 50 nm. The first etch/trim model 861 can be a Multi-Layer-Multi-Input-Multi-Output (MLMIMO) model for predicting the process results from the SiARC etching procedure, the gate-control layer etching procedure, and the gate-control layer trimming procedure.

When the SiARC etch procedure is performed during the third processing sequence 800(A, B), the chamber pressure can range from approximately 12 mT to approximately 18 mT; the top power can vary from approximately 450 watts to approximately 550 watts; the lower power can vary from approximately 90 watts to approximately 110 watts; the ESC voltage can be set at approximately 2500 V; the Tetrafluoromethane ($CF_4$) flow rate can vary between approximately 60 sccm and approximately 100 sccm; the Carbon Hydro-Trifluoride ($CHF_3$) flow rate can vary between approximately 40 sccm and approximately 60 sccm; the top chamber temperature can vary from approximately 70 degrees Celsius to approximately 90 degrees Celsius; the chamber wall temperature can vary from approximately 50 degrees Celsius to approximately 70 degrees Celsius; the bottom chamber temperature can vary from approximately 10 degrees Celsius to approximately 30 degrees Celsius; the temperature at the center of the substrate holder can vary from approximately 12 degrees Celsius to approximately 20 degrees Celsius; the temperature at the edge of the substrate holder can vary from approximately 8 degrees Celsius to approximately 12 degrees Celsius; the center backside pressure for the substrate holder can vary from approximately 15 Torr to approximately 25 Torr; the edge backside pressure for the substrate holder can vary from approximately 27 Torr to approximately 33 Torr; and the processing time can vary from approximately 60 seconds to approximately 90 seconds.

When the gate-control layer etching procedure is performed during the third processing sequence 800(A, B), the chamber pressure can range from approximately 15 mT to approximately 25 mT; the top power can vary from approximately 150 watts to approximately 250 watts; the lower power can vary from approximately 90 watts to approximately 110 watts; the ESC voltage can be set at approximately 2500 V; the He flow rate can vary between approximately 150 sccm and approximately 250 sccm; the $CO_2$ flow rate can vary between approximately 70 sccm and approximately 90 sccm; the HBr flow rate can vary between approximately 25 sccm and approximately 35 sccm; the $O_2$ flow rate can vary between approximately 30 sccm and approximately 50 sccm; the $CO_2$ flow rate can vary between approximately 250 sccm and approximately 310 sccm; the top chamber temperature can vary from approximately 70 degrees Celsius to approximately 90 degrees Celsius; the chamber wall temperature can vary from approximately 50 degrees Celsius to approximately 70 degrees Celsius; the bottom chamber temperature can vary from approximately 10 degrees Celsius to approximately 30 degrees Celsius; the temperature at the center of the wafer holder can vary from approximately 12 degrees Celsius to approximately 20 degrees Celsius; the temperature at the edge of the wafer holder can vary from approximately 8 degrees Celsius to approximately 12 degrees Celsius; the center backside pressure for the wafer holder can vary from approximately 15 Torr to approximately 25 Torr; the edge backside pressure for the wafer holder can vary from approximately 27 Torr to approximately 33 Torr; and the processing time can vary from approximately 90 seconds to approximately 130 seconds.

When the gate-control layer trimming procedure is performed during the third processing sequence 800(A, B), the chamber pressure can range from approximately 15 mT to approximately 25 mT; the top power can vary from approximately 150 watts to approximately 250 watts; the lower power can vary from approximately 90 watts to approximately 110 watts; the ESC voltage can be set at approximately 2500 V; the He flow rate can vary between approximately 150 sccm and approximately 250 sccm; the $CO_2$ flow rate can vary between approximately 70 sccm and approximately 90 sccm; the HBr flow rate can vary between approximately 25 sccm and approximately 35 sccm; the $O_2$ flow rate can vary between approximately 30 sccm and approximately 50 sccm; the $CO_2$ flow rate can vary between approximately 250 sccm and approximately 310 sccm; the top chamber temperature can vary from approximately 70 degrees Celsius to approximately 90 degrees Celsius; the chamber wall temperature can vary from approximately 50 degrees Celsius to approximately 70 degrees Celsius; the bottom chamber temperature can vary from approximately 10 degrees Celsius to approximately 30 degrees Celsius; the temperature at the center of the wafer holder can vary from approximately 12 degrees Celsius to approximately 20 degrees Celsius; the temperature at the edge of the wafer holder can vary from approximately 8 degrees Celsius to approximately 12 degrees Celsius; the center backside pressure for the wafer holder can vary from approximately 15 Torr to approximately 25 Torr; the edge backside pressure for the wafer holder can vary from approximately 27 Torr to approximately 33 Torr; and the processing time can vary from approximately 90 seconds to approximately 130 seconds.

The second gate stack 802 can include a substrate layer 810, an interface layer 815, a metal gate layer 820, a first hard mask layer 825, a silicon-containing layer 830, a second hard mask layer 835, one or more trimmed gate-control features 841a in a trimmed gate-control layer 840a, and one or more partially-removed third hard mask features 846a. For example, the partially-etched third hard mask features 846a can have a thickness 848a that can vary from approximately 5 nm and to approximately 15 nm and the trimmed gate-control features 841a can have a thickness 843a that can vary from approximately 50 nm and to approximately 300 nm. In addition, the partially-removed third hard mask features 846a can have a CD (width) 847a that can vary from approximately 15 nm and to approximately 60 nm; and the trimmed gate-control features 841a can have a CD (width) 842a that can vary from approximately 15 nm and to approximately 60 nm. Alternatively, the second gate stacks 802 may be configured differently and the dimensions may be different.

The third gate stack 803 can include a substrate layer 810, an interface layer 815, a metal gate layer 820, a first hard mask layer 825, a silicon-containing layer 830, and a plurality of etched or cleaned second hard mask features 835b. For example, the substrate layer 810 can include a semiconductor material; the interface layer 815 can include controlled-etch-rate material; the metal gate layer 820 can include $HfO_2$; the first hard mask layer 825 can include TiN; the silicon-containing layer 830 include amorphous silicon (a-Si); and the second hard mask features 835a can include TEOS.

After the trimmed gate-control features 841a are created, a SiN (TEOS) etching procedure and/or a SiN (TEOS) Over-Etching (OE) procedure can be performed. The trimmed gate-control features 841a can be used to create a plurality of etched or cleaned second hard mask (TEOS) features 836b. For example, the SiN (TEOS) etch time, the SiN (TEOS) etch endpoint time, the SiN (TEOS) Over-Etch time, the SiN (TEOS) Over-Etch endpoint time, the process gas flow rates, and the trimmed gate-control layer profile parameters (e.g., gate-control layer undercutting and photoresist bending) can be used as control variables during the SiN (TEOS) etch procedure and/or the SiN (TEOS) Over-Etch procedure. In addition, the CDs (widths) 837b and the thicknesses 838b for the second hard mask (TEOS) features 836b can be established during the TEOS etching procedure. The CDs 837b for the second hard mask features 836b can range from approximately 20 nm to approximately 50 nm and the thicknesses 838b for the second hard mask features 636b can range from approximately 2 nm to approximately 20 nm. For example, the TEOS etching procedure can include an etch procedure to etch the second hard mask (TEOS) layer 835.

When the SiN (TEOS) layer etching procedure is performed during the third processing sequence 800(A, B), the chamber pressure can range from approximately 35 mT to approximately 45 mT; the top power can vary from approximately 550 watts to approximately 650 watts; the lower power can vary from approximately 90 watts to approximately 110 watts; the ESC voltage can be set at approximately 2500 V; the $CF_4$ flow rate can vary between approximately 40 sccm and approximately 60 sccm; the $CHF_3$ flow rate can vary between approximately 40 sccm and approximately 60 sccm; the $O_2$ flow rate can vary between approximately 3 sccm and approximately 7 sccm; the top chamber temperature can vary from approximately 30 degrees Celsius to approximately 90 degrees Celsius; the chamber wall temperature can vary from approximately 50 degrees Celsius to approximately 70 degrees Celsius; the bottom chamber temperature can vary from approximately 30 degrees Celsius to approximately 50 degrees Celsius; the temperature at the center of the wafer holder can vary from approximately 25 degrees Celsius to approximately 35 degrees Celsius; the temperature at the edge of the wafer holder can vary from approximately 8 degrees Celsius to approximately 12 degrees Celsius; the center backside pressure for the wafer holder can vary from approximately 15 Torr to approximately 25 Torr; the edge backside pressure for the wafer holder can vary from approximately 27 Torr to approximately 33 Torr; and the processing time can vary from approximately 50 seconds to approximately 90 seconds.

When the SiN (TEOS) Over-Etch (OE) procedure is performed during the third processing sequence 800(A, B), the chamber pressure can range from approximately 35 mT to approximately 45 mT; the top power can vary from approximately 550 watts to approximately 650 watts; the lower power can vary from approximately 125 watts to approximately 175 watts; the ESC voltage can be set at approximately 2500 V; the $CF_4$ flow rate can vary between approximately 40 sccm and approximately 60 sccm; the $CHF_3$ flow rate can vary between approximately 40 sccm and approximately 60 sccm; the $O_2$ flow rate can vary between approximately 3 sccm and approximately 7 sccm; the top chamber temperature can vary from approximately 30 degrees Celsius to approximately 90 degrees Celsius; the chamber wall temperature can vary from approximately 50 degrees Celsius to approximately 70 degrees Celsius; the bottom chamber temperature can vary from approximately 30 degrees Celsius to approximately 50 degrees Celsius; the temperature at the center of the wafer holder can vary from approximately 25 degrees Celsius to approximately 35 degrees Celsius; the temperature at the edge of the wafer holder can vary from approximately 8 degrees Celsius to approximately 12 degrees Celsius; the center backside pressure for the wafer holder can vary from approximately 15 Torr to approximately 25 Torr; the edge backside pressure for the wafer holder can vary from approximately 27 Torr to approximately 33 Torr; and the processing time can vary from approximately 50 seconds to approximately 90 seconds.

The third processing sequence 800(A, B), illustrated in FIGS. 8A and 8B, can be modeled using models (860-864), and the models (860-864) can exchange Measured Variable (MV) data using transfer means 875, can exchange Disturbance Variable (DV) data using transfer means 880, and can exchange Controlled Variable (CV) data using transfer means 885. The models (860-864) can receive, process, and/or send MV data, DV data, and CV associated with the procedures performed during the third processing sequence 800(A, B).

The first model 860 can be a first internal-Integrated-Metrology (i-IM) model that can be used in real time by one or more of the internal-Integrated-Metrology-Modules (i-IMMs) 250 to obtain internal-Integrated-Metrology (i-IM)

data for the first gate stack 801, and can include one or more real-time iODP models. The internal-Integrated-Metrology-Modules (i-IMMs) 250 can use the first i-IM model 860 to determine real-time profile data, including the CDs 851 and thicknesses 853 for the masking features 850.

The second internal-Integrated-Metrology (i-IM) model 862 can be used in real time by one or more of the internal-Integrated-Metrology-Modules (i-IMMs) (250, 262*a*, 262*b*, 274*a* and 274*b*) to obtain internal-Integrated-Metrology (i-IM) data for the second gate stack 802, and can include one or more real-time iODP models. One or more of the i-IMMs (250, 262*a*, 262*b*, 274*a* and 274*b*) can use one or more of the second i-IM models 862 to determine profile data, including the CDs (widths) 847*a* and the thicknesses 848*a* for the partially-removed hard mask features 846*a* and CDs (widths) 842*a* and thicknesses 843*a* for the trimmed gate-control features 841*a*. In addition, the thickness 838 for the second hard mask layer 835 can be determined.

The third internal-Integrated-Metrology (i-IM) model 764 can be used in real time by one or more of the internal-Integrated-Metrology-Modules (i-IMMs) (250, 262*a*, 262*b*, 274*a* and 274*b*) to obtain internal-Integrated-Metrology (i-IM) data for the third gate stack 803, and can include one or more real-time iODP models. One or more of the i-IMMs (250, 262*a*, 262*b*, 274*a* and 274*b*) can use one or more or the third i-IM models 864 to determine profile data, including the CDs (widths) 837*b* and the thicknesses 838*b* for the second hard mask (TEOS) features 836*b* in the etched TEOS layer 835*b*.

Figure 9B:
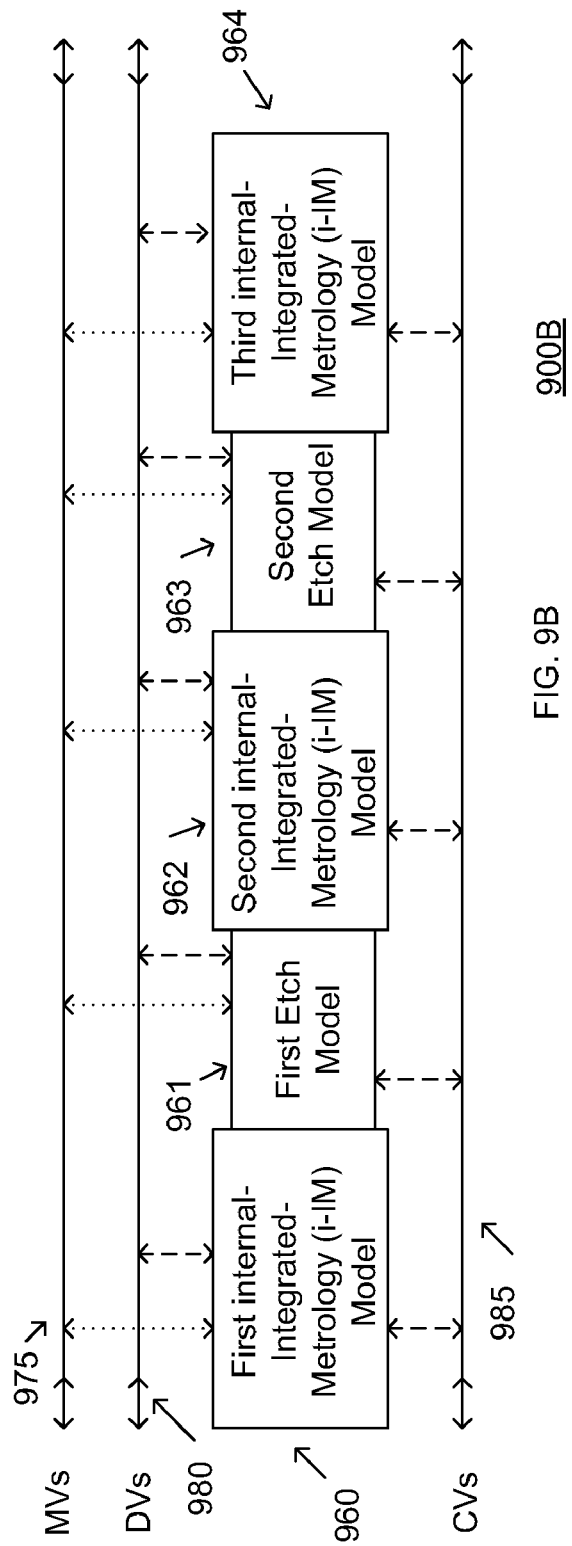

FIGS. 9A and 9B illustrate exemplary views of a fourth processing sequence for creating metal gate structures in accordance with embodiments of the invention. In the illustrated embodiment, three exemplary gate stacks (901, 902, and 903) and six metal gate stack models (960-964) are shown that can be used to illustrate the fourth processing sequence 900(A, B). Alternatively, a different number of gates stacks, a different number of models, and different configurations may be used.

In some embodiments, the first gate stack 901 can be an exemplary view of the first developed wafers (430, FIG. 4C) or the second developed wafers (530, FIG. 5C); the third gate stack 903 can be an exemplary view of the first etched wafers (440, FIG. 4D) or the second etched wafers (540, FIG. 5D), and the second gate stack 902 can be an exemplary view of an intermediate etching step where the CDs 941*a* are established. Alternatively the third gate stack 903 can be an exemplary view of the first cleaned wafers (450, FIG. 4E) or the second cleaned wafers (550, FIG. 5E).

The first gate stack 901 can include a substrate layer 910, an interface layer 915, a metal gate layer 920, a first hard mask layer 925, a silicon-containing layer 930, a second hard mask layer 935, a gate-control layer 940, a third hard mask layer 945, and a plurality of masking features 950. For example, the substrate layer 910 can include a semiconductor material; the interface layer 915 can include controlled-etch-rate material; the metal gate layer 920 can include $HfO_2$; the first hard mask layer 925 can include TiN; the silicon-containing layer 930 can include amorphous silicon (a-Si); the second hard mask layer 935 can include Tetraethyl Orthosilicate, (TEOS) [Si $(OC_2H_5)_4$]; the gate-control layer 940 can include a gate-control material; the third hard mask layer 945 can include silicon-containing anti-reflective coating (SiARC) material; and the masking features 950 can include ArF photoresist material.

The substrate layer 910 can have a thickness 913 that can vary from approximately 25 nm and to approximately 60 nm; the interface layer 915 can have a thickness 918 that can vary from approximately 2 nm and to approximately 10 nm; the metal gate layer 920 can have a thickness 923 that can vary from approximately 5 nm and to approximately 20 nm; the first hard mask layer 925 can have a thickness 928 that can vary from approximately 15 nm and to approximately 40 nm; the silicon-containing layer 930 can have a thickness 933 that can vary from approximately 25 nm and to approximately 60 nm; the second hard mask layer 935 can have a thickness 938 that can vary from approximately 5 nm and to approximately 20 nm; the gate-control layer 940 can have a thickness 933 that can vary from approximately 50 nm and to approximately 300 nm; the third hard mask layer 945 can have a thickness 948 that can vary from approximately 15 nm and to approximately 60 nm; and the masking features 950 can have a thickness 953 that can vary from approximately 50 nm and to approximately 400 nm. In addition, the masking features 950 can have a CD (width) 951 that can vary from approximately 50 nm and to approximately 100 nm.

During the fourth processing sequence 900(A, B), a SiARC etching procedure, and a first gate-control layer etching procedure can be performed to establish a plurality of etched gate-control features 941*a* in the etched gate-control layer 940*a*, and a plurality of partially-removed features 946*a* in the etched third hard mask layer 945*a*. For example, the SiARC etch time, the SiARC etch endpoint time, the first gate-control layer etch time, the first gate-control layer etch endpoint time, the process gas flow rates, and the trimmed gate-control layer profile parameters can be used as control variables during the SiARC etch procedure and the first gate-control layer etch procedure. The pattern of masking features 950 can be used to create the plurality of etched gate-control features 941*a* in the upper (etched) portion of the gate-control layer (9401). In addition, the CDs (widths) 942*a* and the thicknesses 9431 for the plurality of etched gate-control features 941*a* in the upper (etched) portion of the gate-control layer (9401) can be established during the first gate-control layer etching procedure. The CDs (widths) 942*a* for etched gate-control features 941*a* can range from approximately 40 nm to approximately 100 nm. The first etch model 961 can be a Multi-Layer-Multi-Input-Multi-Output (MLMIMO) model for predicting the process results from the SiARC etching procedure, and the gate-control layer etching procedure.

When the SiARC etch procedure is performed during the fourth processing sequence 900(A, B), the chamber pressure can range from approximately 12 mT to approximately 18 mT; the top power can vary from approximately 450 watts to approximately 550 watts; the lower power can vary from approximately 90 watts to approximately 110 watts; the ESC voltage can be set at approximately 2500 V; the Tetrafluoromethane ($CF_4$) flow rate can vary between approximately 60 sccm and approximately 100 sccm; the Carbon Hydro-Trifluoride ($CHF_3$) flow rate can vary between approximately 40 sccm and approximately 60 sccm; the top chamber temperature can vary from approximately 70 degrees Celsius to approximately 90 degrees Celsius; the chamber wall temperature can vary from approximately 50 degrees Celsius to approximately 70 degrees Celsius; the bottom chamber temperature can vary from approximately 10 degrees Celsius to approximately 30 degrees Celsius; the temperature at the center of the substrate holder can vary from approximately 12 degrees Celsius to approximately 20 degrees Celsius; the temperature at the edge of the substrate holder can vary from approximately 8 degrees Celsius to approximately 12 degrees Celsius; the center backside pressure for the substrate holder can vary from approximately 15 Torr to approximately 25 Torr; the edge backside pressure for the substrate holder can vary from approximately 27 Torr to approximately 33 Torr;

and the processing time can vary from approximately 60 seconds to approximately 90 seconds.

When the first gate-control layer etching procedure is performed during the fourth processing sequence 900(A, B), the chamber pressure can range from approximately 15 mT to approximately 25 mT; the top power can vary from approximately 450 watts to approximately 550 watts; the lower power can vary from approximately 0 watts (e.g., a complete chemical trim procedure) to approximately 110 watts; the ESC voltage can be set at approximately 2500 V; the He flow rate can vary between approximately 150 sccm and approximately 250 sccm; the HBr flow rate can vary between approximately 25 sccm and approximately 35 sccm; the $O_2$ flow rate can vary between approximately 30 sccm and approximately 50 sccm; the $CO_2$ flow rate can vary between approximately 260 sccm and approximately 310 sccm; the top chamber temperature can vary from approximately 70 degrees Celsius to approximately 90 degrees Celsius; the chamber wall temperature can vary from approximately 50 degrees Celsius to approximately 70 degrees Celsius; the bottom chamber temperature can vary from approximately 10 degrees Celsius to approximately 30 degrees Celsius; the temperature at the center of the wafer holder can vary from approximately 12 degrees Celsius to approximately 20 degrees Celsius; the temperature at the edge of the wafer holder can vary from approximately 8 degrees Celsius to approximately 12 degrees Celsius; the center backside pressure for the wafer holder can vary from approximately 15 Torr to approximately 25 Torr; the edge backside pressure for the wafer holder can vary from approximately 27 Torr to approximately 33 Torr; and the processing time can vary from approximately 90 seconds to approximately 130 seconds.

The second gate stack 902 can include a substrate layer 910, an interface layer 915, a metal gate layer 920, a first hard mask layer 925, a silicon-containing layer 930, a second hard mask layer 935, a non-etched gate-control layer 9402 one or more etched gate-control features 941*a* in an upper portion of an partially-etched gate-control layer 9401, and one or more partially-removed third hard mask features 946*a*. For example, the partially-etched third hard mask features 946*a* can have a thickness 948*a* that can vary from approximately 5 nm and to approximately 15 nm; the etched gate-control features 941*a* can have a thickness 9431 that can vary from approximately 50 nm and to approximately 200 nm; and the non-etched gate-control layer 9402 can have a thickness 9432 that can vary from approximately 20 nm and to approximately 100 nm. In addition, the partially-removed third hard mask features 946*a* can have a CD (width) 947*a* that can vary from approximately 15 nm and to approximately 60 nm; and the etched gate-control features 941*a* can have a CD (width) 942*a* that can vary from approximately 15 nm and to approximately 60 nm. Alternatively, the gate stacks 902 may be configured differently and the dimensions may be different.

The third gate stack 903 can include a substrate layer 910, an interface layer 915, a metal gate layer 920, a first hard mask layer 925, a silicon-containing layer 930, and a plurality of etched or cleaned second hard mask features 935*b*. For example, the substrate layer 910 can include a semiconductor material; the interface layer 915 can include controlled-etch-rate material; the metal gate layer 920 can include $HfO_2$; the first hard mask layer 925 can include TiN; the silicon-containing layer 930 include amorphous silicon (a-Si); and the second hard mask features 935*a* can include TEOS.

After the etched gate-control features 941*a* are created, a second gate-control layer etching procedure (ODL2), a SiN (TEOS) etching procedure, and a SiN (TEOS) Over-Etching procedure can be performed and the etched gate-control features 941*a* can be used to create a plurality of etched or cleaned second hard mask (TEOS) features 936*b*. For example, the second gate-control layer etching time, the second gate-control layer etching endpoint time, the SiN (TEOS) etch time, the SiN (TEOS) etch endpoint time, the SiN (TEOS) Over-Etch time, the SiN (TEOS) Over-Etch endpoint time, the process gas flow rates, and the trimmed gate-control layer profile parameters (e.g., trimmed gate-control layer CD, overhang and/or resist bending) can be used as control variables during the second gate-control layer etching procedure, the SiN (TEOS) etch procedure and/or the SiN (TEOS) Over-Etch procedure. In addition, the CDs (widths) 937*b* and thicknesses 938*b* for the second hard mask (TEOS) features 936*b* can be established during the trimming procedure and the TEOS etching procedure. The CDs 937*b* for the second hard mask features 936*b* can range from approximately 20 nm to approximately 50 nm, and the thicknesses 938*b* for the second hard mask features 636*b* can range from approximately 2 nm to approximately 20 nm. The second etch model 963 can be a Multi-Layer-Multi-Input-Multi-Output (MLMIMO) model for predicting the process results from the trimming procedure, and the TEOS etching procedure.

When the second gate-control layer etching (ODL2) procedure is performed during the fourth processing sequence 900(A, B), the chamber pressure can range from approximately 15 mT to approximately 25 mT; the top power can vary from approximately 450 watts to approximately 550 watts; the lower power can vary from approximately 90 watts to approximately 110 watts; the ESC voltage can be set at approximately 2500 V; the He flow rate can vary between approximately 150 sccm and approximately 250 sccm; the HBr flow rate can vary between approximately 25 sccm and approximately 35 sccm; the $O_2$ flow rate can vary between approximately 30 sccm and approximately 50 sccm; the $CO_2$ flow rate can vary between approximately 260 sccm and approximately 310 sccm; the top chamber temperature can vary from approximately 70 degrees Celsius to approximately 90 degrees Celsius; the chamber wall temperature can vary from approximately 50 degrees Celsius to approximately 70 degrees Celsius; the bottom chamber temperature can vary from approximately 10 degrees Celsius to approximately 30 degrees Celsius; the temperature at the center of the wafer holder can vary from approximately 12 degrees Celsius to approximately 20 degrees Celsius; the temperature at the edge of the wafer holder can vary from approximately 8 degrees Celsius to approximately 12 degrees Celsius; the center backside pressure for the wafer holder can vary from approximately 15 Torr to approximately 25 Torr; the edge backside pressure for the wafer holder can vary from approximately 27 Torr to approximately 33 Torr; and the processing time can vary from approximately 90 seconds to approximately 130 seconds.

When the SiN (TEOS) layer etching procedure is performed during the third processing sequence 900(A, B), the chamber pressure can range from approximately 35 mT to approximately 45 mT; the top power can vary from approximately 550 watts to approximately 650 watts; the lower power can vary from approximately 90 watts to approximately 110 watts; the ESC voltage can be set at approximately 2500 V; the $CF_4$ flow rate can vary between approximately 40 sccm and approximately 60 sccm; the $CHF_3$ flow rate can vary between approximately 40 sccm and approximately 60 sccm; the $O_2$ flow rate can vary between approximately 3 sccm and approximately 7 sccm; the top chamber temperature can vary from approximately 30 degrees Celsius to approximately 90 degrees Celsius; the chamber wall temperature can vary from approximately 50 degrees Celsius to approximately 70 degrees Celsius; the bottom chamber temperature can vary from approximately 30 degrees Celsius to approximately 50 degrees Celsius; the temperature at the center of the wafer holder can vary from approximately 25 degrees Celsius to approximately 35 degrees Celsius; the temperature at the edge of the wafer holder can vary from approximately 8 degrees Celsius to approximately 12 degrees Celsius; the center backside pressure for the wafer holder can vary from approximately 15 Torr to approximately 25 Torr; the edge backside pressure for the wafer holder can vary from approximately 27 Torr to approximately 33 Torr; and the processing time can vary from approximately 50 seconds to approximately 90 seconds.

When the SiN (TEOS) Over-Etch (OE) procedure is performed during the third processing sequence 900(A, B), the chamber pressure can range from approximately 35 mT to approximately 45 mT; the top power can vary from approximately 550 watts to approximately 650 watts; the lower power can vary from approximately 125 watts to approximately 175 watts; the ESC voltage can be set at approximately 2500 V; the $CF_4$ flow rate can vary between approximately 40 sccm and approximately 60 sccm; the $CHF_3$ flow rate can vary between approximately 40 sccm and approximately 60 sccm; the $O_2$ flow rate can vary between approximately 3 sccm and approximately 7 sccm; the top chamber temperature can vary from approximately 30 degrees Celsius to approximately 90 degrees Celsius; the chamber wall temperature can vary from approximately 50 degrees Celsius to approximately 70 degrees Celsius; the bottom chamber temperature can vary from approximately 30 degrees Celsius to approximately 50 degrees Celsius; the temperature at the center of the wafer holder can vary from approximately 25 degrees Celsius to approximately 35 degrees Celsius; the temperature at the edge of the wafer holder can vary from approximately 8 degrees Celsius to approximately 12 degrees Celsius; the center backside pressure for the wafer holder can vary from approximately 15 Torr to approximately 25 Torr; the edge backside pressure for the wafer holder can vary from approximately 27 Torr to approximately 33 Torr; and the processing time can vary from approximately 50 seconds to approximately 90 seconds.

The processing sequence 900(A, B) illustrated in FIGS. 9A and 9B can be modeled using models (960-964), and the models (960-964) can exchange Measured Variable (MV) data using transfer means 975, can exchange Disturbance Variable (DV) data using transfer means 980, and can exchange Controlled Variable (CV) data using transfer means 985. The models (960-964) can receive, process, and/or send MV data, DV data, and CV associated with the procedures described herein.

The first internal-Integrated-Metrology (i-IM) model 960 can be used in real time by one or more of the internal-Integrated-Metrology-Modules (i-IMMs) 250 to obtain internal-Integrated-Metrology (i-IM) data for the first gate stack 901, and can include one or more real-time iODP models. The internal-Integrated-Metrology-Modules (i-IMMs) 250 can use the first model 960 to determine profile data, including the first CDs (widths) 951 and the thicknesses 953 for the masking features 950.

The second internal-Integrated-Metrology (i-IM) model 962 can be used in real time by one or more of the internal-Integrated-Metrology-Modules (i-IMMs) (250, 262a, 262b, 274a and 274b) to obtain internal-Integrated-Metrology (i-IM) data for the second gate stack 902, and can include one or more real-time iODP models. One or more of the i-IMMs (250, 262a, 262b, 274a and 274b) can use one or more of the second i-IM models 962 to determine profile data, including the CDs (widths) 942a and the thicknesses 9431 for the etched gate-control features 941a in an upper portion of an partially-etched gate-control layer 9401, and including the CDs (widths) 947a and the thicknesses 948a for the partially-removed third hard mask features 946a.

The third internal-Integrated-Metrology (i-IM) model 964 can be used in real time by one or more of the internal-Integrated-Metrology-Modules (i-IMMs) (250, 262a, 262b, 274a and 274b) to obtain internal-Integrated-Metrology (i-IM) data for the third gate stack 903, and can include one or more real-time iODP models. One or more of the i-IMMs (250, 262a, 262b, 274a and 274b) can use the third i-IM model 964 to determine profile data, including the CDs (widths) 937b and the thicknesses 938b for the second hard mask (TEOS) features 936b in the etched TEOS layer 935b.

Figure 10B:
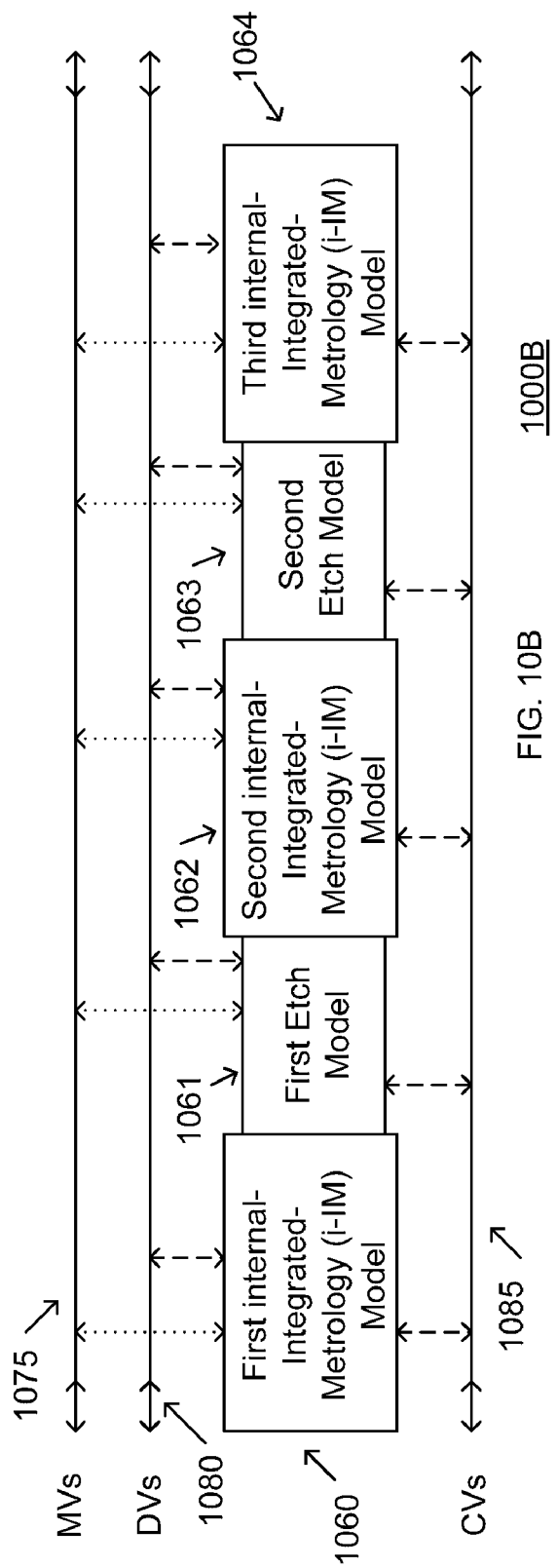

FIGS. 10A and 10B illustrate exemplary views of a fifth processing sequence for creating metal gate structures in accordance with embodiments of the invention. In the illustrated embodiment, three exemplary gate stacks (1001, 1002, and 1003) and six metal gate stack models (1060-1064) are shown that can be used to illustrate the fifth processing sequence 1000(A, B). Alternatively, a different number of gates stacks, a different number of models, and different configurations may be used.

In some embodiments, the first gate stack 1001 can be an exemplary view of the first developed wafers (430, FIG. 4C) or the second developed wafers (530, FIG. 5C); the third gate stack 1003 can be an exemplary view of the first etched wafers (440, FIG. 4D) or the second etched wafers (540, FIG. 5D), and the second gate stack 1002 can be an exemplary view of an intermediate etching step where the CDs 1041a are established. Alternatively the third gate stack 1003 can be an exemplary view of the first cleaned wafers (450, FIG. 4E) or the second cleaned wafers (550, FIG. 5E).

The first gate stack 1001 can include a substrate layer 1010, an interface layer 1015, a metal gate layer 1020, a first hard mask layer 1025, a silicon-containing layer 1030, a second hard mask layer 1035, a gate-control layer 1040, a third hard mask layer 1045, and a plurality of masking features 1050. For example, the substrate layer 1010 can include a semiconductor material; the interface layer 1015 can include controlled-etch-rate material; the metal gate layer 1020 can include $HfO_2$; the first hard mask layer 1025 can include TiN; the silicon-containing layer 1030 can include amorphous silicon (a-Si); the second hard mask layer 1035 can include Tetraethyl Orthosilicate, (TEOS) $[Si(OC_2H_5)_4]$; the gate-control layer 1040 can include a gate-control material; the third hard mask layer 1045 can include silicon-containing anti-reflective coating (SiARC) material; and the masking features 1050 can include ArF photoresist material.

The substrate layer 1010 can have a thickness 1013 that can vary from approximately 25 nm and to approximately 60 nm; the interface layer 1015 can have a thickness 1018 that can vary from approximately 2 nm and to approximately 10 nm; the metal gate layer 1020 can have a thickness 1023 that can vary from approximately 5 nm and to approximately 20 nm; the first hard mask layer 1025 can have a thickness 1028 that can vary from approximately 15 nm and to approximately 40 nm; the silicon-containing layer 1030 can have a thickness 1033 that can vary from approximately 25 nm and to approximately 60 nm; the second hard mask layer 1035 can have a thickness 1038 that can vary from approximately 5 nm and to approximately 20 nm; the gate-control layer 1040 can have a thickness 1033 that can vary from approximately 50 nm and to approximately 300 nm; the third hard mask layer 1045 can have a thickness 1048 that can vary from approximately 15 nm and to approximately 60 nm; and the masking features 1050 can have a thickness 1053 that can vary from approximately 50 nm and to approximately 400 nm. In addition, the masking features 1050 can have a CD (width) 1051 that can vary from approximately 50 nm and to approximately 100 nm.

During the fifth processing sequence 1000(A, B), a SiARC etching procedure, a gate-control layer etching procedure, and a SiN (TEOS) etching procedure can be performed to establish a plurality of etched hard mask (TEOS) features 1036a in the etched hard mask (TEOS) layer 1035a. For example, the SiARC etch time, the SiARC etch endpoint time, the gate-control layer etch time, the gate-control layer etch endpoint time, the process gas flow rates, and the profile parameters for the partially-etched SiN (TEOS) feature can be used as control variables during the SiARC etching procedure, the gate-control layer etching procedure, and/or the SiN (TEOS) etching procedure. The pattern of masking features 1050 can be used to create the plurality of hard mask (TEOS) features 1036a in the etched hard mask (TEOS) layer 1035a. In addition, the CDs (widths) 1037a and thicknesses 1038a for the plurality of hard mask (TEOS) features 1036a in the etched hard mask (TEOS) layer 1035a can be established during the second hard mask layer 1035 (TEOS) etching procedure. The CDs (widths) 1037a for etched hard mask (TEOS) features 1036a can range from approximately 40 nm to approximately 100 nm. The first etch model 1061 can be a Multi-Layer-Multi-Input-Multi-Output (MLMIMO) model for predicting the process results from the SiARC etching procedure, the gate-control layer etching procedure, and the second hard mask layer 1035 (TEOS) etching procedure.

When the SiARC etch procedure is performed during the fifth processing sequence 1000(A, B), the chamber pressure can range from approximately 12 mT to approximately 18 mT; the top power can vary from approximately 450 watts to approximately 550 watts; the lower power can vary from approximately 90 watts to approximately 110 watts; the ESC voltage can be set at approximately 2500 V; the Tetrafluoromethane ($CF_4$) flow rate can vary between approximately 60 sccm and approximately 100 sccm; the Carbon Hydro-Trifluoride ($CHF_3$) flow rate can vary between approximately 40 sccm and approximately 60 sccm; the top chamber temperature can vary from approximately 70 degrees Celsius to approximately 90 degrees Celsius; the chamber wall temperature can vary from approximately 50 degrees Celsius to approximately 70 degrees Celsius; the bottom chamber temperature can vary from approximately 10 degrees Celsius to approximately 30 degrees Celsius; the temperature at the center of the substrate holder can vary from approximately 12 degrees Celsius to approximately 20 degrees Celsius; the temperature at the edge of the substrate holder can vary from approximately 8 degrees Celsius to approximately 12 degrees Celsius; the center backside pressure for the substrate holder can vary from approximately 15 Torr to approximately 25 Torr; the edge backside pressure for the substrate holder can vary from approximately 27 Torr to approximately 33 Torr; and the processing time can vary from approximately 60 seconds to approximately 90 seconds.

When the gate-control layer etching procedure is performed during the fifth processing sequence 1000(A, B), the chamber pressure can range from approximately 15 mT to approximately 25 mT; the top power can vary from approximately 175 watts to approximately 225 watts; the lower power can vary from approximately 90 watts to approximately 110 watts; the ESC voltage can be set at approximately 2500 V; the $O_2$ flow rate can vary between approximately 30 sccm and approximately 50 sccm; the $CO_2$ flow rate can vary between approximately 270 sccm and approximately 310 sccm; the HBr flow rate can vary between approximately 25 sccm and approximately 35 sccm; the top chamber temperature can vary from approximately 70 degrees Celsius to approximately 90 degrees Celsius; the chamber wall temperature can vary from approximately 50 degrees Celsius to approximately 70 degrees Celsius; the bottom chamber temperature can vary from approximately 10 degrees Celsius to approximately 30 degrees Celsius; the temperature at the center of the wafer holder can vary from approximately 12 degrees Celsius to approximately 20 degrees Celsius; the temperature at the edge of the wafer holder can vary from approximately 8 degrees Celsius to approximately 12 degrees Celsius; the center backside pressure for the wafer holder can vary from approximately 15 Torr to approximately 25 Torr; the edge backside pressure for the wafer holder can vary from approximately 27 Torr to approximately 33 Torr; and the processing time can vary from approximately 90 seconds to approximately 130 seconds.

When the SiN (TEOS) etching procedure is performed during the fifth processing sequence 1000(A, B), the chamber pressure can range from approximately 35 mT to approximately 45 mT; the top power can vary from approximately 550 watts to approximately 650 watts; the lower power can vary from approximately 90 watts to approximately 110 watts; the ESC voltage can be set at approximately 2500 V; the $CF_4$ flow rate can vary between approximately 40 sccm and approximately 60 sccm; the $CHF_3$ flow rate can vary between approximately 40 sccm and approximately 60 sccm; the $O_2$ flow rate can vary between approximately 3 sccm and approximately 7 sccm; the top chamber temperature can vary from approximately 30 degrees Celsius to approximately 90 degrees Celsius; the chamber wall temperature can vary from approximately 50 degrees Celsius to approximately 70 degrees Celsius; the bottom chamber temperature can vary from approximately 30 degrees Celsius to approximately 50 degrees Celsius; the temperature at the center of the wafer holder can vary from approximately 25 degrees Celsius to approximately 35 degrees Celsius; the temperature at the edge of the wafer holder can vary from approximately 8 degrees Celsius to approximately 12 degrees Celsius; the center backside pressure for the wafer holder can vary from approximately 15 Torr to approximately 25 Torr; the edge backside pressure for the wafer holder can vary from approximately 27 Torr to approximately 33 Torr; and the processing time can vary from approximately 50 seconds to approximately 90 seconds.

The second gate stack 1002 can include a substrate layer 1010, an interface layer 1015, a metal gate layer 1020, a first hard mask layer 1025, a silicon-containing layer 1030, and one or more etched second hard mask features 1036a in the etched second hard mask layer 1035a. For example, the etched second hard mask features 1036a can have a thickness 1038a that can vary from approximately 5 nm and to approximately 15 nm. In addition, the etched second hard mask features 1036a can have a CD (width) 1037a that can vary from approximately 15 nm and to approximately 60 nm. Alternatively, the gate stacks 1002 may be configured differently, and the dimensions may be different.

The third gate stack 1003 can include a substrate layer 1010, an interface layer 1015, a metal gate layer 1020, a first hard mask layer 1025, a silicon-containing layer 1030, and a plurality of etched or cleaned second hard mask features 1035b. For example, the substrate layer 1010 can include a semiconductor material; the interface layer 1015 can include controlled-etch-rate material; the metal gate layer 1020 can include $HfO_2$; the first hard mask layer 1025 can include TiN;

the silicon-containing layer 1030 include amorphous silicon (a-Si); and the second hard mask features 1035a can include TEOS.

After the etched second hard mask features 1036a are created, an ashing procedure and a Chemical Oxide Removal (COR) trimming procedure can be performed and the etched second hard mask features 1036a can be used to create a plurality of etched or cleaned second hard mask (TEOS) features 1036b. For example, the COR trimming time, the COR trimming endpoint time, the COR trim process gas flow rates, and the profile parameters for the partially-etched SiN (TEOS) feature can be used as control variables during the COR trimming procedure. In addition, the CDs (widths) 1037b and thicknesses 1038b for the second hard mask (TEOS) features 1036b can be established during the COR trimming procedure. The CDs 1037b for the second hard mask features 1036b can range from approximately 20 nm to approximately 50 nm and the thicknesses 1038b for the second hard mask features 1036b can range from approximately 2 nm to approximately 20 nm. The second etch model 1063 can be a Multi-Layer-Multi-Input-Multi-Output (MLMIMO) model for predicting the process results from the COR trimming procedure. For example, the COR trimming procedure can include a non-plasma etching procedure for oxidizing and removing a portion of the etched second hard mask features 1036a to establish the etched or cleaned second hard mask (TEOS) features 1036b.

When the ashing procedure is performed during the fifth processing sequence 1000(A, B), the chamber pressure can range from approximately 125 mT to approximately 175 mT; the top power can vary from approximately 350 watts to approximately 400 watts; the lower power can vary from approximately 0.1 watts to approximately 1 watt; the ESC voltage can be set at approximately 2500 V; the He flow rate can vary between approximately 150 sccm and approximately 250 sccm; the $O_2$ flow rate can vary between approximately 150 sccm and approximately 250 sccm; the top chamber temperature can vary from approximately 30 degrees Celsius to approximately 90 degrees Celsius; the chamber wall temperature can vary from approximately 50 degrees Celsius to approximately 70 degrees Celsius; the bottom chamber temperature can vary from approximately 30 degrees Celsius to approximately 50 degrees Celsius; the wafer holder temperature can vary from approximately 15 degrees Celsius to approximately 65 degrees Celsius; and the processing time can vary from approximately 5 seconds to approximately 20 seconds.

When the COR procedure is performed during the fifth processing sequence 1000(A, B), the chamber pressure can range from approximately 5 mT to approximately 10 mT; the ESC voltage can be set at approximately 2500 V; the $NH_3$ flow rate can vary between approximately 35 sccm and approximately 45 sccm; the HF flow rate can vary between approximately 35 sccm and approximately 45 sccm; the Ar flow rate can vary between approximately 3 sccm and approximately 7 sccm; the top chamber temperature can vary from approximately 30 degrees Celsius to approximately 90 degrees Celsius; the chamber wall temperature can vary from approximately 50 degrees Celsius to approximately 70 degrees Celsius; the bottom chamber temperature can vary from approximately 30 degrees Celsius to approximately 50 degrees Celsius; the temperature of the wafer holder can vary from approximately 5 degrees Celsius to approximately 35 degrees Celsius; and the processing time can vary from approximately 50 seconds to approximately 90 seconds.

The fifth processing sequence 1000(A, B), illustrated in FIGS. 10A and 10B, can be modeled using models (1060-1064), and the models (1060-1064) can exchange Measured Variable (MV) data using transfer means 1075, can exchange Disturbance Variable (DV) data using transfer means 1080, and can exchange Controlled Variable (CV) data using transfer means 1085. The models (1060-1064) can receive, process, and/or send MV data, DV data, and CV associated with the procedures described herein.

The first internal-Integrated-Metrology (i-IM) model 1060 can be used in real time by one or more of the internal-Integrated-Metrology-Modules (i-IMMs) 250 to obtain internal-Integrated-Metrology (i-IM) data for the first gate stack 1001, and can include one or more real-time iODP models. The internal-Integrated-Metrology-Modules (i-IMMs) 250 can use the first model 1060 to determine profile data, including the first CDs (widths) 1051 and the thicknesses 1053 for the masking features 1050.

The second internal-Integrated-Metrology (i-IM) model 1062 can be used in real time by one or more of the internal-Integrated-Metrology-Modules (i-IMMs) (250, 262a, 262b, 274a and 274b) to obtain internal-Integrated-Metrology (i-IM) data for the second gate stack 1002, and can include one or more real-time iODP models. One or more of the i-IMMs (250, 262a, 262b, 274a and 274b) can use the second i-IM model 1062 to determine profile data, including the CDs (widths) 1037a and the thicknesses 1038a for the etched second hard mask (TEOS) features 1036a in the etched TEOS layer 1035a.

The third internal-Integrated-Metrology (i-IM) model 1064 can be used in real time by one or more of the internal-Integrated-Metrology-Modules (i-IMMs) (250, 262a, 262b, 274a and 274b) to obtain internal-Integrated-Metrology (i-IM) data for the third gate stack 1003, and can include one or more real-time iODP models. One or more of the i-IMMs (250, 262a, 262b, 274a and 274b) can use the third i-IM model 1064 to determine profile data, including the CDs (widths) 1037b and the thicknesses 1038b for the trimmed second hard mask (TEOS) features 1036b in the trimmed TEOS layer 1035b.

Verified versions for one or more of the processing sequences (600(A, B), 700(A, B), 800(A, B), 900(A, B), and 1000(A, B)) can be used to create a plurality of verified metal gate structures, and the verified versions can be stored in a metal-gate profile library. In addition, when a verified version of one of the processing sequences (600(A, B), 700(A, B), 800(A, B), 900(A, B), and 1000(A, B)) is performed, one or more reference (verified) metal gate structures can be created at one or more sites on each of the processed wafers, and the data associated with the one or more reference (verified) metal gate structures can be stored in the metal-gate profile library. When an un-verified version of one of the processing sequences (600(A, B), 700(A, B), 800(A, B), 900(A, B), and 1000(A, B)) is performed, one or more unverified metal gate structures can be created at one or more sites on each of the processed wafers, and one or more verification procedures can be performed to verify one or more of the unverified metal gate structures.

In some embodiments, a first group of wafers can be established that can be used to obtain the metal-gate profile library data. The data from the first group of wafers can be used for creating and/or refining data in the metal-gate profile library. The first group can include one or more reference "golden" wafers, and a number of required verification sites can be established for each reference "golden" wafer. For example, a reference "golden" wafer can be produced using verified "golden" processing sequences that are performed using verified "golden" processing elements and/or evaluation elements. In addition, one or more reference "golden" metal gate structures can be created at one or more sites on each of the reference "golden" wafers.

When a first reference "golden" wafer is created, a first site can be selected from the number of required sites on the first reference "golden" wafer, and the first site can have a first reference "golden" metal gate structure associated therewith that was created using the one or more verified procedures in the verified processing sequence. First evaluation data can be obtained from the first site on the first wafer, and additional evaluation data can be obtained from additional sites on the first wafer or on additional wafers. The evaluation data can include i-IM data for the first site and the reference data can include simulated and/or predicted data for the metal gate structure at the first site on the first wafer. The reference data can include profile data and optical data associated with the profile data, and the optical data can include image data and optical data associated with the image data.

In various embodiments, the real-time and/or historical data can include data for single layer metal gate structures, multi-layer metal gate structures, partially-etched metal gate structures, etched metal gate structures, cleaned metal gate structures, un-cleaned metal gate structures, trimmed metal gate structures, doped metal gate structures, filled metal gate structures, semi-filled metal gate structures, damaged metal gate structures, capacitor structures, poly-gate structures, tri-gate transistor structures, FinFET structures, Complementary Metal-Oxide Semiconductor (CMOS) structures, pFET structures, nFET structures, photoresist structures, periodic structures, alignment structures, trench structures, via structures, array structures, grating structures, or target structures, or any combination thereof.

Confidence and/or risk data can be established for the using differences calculated using the measured data and the simulated data. When one or more confidence and/or risk limits are met, the data can be identified and/or stored as verified data in a metal gate profile library. When one or more confidence and/or risk limits are not met, the data can be identified and/or stored as un-verified data in a metal gate profile library. The metal gate profile data can be characterized by a set of wavelengths established for each measurement procedure.

When one or more of the processing sequences (600(A, B), 700(A, B), 800(A, B), 900(A, B), and 1000(A, B)) includes lithography-related procedures, one or more verified lithography procedures can be performed, and one or more verified and/or verifiable lithography-related evaluation features can be created at one or more lithography-related evaluation sites on one or more of the processed wafers. Data can be created in real time during a verified lithography procedure and can include process data, system data, chamber data, chamber match data, particle data, image data, and/or fault data. The lithography-related data can be fed forward and/or fed back to change/update process recipes.

When one or more of the processing sequences (600(A, B), 700(A, B), 800(A, B), 900(A, B), and 1000(A, B)) includes scanner-related procedures, one or more verified exposure procedures can be performed, and one or more verified and/or verifiable exposure-related evaluation features can be created at one or more sites on one or more of the wafers. Data can be created in real time during a verified exposure procedure and can include process data, system data, chamber data, chamber match data, focus data, image data, and/or fault data. The exposure-related data can be fed forward and/or fed back to change/update process recipes.

When one or more of the processing sequences (600(A, B), 700(A, B), 800(A, B), 900(A, B), and 1000(A, B)) includes etch-related procedures, one or more verified etch procedures can be performed, and one or more verified and/or verifiable etch-related evaluation features can be created at one or more etch-related evaluation sites on one or more of the wafers. Data can be created in real time during a verified etch procedure and can include process data, system data, chamber data, chamber match data, measurement data, damage data, profile data, signal data, and/or fault data. The etch-related data can be fed forward and/or fed back to change/update process recipes.

When one or more of the processing sequences (600(A, B), 700(A, B), 800(A, B), 900(A, B), and 1000(A, B)) includes deposition-related procedures, one or more verified deposition procedures can be performed, and one or more verified and/or verifiable deposition-related evaluation features can be created at one or more deposition-related evaluation sites on one or more of the wafers. Data can be created in real time during a verified deposition procedure and can include process data, system data, chamber data, chamber match data, particle data, image data, and/or fault data. The deposition-related data can be fed forward and/or fed back to change/update process recipes.

When all of the procedures in a processing sequence are completed, one or more verified and/or verifiable metal gate structures can be created at one or more pre-determined evaluation sites on one or more of the processed wafers. When a metal gate structure is evaluated and/or verified, data can be created in real time and can be fed forward and/or fed back to change/update process recipes.

In addition, when judgment and/or intervention rules are associated with procedures in one or more of the processing sequences (600(A, B), 700(A, B), 800(A, B), 900(A, B), and 1000(A, B)), the rules can be executed. Intervention and/or judgment rule evaluation procedures and/or limits can be performed based on historical procedures, on the customer's experience, or process knowledge, or obtained from a host computer. Judgment and/or intervention rules can be used in FDC procedures to determine how to respond to alarm conditions, error conditions, fault conditions, and/or warning conditions. For example, the FDC procedures can use rules to prioritize and/or classify faults, to predict system performance, to predict preventative maintenance schedules, to decrease maintenance downtime, and to extend the service life of consumable parts in the system.

The number of i-IM procedures can be specified by a semiconductor manufacturer based on data stored in a historical database. For example, a semiconductor manufacturer may have historically chosen a number of sites on the wafer when making SEM measurements and would like to correlate the i-IM data to the SEM system data, TEM system data and/or FIB system data. In addition, the number of i-IM evaluation sites used can be reduced as the manufacturer becomes more confident that the process is and will continue to produce high quality products and/or devices.

When one or more of the processing sequences (600(A, B), 700(A, B), 800(A, B), 900(A, B), and 1000(A, B)) include simulation, modeling and/or prediction procedures, simulation, modeling and/or prediction data can be created and/or modified. The new simulation and/or prediction data can be used in real time to update the calculations, models, and/or procedures For example, prediction models can include process chemistry models, chamber models, EM models, SPC charts, PLS models, PCA models, FDC models, and Multivariate Analysis (MVA) models.

Although only certain embodiments of this invention have been described in detail above, those skilled in the art will readily appreciate that many modifications are possible in the embodiments without materially departing from the novel teachings and advantages of this invention. Accordingly, all such modifications are intended to be included within the scope of this invention.

Thus, the description is not intended to limit the invention and the configuration, operation, and behavior of the present invention has been described with the understanding that modifications and variations of the embodiments are possible, given the level of detail present herein. Accordingly, the preceding detailed description is not mean or intended to, in any way, limit the invention—rather the scope of the invention is defined by the appended claims.

What is claimed:

1. A method of performing a Lithography-Etch-Lithography-Etch (LELE) processing sequence to create a plurality of metal gate structures, the method comprising:

receiving a first set of wafers by a first transfer subsystem coupled to one or more Integrated-Metrology-Lithography subsystems, one or more Integrated-Metrology-Etching subsystems, one or more scanner subsystems, one or more evaluation subsystems, one or more inspection subsystems, or one or more deposition subsystems, or any combination thereof;

creating a first set of first metal gate structures in a first patterned layer on a plurality of first patterned wafers of the first set of wafers using a first set of procedures in the LELE processing sequence, the first set of procedures being performed using a first Integrated-Metrology-Lithography subsystem, and a first immersion scanner subsystem coupled to the first Integrated-Metrology-Lithography subsystem, and a first Integrated-Metrology-Etching subsystem coupled to the first Integrated-Metrology-Lithography subsystem;

obtaining first real-time evaluation data for the first set of first metal gate structures using the first Integrated-Metrology-Lithography subsystem and/or the first Integrated-Metrology-Etching subsystem;

establishing a first set of low risk wafers using the first real-time evaluation data for the first set of first metal gate structures;

creating a second set of second metal gate structures in a second patterned layer on a plurality of second patterned wafers wherein the second patterned wafers are created by performing a second set of procedures in the LELE processing sequence using the first set of low risk wafers, the second set of procedures in the LELE processing sequence being performed using the first Integrated-Metrology-Lithography subsystem, the first immersion scanner subsystem, and the first Integrated-Metrology-Etching subsystem, wherein the second set of second metal gate structures are aligned relative to the first set of first metal gate structures;

obtaining second real-time evaluation data for the second set of second metal gate structures using the first Integrated-Metrology-Lithography subsystem and/or the first Integrated-Metrology-Etching subsystem; and establishing a second set of low risk wafers using the second real-time evaluation data for the second set of second metal gate structures.

2. The method as claimed in claim 1, wherein obtaining the first real-time evaluation data comprises:

obtaining first real-time integrated-metrology (IM) data for at least one first metal gate structure on a first patterned wafer using the first Integrated-Metrology-Lithography subsystem and/or the first Integrated-Metrology-Etching subsystem;

determining first verified data for the at least one first metal gate structure on the first patterned wafer using a metal gate profile library;

determining first risk data for the at least one first metal gate structure on the first patterned wafer using the first real-time IM data and the first verified data;

identifying the at least one first metal gate structure as a verified first metal gate structure when the first risk data is less than or equal to a first risk limit;

identifying the at least one first metal gate structure as an un-verified first metal gate structure when the first risk data is greater than the first risk limit;

identifying the first patterned wafer as a first low risk wafer, having at least one verified first metal gate structure thereon, when the first risk data is less than or equal to the first risk limit; and performing a first corrective action, wherein the first patterned wafer is identified as a high-risk wafer, having at least one un-verified first metal gate structure thereon, when the first risk data is greater than the first risk limit.

3. The method as claimed in claim 2, further comprising:

identifying the first set of wafers as low risk wafers having low risk data associated therewith when the first patterned wafer is identified as the first low risk wafer; and continuing to process the first set of wafers.

4. The method as claimed in claim 2, further comprising:

a) determining a number of remaining first integrated-metrology (IM) sites on the first patterned wafer, wherein each first IM site includes a first periodic evaluation pattern associated with one or more first metal gate structures;

b) obtaining new real-time IM data for a new first metal gate structure on the first patterned wafer using the first Integrated-Metrology-Lithography subsystem and/or the first Integrated-Metrology-Etching subsystem;

c) determining new verified data for the new first metal gate structure on the first patterned wafer using the metal gate profile library;

d) determining new risk data for the new first metal gate structure on the first patterned wafer using the new real-time IM data and the new verified data;

e) identifying the new first metal gate structure as a new verified first metal gate structure when the new risk data is less than or equal to a new risk limit;

f) identifying the new first metal gate structure as a new un-verified first metal gate structure when the new risk data is greater than the new risk limit;

g) identifying the first patterned wafer as a new low risk wafer (having at least one new verified first metal gate structure thereon) and decreasing the number of remaining first IM sites by one, when the new risk data is less than or equal to the new risk limit;

h) identifying the first patterned wafer as a new un-verified wafer and decreasing the number of remaining first IM sites by one, when the new risk data is greater than the new risk limit;

i) repeating steps b)-h), when the number of remaining first IM sites on the first patterned wafer is greater than zero; and j) performing an additional corrective action, when the number of remaining first IM sites on the first patterned wafer is equal to zero.

5. The method as claimed in claim 4, further comprising:

identifying the first set of wafers as low risk wafers having new low risk data associated therewith when the first patterned wafer is identified as the new low risk wafer; and continuing to process the first set of wafers.

6. The method as claimed in claim 4, wherein obtaining the first real-time evaluation data further comprises:
- selecting an additional first patterned wafer from the first set of wafers; obtaining additional real-time IM data for an additional first metal gate structure on the additional first patterned wafer using the first Integrated-Metrology-Lithography subsystem and/or the first Integrated-Metrology-Etching subsystem;
- determining additional verified data for the additional first metal gate structure on the additional first patterned wafer using a first metal gate profile library;
- determining additional risk data for the additional first metal gate structure on the additional first patterned wafer using the additional real-time IM data and the additional verified data;
- identifying the additional first metal gate structure as the verified first metal gate structure when the additional risk data is less than or equal to an additional risk limit;
- identifying the additional first metal gate structure as an additional un-verified first metal gate structure when the additional risk data is greater than the first risk limit;
- identifying the additional first patterned wafer as an additional low risk wafer, having an additional verified first metal gate structure thereon, when the additional risk data is less than or equal to the additional risk limit; and
- performing a new additional corrective action, wherein the additional first patterned wafer is identified as an additional high risk wafer, having the at least one un-verified first metal gate structure thereon, when the additional risk data is greater than the additional risk limit.

7. The method as claimed in claim 6, further comprising:
- identifying the first set of wafers as low risk wafers having additional low risk data associated therewith when the additional first patterned wafer is identified as the additional low risk wafer; and
- continuing to process the first set of wafers.

8. The method as claimed in claim 6, further comprising:
- a1) determining a number of remaining additional first integrated-metrology (IM) sites on the additional first patterned wafer, wherein each additional first IM site includes an additional first periodic evaluation pattern associated with one or more additional first metal gate structures;
- b1) obtaining new real-time IM data for a new additional first metal gate structure on the additional first patterned wafer using the first Integrated-Metrology-Lithography subsystem and/or the first Integrated-Metrology-Etching subsystem;
- c1) determining new additional verified data for the new first metal gate structure on the additional first patterned wafer using the first metal gate profile library;
- d1) determining new additional risk data for the new first metal gate structure on the additional first patterned wafer using the new real-time IM data and the new additional verified data;
- e1) identifying the new first metal gate structure as the new verified first metal gate structure when the new additional risk data is less than or equal to a new additional risk limit;
- f1) identifying the new first metal gate structure as the new un-verified first metal gate structure when the new additional risk data is greater than the new additional risk limit;
- g1) identifying the additional first patterned wafer as a new additional low risk wafer, having at least one additional verified first metal gate structure thereon, and decreasing the number of remaining first additional IM sites by one, when the new additional risk data is less than or equal to the new additional risk limit;
- h1) identifying the additional first patterned wafer as the new un-verified wafer and decreasing the number of remaining first additional IM sites by one, when the new additional risk data is greater than the new additional risk limit;
- i1) repeating steps b1)-h1), when the number of remaining first additional IM sites on the additional first patterned wafer is greater than zero; and
- j1) performing a new corrective action, when the number of remaining first additional IM sites on the additional first patterned wafer is equal to zero.

9. The method as claimed in claim 1, wherein obtaining the second real-time evaluation data comprises:
- obtaining second real-time integrated-metrology (IM) data for a second metal gate structure on a second patterned wafer using the first Integrated-Metrology-Lithography subsystem and/or the first Integrated-Metrology-Etching subsystem;
- determining second verified data for the second metal gate structure on the second patterned wafer using a metal gate profile library;
- determining second risk data for the second metal gate structure on the second patterned wafer using the second real-time IM data and the second verified data;
- identifying the second metal gate structure as a verified second metal gate structure when the second risk data is less than or equal to a second risk limit;
- identifying the second metal gate structure as an un-verified second metal gate structure when the second risk data is greater than the second risk limit;
- identifying the second patterned wafer as a second low risk wafer, having at least one verified second metal gate structure thereon, when the second risk data is less than or equal to the second risk limit; and
- performing a second corrective action, wherein the second patterned wafer is identified as a second high risk wafer, having at least one un-verified second metal gate structure thereon, when the second risk data is greater than the second risk limit.

10. The method as claimed in claim 9, further comprising:
- identifying the second patterned wafers as low risk wafers having low risk data associated therewith when the second patterned wafer is identified as the second low risk wafer; and
- continuing to process the second patterned wafers.

11. The method as claimed in claim 9, further comprising:
- a2) determining a number of remaining second integrated-metrology (IM) sites on the second patterned wafer, wherein each second IM site includes a second periodic evaluation pattern associated with one or more second metal gate structures;
- b2) obtaining new second real-time IM data for a new second metal gate structure on the second patterned wafer using the first Integrated-Metrology-Lithography subsystem and/or the first Integrated-Metrology-Etching subsystem;
- c2) determining new second verified data for the new second metal gate structure on the second patterned wafer using the metal gate profile library;
- d2) determining new risk data for the new second metal gate structure on the second patterned wafer using the new second real-time IM data and the new second verified data;

e2) identifying the new second metal gate structure as a new verified second metal gate structure when the new risk data is less than or equal to a new risk limit;

f2) identifying the new second metal gate structure as a new un-verified second metal gate structure when the new risk data is greater than the new risk limit;

g2) identifying the second patterned wafer as a new low risk wafer (having at least one new verified second metal gate structure thereon) and decreasing the number of remaining second IM sites by one, when the new risk data is less than or equal to the new risk limit;

h2) identifying the second patterned wafer as a new un-verified wafer and decreasing the number of remaining second IM sites by one, when the new risk data is greater than the new risk limit;

i2) repeating steps b2)-h2), when the number of remaining second IM sites on the second patterned wafer is greater than zero; and j2) performing a new corrective action, when the number of remaining second IM sites on the second patterned wafer is equal to zero.

12. The method as claimed in claim 11, further comprising:
identifying the second patterned wafers as low risk wafers having new low risk data associated therewith when the second patterned wafer is identified as the new low risk wafer; and
continuing to process the second patterned wafers.

13. The method as claimed in claim 11, wherein obtaining the second real-time evaluation data further comprises:
obtaining additional real-time integrated-metrology (IM) data for an additional second metal gate structure on an additional second patterned wafer using the first Integrated-Metrology-Lithography subsystem and/or the first Integrated-Metrology-Etching subsystem;
determining additional verified data for the additional second metal gate structure on the additional second patterned wafer using the metal gate profile library;
determining additional risk data for the additional second metal gate structure on the additional second patterned wafer using the additional real-time IM data and the additional verified data;
identifying the additional second metal gate structure as an additional verified second metal gate structure when the additional risk data is less than or equal to an additional risk limit;
identifying the additional second metal gate structure as an additional un-verified second metal gate structure when the additional risk data is greater than the second risk limit;
identifying the additional second patterned wafer as an additional second low risk wafer, having the additional verified second metal gate structure thereon, when the additional risk data is less than or equal to the additional risk limit; and
performing an additional second corrective action, wherein the additional second patterned wafer is identified as an additional high risk wafer, having the additional un-verified second metal gate structure thereon, when the additional risk data is greater than the additional risk limit.

14. The method as claimed in claim 13, further comprising:
identifying the second patterned wafers as low risk wafers having additional low risk data associated therewith when the additional second patterned wafer is identified as an additional low risk wafer; and
continuing to process the second patterned wafers.

15. The method as claimed in claim 14, further comprising:

a3) determining a number of remaining additional second integrated-metrology (IM) sites on the additional second patterned wafer, wherein each second IM site includes at least one second periodic evaluation pattern associated with one or more second metal gate structures;

b3) obtaining new additional second real-time IM data for a new additional second metal gate structure on the additional second patterned wafer using the first Integrated-Metrology-Lithography subsystem and/or the first Integrated-Metrology-Etching subsystem;

c3) determining new additional second verified data for the new additional second metal gate structure on the additional second patterned wafer using the metal gate profile library;

d3) determining new additional risk data for the new additional second metal gate structure on the additional second patterned wafer using the new real-time IM data and the new additional second verified data;

e3) identifying the new additional second metal gate structure as the new verified second metal gate structure when the new additional risk data is less than or equal to the new risk limit;

f3) identifying the new additional second metal gate structure as the new un-verified second metal gate structure when the new additional risk data is greater than the new risk limit;

g3) identifying the additional second patterned wafer as a new second low risk wafer, having at least one additional verified second metal gate structure thereon, and decreasing the number of remaining additional second IM sites by one, when the new additional risk data is less than or equal to a new additional risk limit;

h3) identifying the additional second patterned wafer as a new second un-verified wafer and decreasing the number of remaining additional second IM sites by one, when the new additional risk data is greater than the new additional risk limit;

i3) repeating steps b3)-h3), when the number of remaining additional second IM sites on the second patterned wafer is greater than zero; and j3) performing a new second corrective action, when the number of remaining additional second IM sites on the second patterned wafer is equal to zero.

16. A system for performing a Lithography-Etch-Lithography-Etch (LELE) processing sequence to create a plurality of metal gate structures, the system comprising:

first transfer subsystem configured for receiving a first set of wafers, wherein the first transfer subsystem is coupled to one or more Integrated-Metrology-Lithography subsystems, one or more Integrated-Metrology-Etching subsystems, one or more scanner subsystems, one or more evaluation subsystems, one or more inspection subsystems, or one or more deposition subsystems, or any combination thereof;

first creating means configured to create a first set of first metal gate structures in a first patterned layer on a plurality of first patterned wafers of the first set of wafers using a first set of procedures in the LELE processing sequence, the first set of procedures being performed using the first creating means, wherein the first creating means comprises a first Integrated-Metrology-Lithography subsystem, a first immersion scanner subsystem coupled to the first Integrated-Metrology-Lithography subsystem, and a first Integrated-Metrology-Etching subsystem coupled to the first Integrated-Metrology-Lithography subsystem;

first obtaining means configured to obtain first real-time evaluation data for the first set of first metal gate structures, wherein the first obtaining means comprises the first Integrated-Metrology-Lithography subsystem and/or the first Integrated-Metrology-Etching subsystem;

first establishing means configured to establish a first set of low risk wafers using the first real-time evaluation data for the first set of first metal gate structures;

second creating means configured to create a second set of second metal gate structures in a second patterned layer on a plurality of second patterned wafers wherein the second patterned wafers are created by performing a second set of procedures in the LELE processing sequence using the first set of low risk wafers, the second set of procedures in the LELE processing sequence being performed using the second creating means, wherein the second creating means includes the first Integrated-Metrology-Lithography subsystem, the first immersion scanner subsystem, and the first Integrated-Metrology-Etching subsystem, the second set of second metal gate structures being aligned relative to the first set of first metal gate structures;

second obtaining means configured to obtain second real-time evaluation data for the second set of second metal gate structures using the second obtaining means, wherein the second obtaining means comprises the first Integrated-Metrology-Lithography subsystem and/or the first Integrated-Metrology-Etching subsystem; and second establishing means configured to establish a second set of low risk wafers using the second real-time evaluation data for the second set of second metal gate structures.

17. The system as claimed in claim 16, wherein the first obtaining means comprises:

measuring means configured to obtain first real-time integrated-metrology (IM) data for at least one first metal gate structure on a first patterned wafer, wherein the measuring means includes the first Integrated-Metrology-Lithography subsystem and/or the first Integrated-Metrology-Etching subsystem;

first calculation means configured to determine first verified data for the at least one first metal gate structure on the first patterned wafer using a metal gate profile library;

second calculation means configured to determine first risk data for the at least one first metal gate structure on the first patterned wafer using the first real-time IM data and the first verified data;

first identifying means configured to identify the at least one first metal gate structure as a verified first metal gate structure when the first risk data is less than or equal to a first risk limit;

second identifying means configured to identify the at least one first metal gate structure as an un-verified first metal gate structure when the first risk data is greater than the first risk limit;

third identifying means configured to identify the first patterned wafer as a first low risk wafer, having at least one verified first metal gate structure thereon, when the first risk data is less than or equal to the first risk limit; and corrective action means configured to perform a first corrective action when the first risk data is greater than the first risk limit, and the first patterned wafer being identified as a high-risk wafer having at least one un-verified first metal gate structure thereon, when the first risk data is greater than the first risk limit.

18. The system as claimed in claim 17, further comprising:

fourth identifying means configured to identify the first set of wafers as low risk wafers having low risk data associated therewith when the first patterned wafer is identified as the first low risk wafer; and continuing means configure to further process the first set of wafers.

19. The system as claimed in claim 17, wherein the corrective action means further comprises computing means for: a) determining a number of remaining first integrated-metrology (IM) sites on the first patterned wafer, wherein each first IM site includes a first periodic evaluation pattern associated with one or more first metal gate structures; b) obtaining new real-time IM data for a new first metal gate structure on the first patterned wafer from the first Integrated-Metrology-Lithography subsystem and/or the first Integrated-Metrology-Etching subsystem; c) determining new verified data for the new first metal gate structure on the first patterned wafer using the metal gate profile library; d) determining new risk data for the new first metal gate structure on the first patterned wafer using the new real-time IM data and the new verified data; e) identifying the new first metal gate structure as a new verified first metal gate structure when the new risk data is less than or equal to a new risk limit; f) identifying the new first metal gate structure as a new un-verified first metal gate structure when the new risk data is greater than the new risk limit; g) identifying the first patterned wafer as a new low risk wafer (having at least one new verified first metal gate structure thereon) and decreasing the number of remaining first IM sites by one, when the new risk data is less than or equal to the new risk limit; h) identifying the first patterned wafer as a new un-verified wafer and decreasing the number of remaining first IM sites by one, when the new risk data is greater than the new risk limit; i) repeating steps b)-h), when the number of remaining first IM sites on the first patterned wafer is greater than zero; and j) performing a new corrective action, when the number of remaining first IM sites on the first patterned wafer is equal to zero.

* * * * *